US011189656B2

(12) United States Patent
Kurokawa

(10) Patent No.: US 11,189,656 B2
(45) Date of Patent: Nov. 30, 2021

(54) IMAGING DEVICE AND ELECTRONIC DEVICE

(71) Applicant: Semiconductor Energy Laboratory Co., Ltd., Atsugi (JP)

(72) Inventor: Yoshiyuki Kurokawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/505,147

(22) Filed: Jul. 8, 2019

(65) Prior Publication Data

US 2020/0035738 A1 Jan. 30, 2020

Related U.S. Application Data

(63) Continuation of application No. 15/431,937, filed on Feb. 14, 2017, now Pat. No. 10,347,681.

(30) Foreign Application Priority Data

Feb. 19, 2016 (JP) .................. 2016-029900

(51) Int. Cl.
*H01L 27/146* (2006.01)
*H04N 5/225* (2006.01)
(Continued)

(52) U.S. Cl.
CPC .... *H01L 27/14634* (2013.01); *H01L 27/1461* (2013.01); *H01L 27/14614* (2013.01); *H01L 27/14616* (2013.01); *H01L 27/307* (2013.01); *H04N 5/2253* (2013.01); *H04N 5/374* (2013.01); *H04N 5/378* (2013.01); *H04N 5/3745* (2013.01); *H01L 27/1225* (2013.01); *H01L 29/7869* (2013.01)

(58) Field of Classification Search
CPC ......... H01L 27/14634; H01L 27/14614; H01L 27/1461; H01L 27/14616; H01L 27/307; H01L 27/1225; H01L 29/7869; H04N 5/2253; H04N 5/3745; H04N 5/374; H04N 5/378

See application file for complete search history.

(56) References Cited

U.S. PATENT DOCUMENTS 3,683,193 A    8/1972   Weimer
3,789,240 A    1/1974   Weimer
(Continued)

FOREIGN PATENT DOCUMENTS

EP        1667428 A    6/2006
JP        57-024707 B   5/1982
(Continued)

*Primary Examiner* — Albert H Cutler
(74) *Attorney, Agent, or Firm* — Fish & Richardson P.C.

(57) ABSTRACT

An object is to provide an imaging device in which a circuit for reading a signal is provided in a pixel region. The imaging device includes a first pixel and a second pixel. The first pixel is capable of outputting a first signal output from a pixel circuit included in the first pixel or a second signal input from the first pixel in the previous stage, to the first pixel or the second pixel in the next stage. The second pixel is capable of outputting, to the outside, the first signal or the second signal, which is input from the first pixel in the previous stage, or a third signal output from a pixel circuit included in the second pixel.

2 Claims, 41 Drawing Sheets

(51) Int. Cl.
*H04N 5/3745* (2011.01)
*H01L 27/30* (2006.01)
*H04N 5/374* (2011.01)
*H04N 5/378* (2011.01)
*H01L 27/12* (2006.01)
*H01L 29/786* (2006.01)

(56) References Cited

U.S. PATENT DOCUMENTS

| | | | |
|---|---|---|---|
| 4,349,743 A | 9/1982 | Ohba et al. | |
| 4,443,818 A | 4/1984 | Ohba et al. | |
| 4,551,757 A | 11/1985 | Ohkubo et al. | |
| 4,577,231 A | 3/1986 | Ohba et al. | |
| 4,621,291 A | 11/1986 | Takemoto et al. | |
| 4,788,592 A | 11/1988 | Yamawaki et al. | |
| 5,471,515 A * | 11/1995 | Fossum | H04N 5/378 377/60 |
| 6,885,396 B1 * | 4/2005 | Panicacci | H04N 5/3575 250/208.1 |
| 7,750,961 B2 | 7/2010 | Matsuda | |
| 7,943,968 B1 | 5/2011 | Yamazaki et al. | |
| 8,378,391 B2 | 2/2013 | Koyama et al. | |
| 8,610,696 B2 | 12/2013 | Kurokawa | |
| 8,654,231 B2 | 2/2014 | Kurokawa et al. | |
| 8,716,712 B2 | 5/2014 | Kozuma et al. | |
| 8,964,085 B2 | 2/2015 | Kurokawa et al. | |
| 9,029,793 B2 | 5/2015 | Spartiotis et al. | |
| 9,153,619 B2 | 10/2015 | Kurokawa et al. | |
| 9,196,648 B2 | 11/2015 | Kozuma et al. | |
| 9,236,408 B2 | 1/2016 | Yamazaki | |
| 9,257,567 B2 | 2/2016 | Kurokawa et al. | |
| 9,324,747 B2 | 4/2016 | Yamazaki et al. | |
| 9,380,195 B2 | 6/2016 | Nagata et al. | |
| 9,425,226 B2 | 8/2016 | Yamazaki et al. | |
| 9,515,107 B2 | 12/2016 | Kurokawa et al. | |
| 2002/0190215 A1 * | 12/2002 | Tashiro | H04N 5/37452 250/370.11 |
| 2003/0214591 A1 * | 11/2003 | Kakumoto | H04N 5/3653 348/243 |
| 2006/0268154 A1 * | 11/2006 | Katagiri | H04N 5/378 348/370 |
| 2007/0145447 A1 | 6/2007 | Lee et al. | |
| 2008/0049128 A1 * | 2/2008 | Murata | H04N 5/378 348/294 |
| 2008/0079825 A1 | 4/2008 | Matsuda | |
| 2009/0021619 A1 * | 1/2009 | Kasuga | H04N 5/378 348/300 |
| 2009/0101798 A1 * | 4/2009 | Yadid-Pecht | H04N 5/3559 250/208.1 |
| 2011/0176038 A1 | 7/2011 | Kurokawa et al. | |
| 2011/0221723 A1 | 9/2011 | Kurokawa et al. | |
| 2011/0221724 A1 | 9/2011 | Kurokawa et al. | |
| 2014/0267864 A1 * | 9/2014 | Kurokawa | H01L 27/1464 348/310 |
| 2015/0129944 A1 | 5/2015 | Kurokawa et al. | |
| 2015/0263052 A1 | 9/2015 | Yamazaki et al. | |
| 2016/0044265 A1 * | 2/2016 | Kato | H04N 5/37452 348/308 |
| 2017/0104946 A1 * | 4/2017 | Hong | H01L 27/14627 |

FOREIGN PATENT DOCUMENTS

| | | |
|---|---|---|
| JP | 2002-530016 | 9/2002 |
| JP | 2007-096055 A | 4/2007 |
| JP | 2007-123861 A | 5/2007 |
| JP | 2008-092014 A | 4/2008 |
| JP | 2011-119711 A | 6/2011 |
| JP | 2013-243355 A | 12/2013 |
| JP | 2015-026946 A | 2/2015 |
| WO | WO-2000/028729 | 5/2000 |

* cited by examiner

FIG. 29A
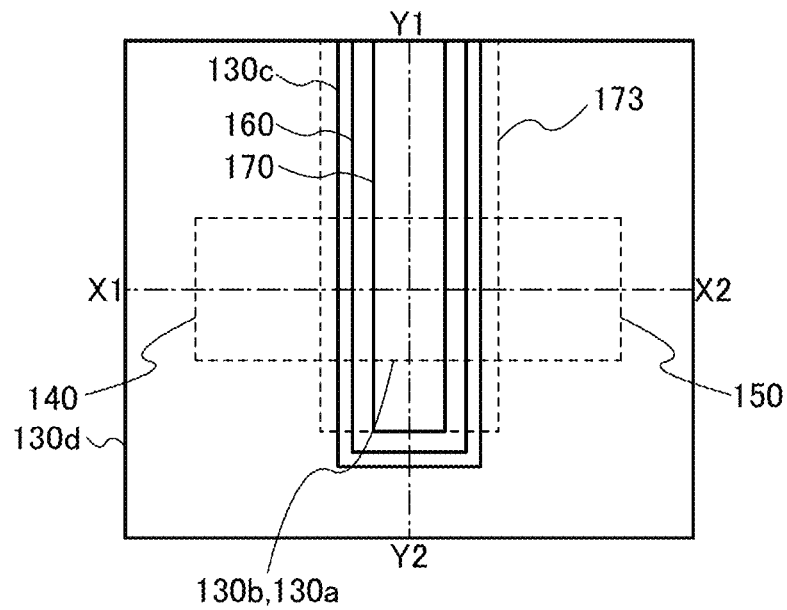
FIG. 29B
FIG. 29C
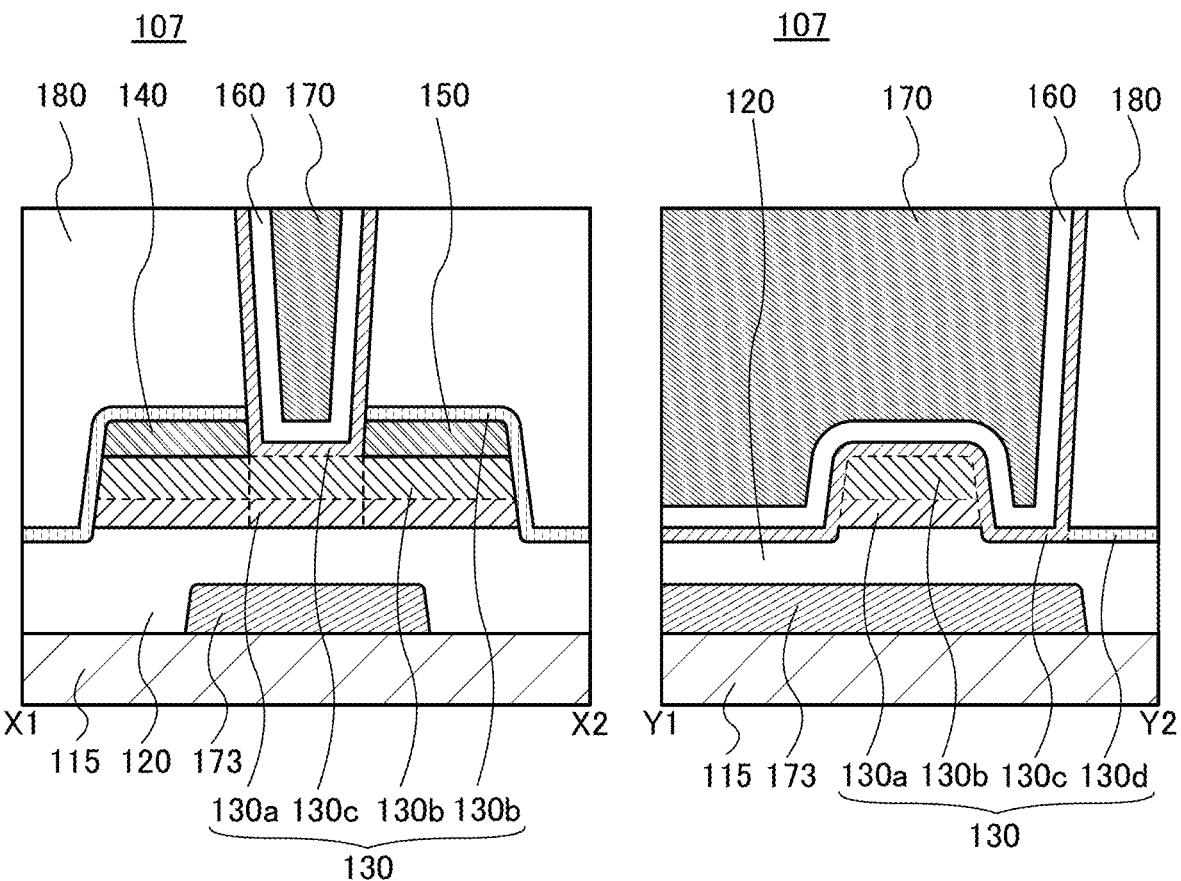

IMAGING DEVICE AND ELECTRONIC DEVICE

CROSS-REFERENCE TO RELATED APPLICATIONS

This application is a continuation of U.S. application Ser. No. 15/431,937, filed Feb. 14, 2017, now allowed, which claims the benefit of a foreign priority application filed in Japan as Serial No. 2016-029900 on Feb. 19, 2016, both of which are incorporated by reference.

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

As a semiconductor material applicable to a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor containing an oxide semiconductor is used in part of a pixel circuit.

Patent Document 4 discloses an imaging device in which a transistor containing silicon, a transistor containing an oxide semiconductor, and a photodiode including a crystalline silicon layer are stacked.

PATENT DOCUMENT

Patent Document 1: Japanese Published Patent Application No. 2007-123861
Patent Document 2: Japanese Published Patent Application No. 2007-096055
Patent Document 3: Japanese Published Patent Application No. 2011-119711
Patent Document 4: Japanese Published Patent Application No. 2013-243355

SUMMARY OF THE INVENTION

The increase in density and capacity of semiconductor integrated circuits has been underway; meanwhile, their microfabrication is required. Thus, two-dimensional integration has been shifted actively to three-dimensional integration. Although a manufacturing process for three-dimensional integration may be complicated, layer materials, design rule, and the like can be selected more flexibly. It is therefore possible to manufacture a high-functional semiconductor integrated circuit that is difficult to manufacture with two-dimensional integration.

A pixel circuit of an imaging device includes a photoelectric conversion element and a transistor. The photoelectric conversion element needs to have high optical sensitivity, and the transistor needs to have a low off-state current and low noise characteristics. When photoelectric conversion elements and transistors are integrated three dimensionally and manufactured using materials suitable for each element, an imaging element with higher functionality can be manufactured.

Peripheral circuits such as driver circuits are preferably manufactured in the same process as the pixel circuits so that a connection step and the like are simplified.

In view of the above, an object of one embodiment of the present invention is to provide an imaging device in which a circuit for reading a signal is provided in a pixel region. Another object is to provide an imaging device that is integrated three dimensionally. Another object is to provide an imaging device including a transistor containing an oxide semiconductor. Another object is to provide an imaging device capable of taking an image with little noise. Another object is to provide an imaging device capable of being used in a wide temperature range. Another object is to provide an imaging device with high reliability. Another object is to provide a novel imaging device or the like.

Note that the description of these objects does not preclude the existence of other objects. One embodiment of the present invention does not necessarily achieve all the objects listed above. Objects other than those listed above will be apparent from and can be derived from the description of the specification, the drawings, the claims, and the like.

One embodiment of the present invention relates to an imaging device with a stacked structure.

One embodiment of the present invention is an imaging device including a first pixel, a second pixel, and a third pixel. The first pixel includes a first pixel circuit and a first circuit. The second pixel includes a second pixel circuit and a second circuit. The third pixel includes a third pixel circuit and a third circuit. The first pixel circuit has a function of outputting a first signal. The second pixel circuit has a function of outputting a second signal. The third pixel circuit has a function of outputting a third signal. The first pixel is electrically connected to the second pixel. The second pixel is electrically connected to the third pixel. The first circuit has a function of storing the first signal. The first circuit has a function of transferring the first signal to the second circuit. The second circuit has a function of storing the signal transferred from the first circuit and the second signal. The second circuit has a function of transferring the signal transferred from the first circuit and the second signal, to the third circuit. The third circuit has a function of outputting the signal transferred from the second circuit and the third signal, to the outside.

The imaging device can be configured as follows. Each of the first, second, and third pixel circuits includes a photoelectric conversion element and first to fourth transistors.

One electrode of the photoelectric conversion element is electrically connected to one of a source and a drain of the first transistor. The one electrode of the photoelectric conversion element is electrically connected to one of a source and a drain of the second transistor. The other of the source and the drain of the first transistor is electrically connected to a gate of the third transistor. One of a source and a drain of the third transistor is electrically connected to one of a source and a drain of the fourth transistor. Each of the first and second circuits includes fifth to tenth transistors and first and second capacitors. One of a source and a drain of the fifth transistor is electrically connected to one electrode of the first capacitor. The one of the source and the drain of the fifth transistor is electrically connected to a gate of the sixth transistor. One of a source and a drain of the sixth transistor is electrically connected to one of a source and a drain of the seventh transistor. The other of the source and the drain of the seventh transistor is electrically connected to one of a source and a drain of the eighth transistor. The one of the source and the drain of the eighth transistor is electrically connected to one electrode of the second capacitor. The one of the source and the drain of the eighth transistor is electrically connected to a gate of the ninth transistor. One of a source and a drain of the ninth transistor is electrically connected to one of a source and a drain of the tenth transistor. The third circuit includes an eleventh transistor and an output terminal. One of a source and a drain of the eleventh transistor is electrically connected to the output terminal.

The other of the source and the drain of the third transistor in the first pixel circuit can be electrically connected to the gate of the sixth transistor in the first circuit, and the other of the source and the drain of the third transistor in the second pixel circuit can be electrically connected to the gate of the sixth transistor in the second circuit.

The other of the source and the drain of the third transistor in the third pixel circuit can be electrically connected to the one of the source and the drain of the eleventh transistor.

The gate of the sixth transistor in the second circuit can be electrically connected to the other of the source and the drain of the tenth transistor in another first circuit in the previous stage.

The other of the source and the drain of the tenth transistor in the second circuit can be electrically connected to the one of the source and the drain of the eleventh transistor in the third circuit.

It is preferred that each of the first to eleventh transistors contain an oxide semiconductor in a channel formation region, and that the oxide semiconductor contain In, Zn, and M (M is at least one of Al, Ga, Y, and Sn).

Each of the third, sixth, and ninth transistors preferably has a backgate.

Each of the first to eleventh transistors can include a region overlapping or overlapped by the photoelectric conversion element.

One embodiment of the present invention can provide an imaging device in which a circuit for reading a signal is provided in a pixel region, an imaging device that is integrated three dimensionally, an imaging device including a transistor containing an oxide semiconductor, an imaging device capable of taking an image with little noise, an imaging device capable of being used in a wide temperature range, an imaging device with high reliability, or a novel imaging device or the like.

Note that the effects of one embodiment of the present invention are not limited to those listed above. For example, depending on circumstances or conditions, one embodiment of the present invention may produce another effect or may not produce any of the above effects.

BRIEF DESCRIPTION OF THE DRAWINGS

In the accompanying drawings:

FIGS. 29A to 29C are a top view and cross-sectional views illustrating a transistor;

DETAILED DESCRIPTION OF THE INVENTION

Figure 1A:
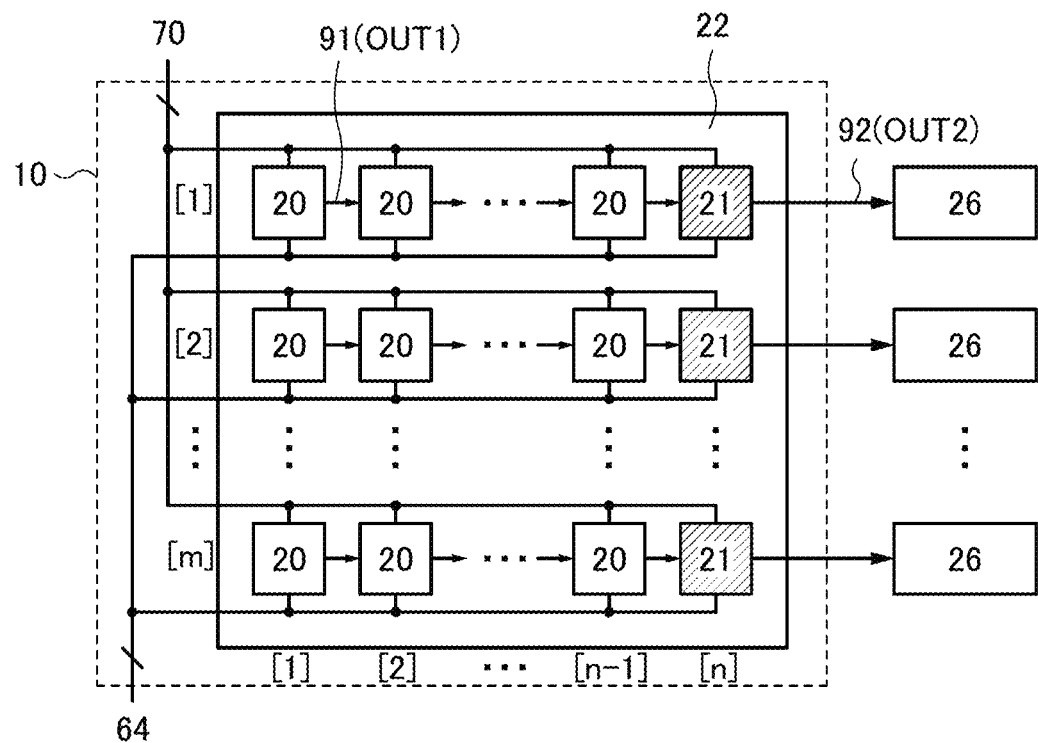
FIGS. 1A to 1C are block diagrams illustrating an imaging element.

Embodiments will be described in detail with reference to the drawings. Note that the present invention is not limited to the following description, and it will be readily appreciated by those skilled in the art that modes and details can be modified in various ways without departing from the spirit and scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings or the hatching patterns are omitted in some cases.

Note that the ordinal numbers such as "first" and "second" are used for convenience and do not denote the order of steps or the stacking order of layers. Therefore, for example, the term "first" can be replaced with the term "second," "third," or the like as appropriate. In addition, ordinal numbers in this specification and the like sometimes do not correspond to ordinal numbers that specify one embodiment of the present invention.

For example, in this specification and the like, an explicit description "X and Y are connected" means that X and Y are electrically connected, X and Y are functionally connected, and X and Y are directly connected. Accordingly, without being limited to a predetermined connection relation (e.g., a connection relation shown in drawings or texts), another connection relation is regarded as being included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without an element that allows electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not. Alternatively, a switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are regarded as being functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., X and Y are connected with another element or circuit provided therebetween), X and Y are functionally connected (i.e., X and Y are functionally connected with another element or circuit provided therebetween), and X and Y are directly connected (i.e., X and Y are connected without another element or circuit provided therebetween). That is, in this specification and the like, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that the above expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component has functions of a plurality of components in some cases. For example, when part of a wiring functions as an electrode, one conductive film functions as the wiring and the electrode. Thus, "electrical connection" in this specification also means such a case where one conductive film has functions of a plurality of components.

Note that the terms "film" and "layer" can be interchanged with each other depending on the case or circumstances. For example, in some cases, the term "conductive film" can be used instead of "conductive layer," and the term "insulating layer" can be used instead of "insulating film."

Note that in general, a potential (voltage) is a relative value and its level depends on the difference from a reference potential. Therefore, a ground potential, GND, or the like is not necessarily 0 V. For example, a ground potential or GND may be defined using the lowest potential or a substantially intermediate potential in a circuit as a reference. In those cases, a positive potential and a negative potential are set using the potential as a reference.

Embodiment 1

In this embodiment, an imaging device that is one embodiment of the present invention will be described with reference to drawings.

One embodiment of the present invention is a structure and an operating method of an imaging device in which circuits for reading signals output from pixel circuits are distributed among pixels.

The imaging device includes a first pixel and a second pixel. The first pixel and the second pixel are electrically connected to each other. The imaging device may include a plurality of first pixels and second pixels.

The first pixel is capable of outputting a first signal output from a pixel circuit included in the first pixel or a second signal input from the first pixel in the previous stage, to the first pixel or the second pixel in the next stage.

The second pixel is capable of outputting, to the outside, the first signal or the second signal, which is input from the first pixel in the previous stage, or a third signal output from a pixel circuit included in the second pixel.

The read circuit can be formed using transistors with the same conductivity and manufactured in parallel with the pixel circuits without the increase in the number of steps.

A photoelectric conversion element in the imaging device can be freely selected. For example, over a single crystal silicon substrate where a photodiode is formed, the pixel circuits and the read circuits can be formed using transistors containing an oxide semiconductor.

The transistor containing an oxide semiconductor in an active layer has a low off-state current and therefore facilitates construction of a memory for retaining data in the pixel circuits and the read circuits.

FIG. 1A is a block diagram of an imaging element 10 of one embodiment of the present invention. In the imaging element 10, a pixel portion 22 includes pixels 20 and pixels 21 that are arranged in m rows and n columns (m is a natural number of 1 or more and n is a natural number of 2 or more).

Figures 1B, 1C:
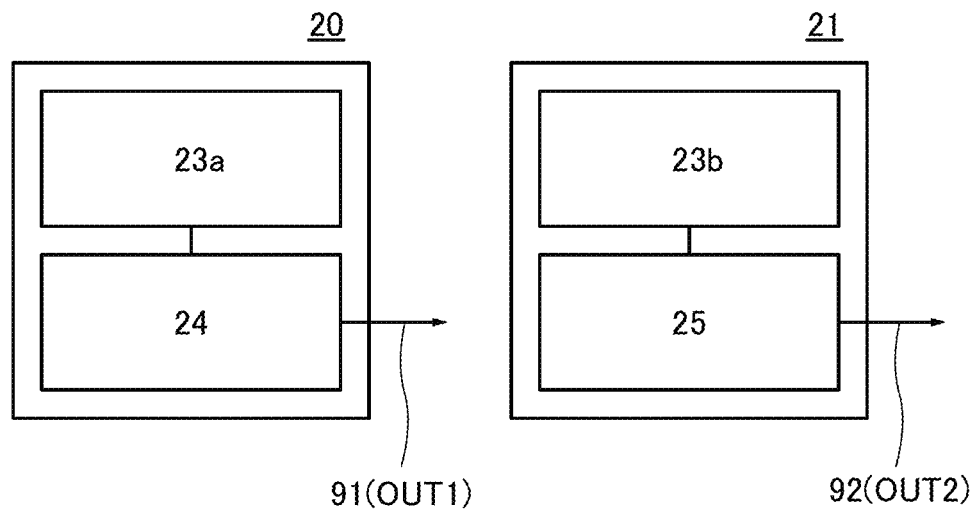

The pixel 20 includes a pixel circuit 23a and a circuit 24 as illustrated in FIG. 1B. The pixel circuit 23a has an imaging function. The circuit 24 is capable of storing a first signal output from the pixel circuit 23a or a second signal input from the pixel 20 in the previous stage.

The pixel 21 includes a pixel circuit 23b and a circuit 25 as illustrated in FIG. 1C. The pixel circuit 23b has an imaging function. The circuit 25 is capable of outputting, to the outside, the first signal or the second signal, which is input from the pixel 20 in the previous stage, or a third signal output from the pixel circuit 23b.

A wiring 70 is a group of signal lines for operating the pixel circuits 23a and 23b. A wiring 64 is a group of signal lines for operating the circuits 24 and 25. All the pixels can be connected in parallel to the wiring 70 and the wiring 64.

As illustrated in FIG. 1A, the pixels 20 can be provided in the first to (n−1)th columns and the pixels 21 can be provided in the n-th column.

When focusing on the pixels 20 placed in the row direction, the circuits 24 in the adjacent pixels 20 are electrically connected to each other through a wiring 91 (OUT1). The circuit 25 of the pixel 21 in the last stage is electrically connected to the circuit 24 of the pixel 20 in the previous stage through the wiring 91 (OUT1).

The circuit 24 has a first node and a second node that store a signal. A signal stored at the first node can be transferred to the second node. A signal stored at the second node can be transferred to the circuit 24 of the pixel 20 in the next stage or to the circuit 25 of the pixel 21 in the next stage. That is, a signal can be transferred through adjacent pixels and output to the outside.

In FIG. 1A, a signal is extracted from the pixel 21 in each row, and an A/D converter 26 is electrically connected to the pixel 21 in each row through a wiring 92 (OUT2). To the A/D converters 26, a signal in the n-th column, a signal in the (n−1)th column, and a signal in the (n−2)th column are sequentially input in this order, and finally a signal in the first column is input. With this structure, extraction of signals sequentially from the n-th column can be performed concurrently in all the columns; thus, reading can be performed at high speed.

Figure 2A:
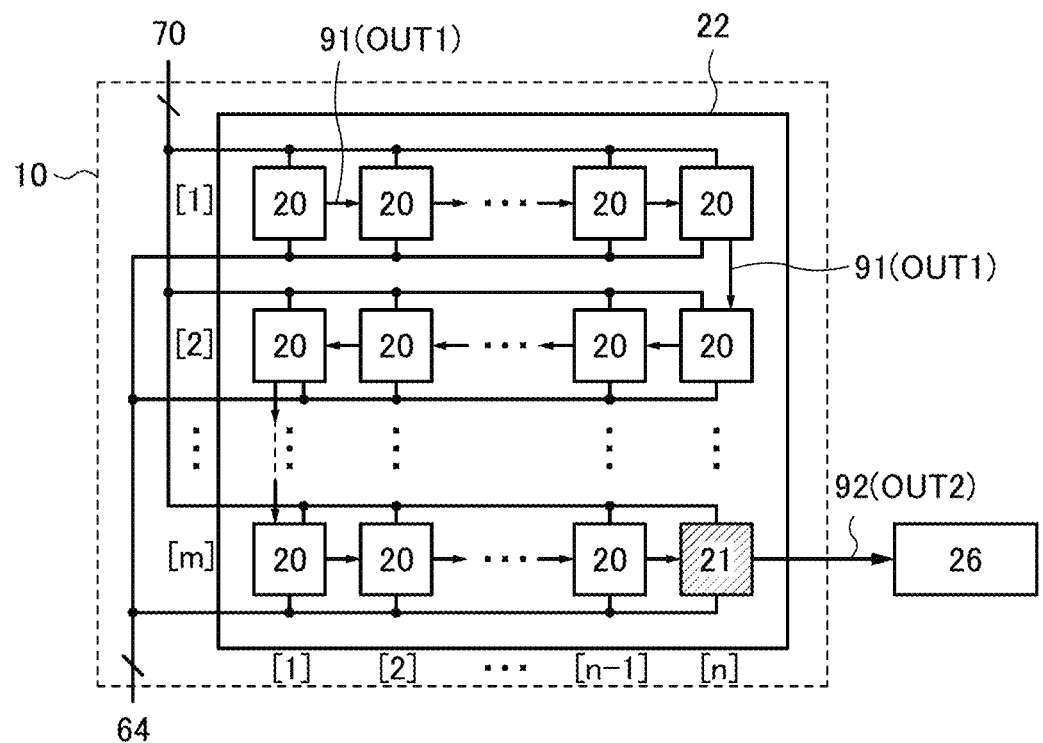
FIGS. 2A and 2B are block diagrams each illustrating an imaging element.

Note that the imaging element 10 of one embodiment of the present invention may have a structure illustrated in FIG. 2A. In the imaging element 10 in FIG. 2A, all pixels are electrically connected to each other in such a manner that a pixel at one end of the k-th row (k is 1 to m−1) is electrically connected to a pixel at the same-side end of the (k+1)th row so that a string of pixels turns back. The imaging element 10 can be configured such that the pixel 21 is used as a pixel placed in the last stage of the m-th row and the pixels 20 are used as the other pixels.

In FIG. 2A, a signal is extracted from the pixel 21 provided in the last stage of the m-th row (last row), and the A/D converter 26 is connected to the pixel 21 in the m-th row through the wiring 92 (OUT2). To the A/D converter 26, a signal in the n-th column, a signal in the (n−1)th column, and a signal in the (n−2)th column that are of the m-th row are sequentially input in this order, and finally a signal in the first column and the first row is input. Such a structure enables the number of A/D converters to be one, and thus can suppress output variations caused when a plurality of A/D converters are used.

Figure 2B:
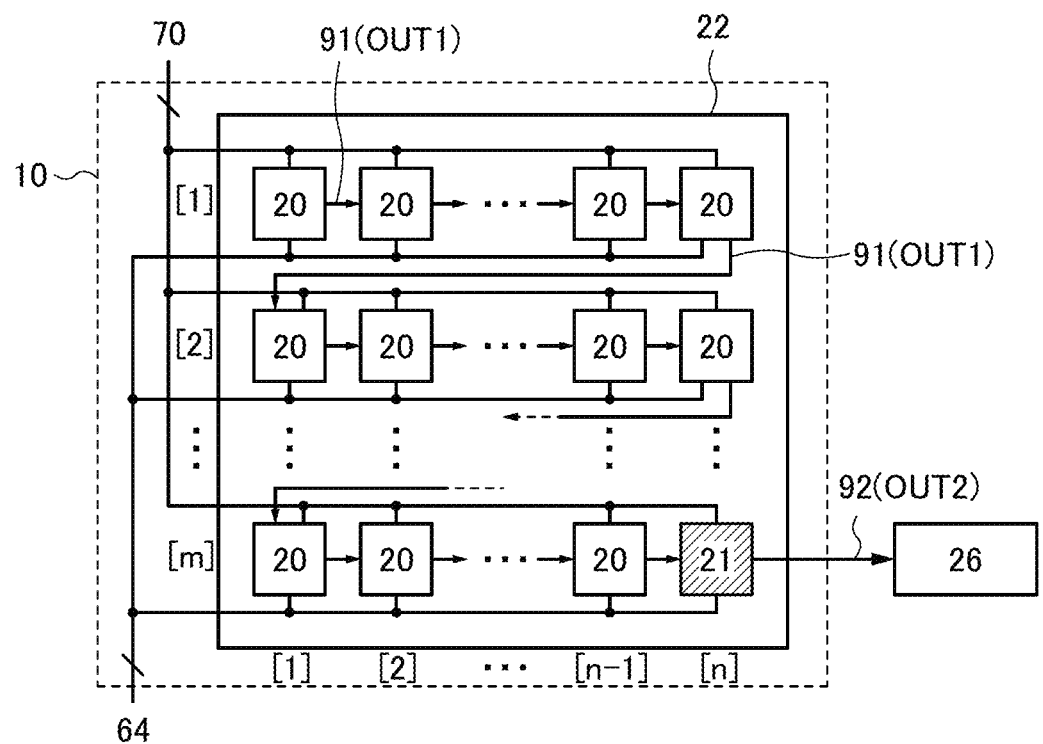

The imaging element 10 of one embodiment of the present invention may have a structure illustrated in FIG. 2B. In the imaging element 10 in FIG. 2B, a pixel at one end of the k-th row is electrically connected to a pixel at the other end of the (k+1)th row, the pixel 21 is used as a pixel placed in the last stage of the m-th row, and the pixels 20 are used as the other pixels.

The structure in FIG. 2B is the same as that in FIG. 2A except the connection of the pixels 20 between rows. The direction of reading in the row direction is inverted row by row in FIG. 2A, whereas the direction of reading in the row direction can be fixed in FIG. 2B.

Figure 3:
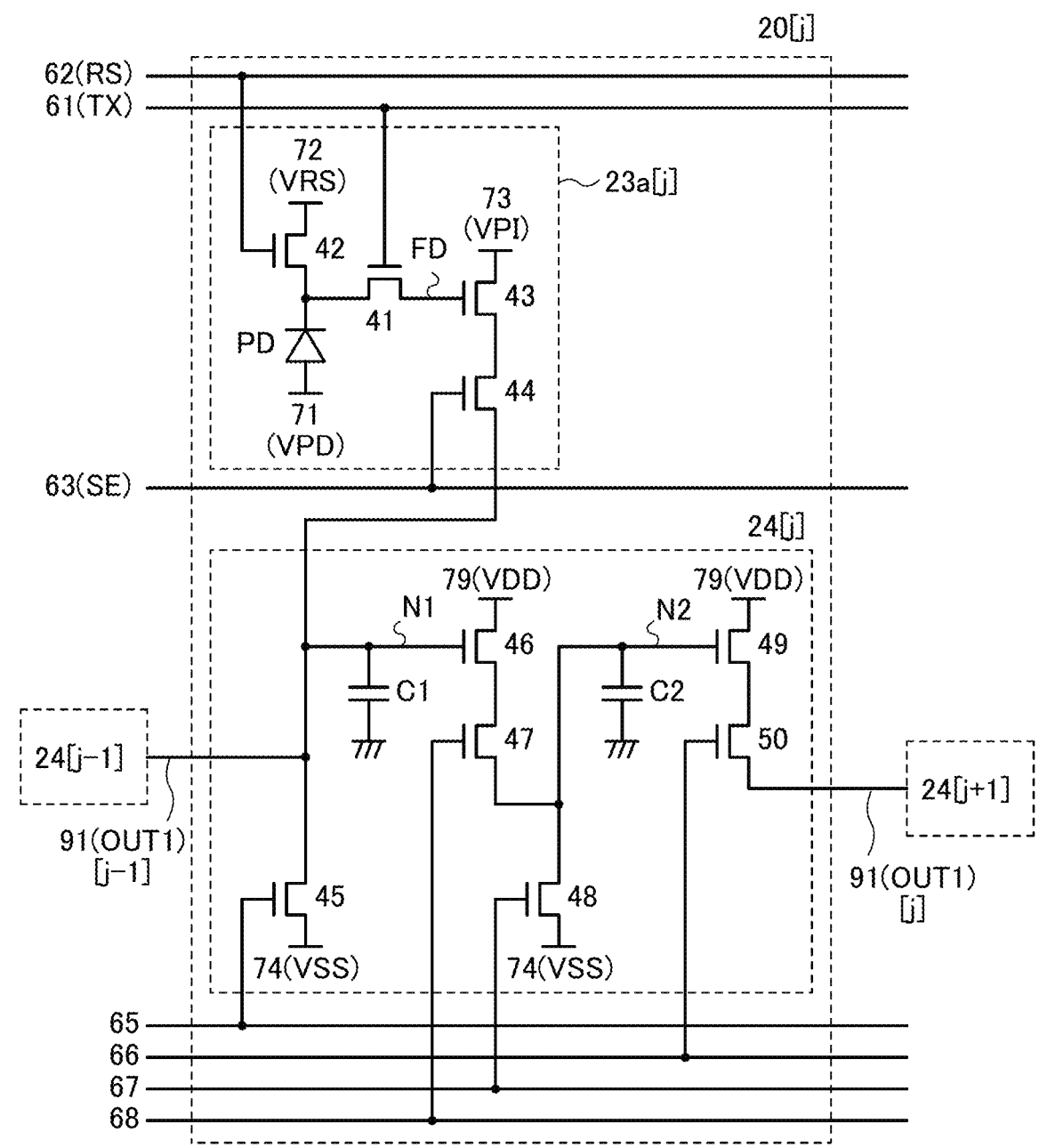
FIG. 3 is a circuit diagram illustrating a pixel.

Next, a specific circuit configuration of the pixel 20 will be described. FIG. 3 is a circuit diagram of the pixel 20. Although FIG. 3 and the like show an example using n-channel transistors, one embodiment of the present invention is not limited to this, and some transistors may be replaced with p-channel transistors. Moreover, the configuration of the pixel circuit is freely selected and can be a configuration other than those of the pixel circuits shown in this embodiment. FIG. 3 illustrates an example of a pixel 20[*j*] as the pixel 20 in the j-th column.

The pixel circuit 23*a* can include a photoelectric conversion element PD, a transistor 41, a transistor 42, a transistor 43, and a transistor 44. One electrode of the photoelectric conversion element PD is electrically connected to one of a source and a drain of the transistor 41 and one of a source and a drain of the transistor 42. The other of the source and the drain of the transistor 41 is electrically connected to a gate of the transistor 43. One of a source and a drain of the transistor 43 is electrically connected to one of a source and a drain of the transistor 44.

Figure 16A:
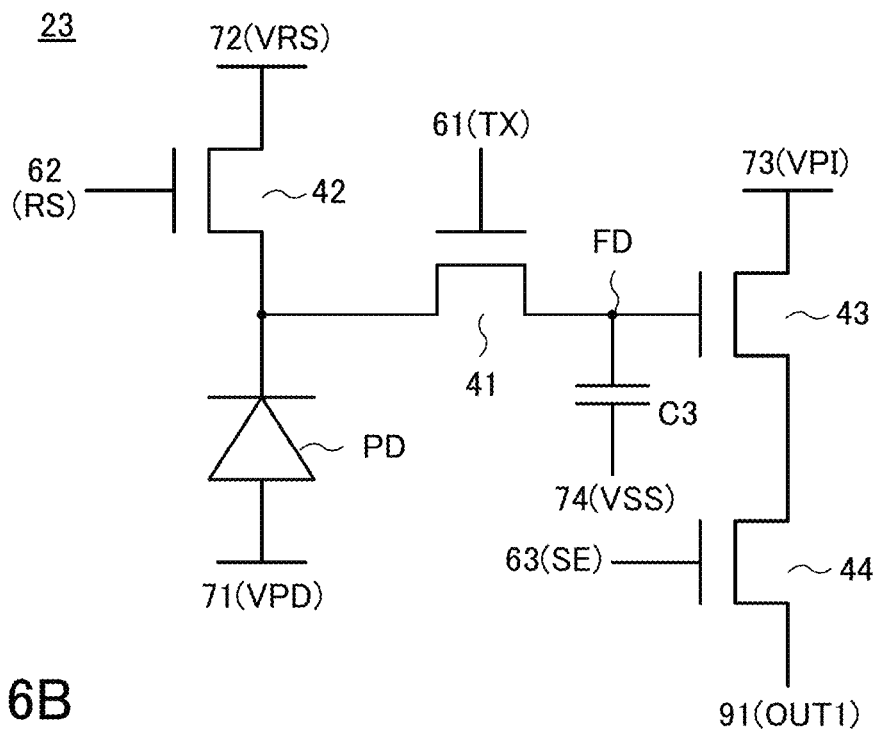
FIGS. 16A and 16B are circuit diagrams each illustrating a pixel.

Here, a node FD where the other of the source and the drain of the transistor 41 and the gate of the transistor 43 are connected is a charge detection portion. Note that a capacitor C3 may be connected to the node FD as illustrated in FIG. 16A.

Figure 16B:
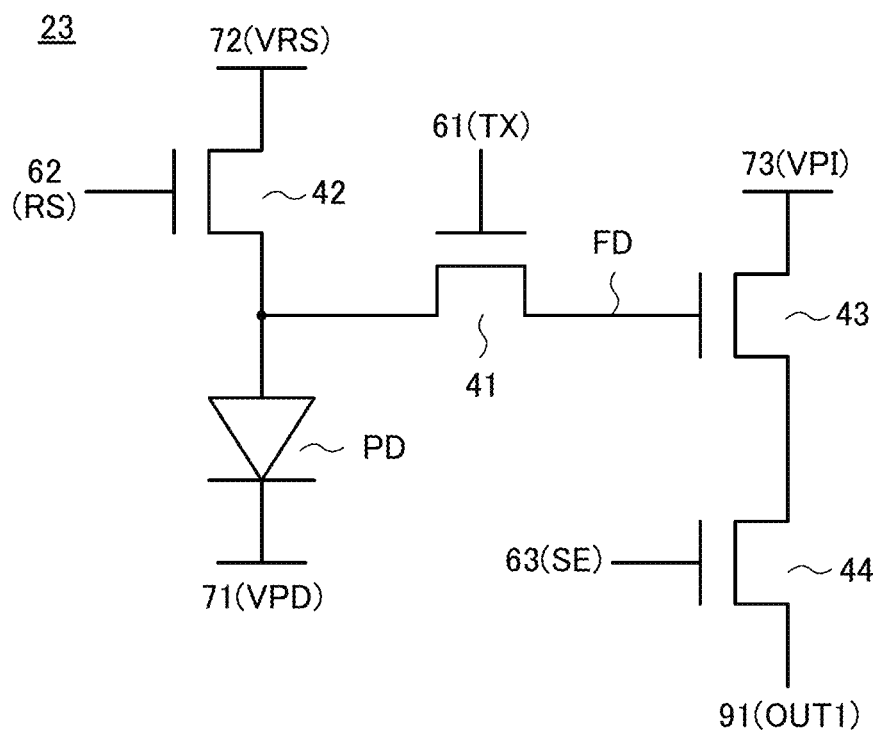

In FIG. 3, the other electrode of the photoelectric conversion element PD is electrically connected to a wiring 71 (VPD). The other of the source and the drain of the transistor 42 is electrically connected to a wiring 72 (VRS). The other of the source and the drain of the transistor 43 is electrically connected to a wiring 73 (VPI). The other of the source and the drain of the transistor 44 is electrically connected to the circuit 24. Note that the one electrode of the photoelectric conversion element PD may be electrically connected to the wiring 71 (VPD) and the other electrode may be electrically connected to the one of the source and the drain of the transistor 41 as illustrated in FIG. 16B.

The wiring 71 (VPD), the wiring 72 (VRS), and the wiring 73 (VPI) can function as power supply lines. For example, the wiring 71 (VPD) can function as a low-potential power supply line. The wiring 72 (VRS) and the wiring 73 (VPI) can function as high-potential power supply lines.

A gate of the transistor 41 is electrically connected to a wiring 61 (TX). A gate of the transistor 42 is electrically connected to a wiring 62 (RS). A gate of the transistor 44 is electrically connected to a wiring 63 (SE).

The wiring 61 (TX), the wiring 62 (RS), and the wiring 63 (SE) can each function as a signal line for controlling the on/off state of the transistor to which the wiring is connected.

The transistor 41 can function as a transistor for transferring the potential of the one electrode of the photoelectric conversion element PD to the node FD. The transistor 42 can function as a transistor for resetting the potential of the node FD. The transistor 43 can function as a transistor for outputting a signal corresponding to the potential of the node FD. The transistor 44 can function as a transistor for selecting the pixel 20.

The circuit 24 can include a transistor 45, a transistor 46, a transistor 47, a transistor 48, a transistor 49, a transistor 50, a capacitor C1, a capacitor C2, and the wiring 91 (OUT1). The circuit 24 can function as a register, and a plurality of circuits 24 connected to each other can function as a shift register.

One of a source and a drain of the transistor 45 is electrically connected to one electrode of the capacitor C1 and a gate of the transistor 46. One of a source and a drain of the transistor 46 is electrically connected to one of a source and a drain of a transistor 47. The other of the source and the drain of the transistor 47 is electrically connected to one of a source and a drain of the transistor 48. The one of the source and the drain of the transistor 48 is electrically connected to one electrode of the capacitor C2 and a gate of the transistor 49. One of a source and a drain of the transistor 49 is electrically connected to one of a source and a drain of the transistor 50. The other of the source and the drain of the transistor 50 is electrically connected to the wiring 91 (OUT1).

Here, a wiring to which the one of the source and the drain of the transistor 45, the one electrode of the capacitor C1, and the gate of the transistor 46 are connected is referred to as a node N1. A wiring to which the one of the source and the drain of the transistor 48, the one electrode of the capacitor C2, and the gate of the transistor 49 are connected is referred to as a node N2.

In FIG. 3, the other of the source and the drain of the transistor 45 and the other of the source and the drain of the transistor 48 are electrically connected to a wiring 74 (VSS). The other of the source and the drain of the transistor 46 and the other of the source and the drain of the transistor 49 are electrically connected to a wiring 79 (VDD). The wiring 74 (VSS) and the wiring 79 (VDD) can function as power supply lines. For example, the wiring 74 (VSS) can function as a low-potential power supply line, and the wiring 79 (VDD) can function as a high-potential power supply line.

A gate of the transistor 45 is electrically connected to a wiring 65. A gate of the transistor 47 is electrically connected to a wiring 68. A gate of the transistor 48 is electrically connected to a wiring 67. A gate of the transistor 50 is electrically connected to a wiring 66.

Each of the wirings 65 to 68 can function as a signal line for controlling the on/off state of the transistor to which the wiring is connected.

The transistor 45 can have a function of resetting the potential of the node N1. The capacitor C1 can function as a storage capacitor for storing a signal at the node N1. The transistor 46 can have a function of outputting a signal corresponding to the potential of the node N1. The transistor 47 can have a function of transferring a signal output from the transistor 46, to the node N2.

The transistor 48 can have a function of resetting the potential of the node N2. The capacitor C2 can function as a storage capacitor for storing a signal at the node N2. The transistor 49 can have a function of outputting a signal corresponding to the potential of the node N2. The transistor 50 can have a function of transferring a signal output from the transistor 49, to the wiring 91 (OUT1).

In the pixel 20[*j*] in the j-th column illustrated in FIG. 3, the node N1 is electrically connected to the other of the source and the drain of the transistor 44 in the pixel circuit 23*a*[*j*]. The node N1 is also electrically connected to the circuit 24[*j*−1] included in the pixel 20[*j*−1] in the previous stage through the wiring 91[*j*−1] (OUT1). The wiring 91[*j*] (OUT1) is electrically connected to the circuit 24[*j*+1] in the pixel 20[*j*−1] in the next stage. Note that the wiring 91[*j*] (OUT1) may be electrically connected to the circuit 25 in the pixel 21 that will be described later in detail.

Figure 4:
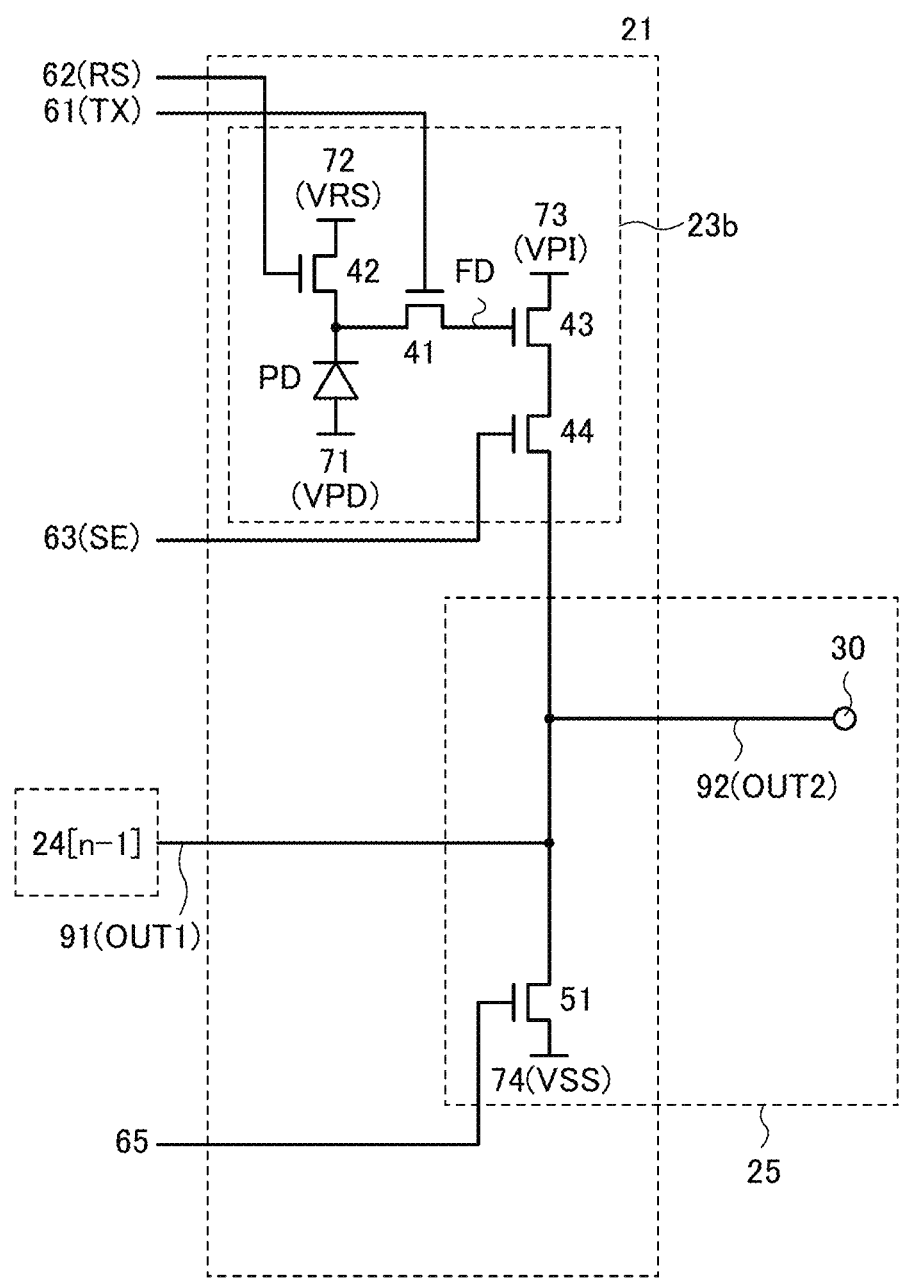
FIG. 4 is a circuit diagram illustrating a pixel.

Next, a specific circuit configuration of the pixel 21 will be described. FIG. 4 is a circuit diagram of the pixel 21. The pixel circuit 23*b* can have the same configuration as the pixel circuit 23*a*. The circuit 25 can include a transistor 51, the wiring 92 (OUT2), and a terminal 30.

One of a source and a drain of the transistor 51 is electrically connected to the other of the source and the drain of the transistor 44 in the pixel circuit 23*b* and to the terminal 30 through the wiring 92 (OUT2). The other of the source and the drain of the transistor 51 is electrically connected to the wiring 74. A gate of the transistor 51 is electrically connected to the wiring 65.

The transistor 51 can function as a transistor for resetting the potential of the wiring 92 (OUT2).

The wiring 92 (OUT2) is electrically connected to the other of the source and the drain of the transistor 44 in the pixel circuit 23*b* and to the circuit 24 in the pixel 20 in the previous stage through the wiring 91 (OUT1).

Each of the transistors 41 to 51 is preferably a transistor containing an oxide semiconductor in a channel formation region (hereinafter referred to as OS transistor). The OS transistor exhibits an extremely low off-state current; thus, the pixel circuits 23*a* and 23*b* composed of OS transistors excel in data retention characteristics. For that reason, a global shutter system in which charge accumulation operation is performed in all the pixels at the same time can be employed without a complicated circuit configuration and operating method. Furthermore, the circuits 24 and 25 composed of OS transistors excel in data retention characteristics; hence, a shift register that consists of the circuits 24 and 25 can accurately transfer imaging data obtained in the pixel circuits 23*a* and 23*b*.

The OS transistor has lower temperature dependence of change in electrical characteristics than a transistor containing silicon in an active region or an active layer (hereinafter referred to as Si transistor), and thus can be used in an extremely wide range of temperatures. Accordingly, an imaging device and a semiconductor device that include OS transistors are suitable for use in automobiles, aircraft, and spacecraft.

Moreover, the OS transistor has higher drain withstand voltage than a Si transistor. To utilize avalanche multiplication, a photoelectric conversion element containing a selenium-based material or the like in a photoelectric conversion layer preferably operates with application of a relatively high voltage (e.g., 10 V or higher). Thus, by combination of the OS transistor and the photoelectric conversion element in which a selenium-based material is used for the photoelectric conversion layer, a highly reliable imaging device can be obtained.

Note that the above structure of the pixel 20 is just an example, and some of the circuits, the transistors, the capacitor, the wirings, or the like are not included in some cases. Alternatively, a circuit, a transistor, a capacitor, a wiring, or the like that is not included in the above structure may be included; or connection of some wirings may be different from that described above.

In addition, connection between the component (e.g., the transistor, the capacitor, and the photoelectric conversion element) and the wiring illustrated in FIGS. 3 and 4 is an example. Components may be electrically connected to different wirings, or a plurality of components might be electrically connected to the same wiring.

Next, the operation of the pixel 20 and the pixel 21 will be described.

The pixel circuits 23*a* and 23*b* accumulate charge corresponding to the intensity of light that enters the photoelectric conversion element PD, at the node FD. The potential of the node FD is reset by the transistor 42, and transfer of charge to the node FD is controlled by the transistor 41. The potential of the node FD becomes a potential corresponding to the intensity of light that enters the photoelectric conversion element PD.

The pixel circuits 23*a* and 23*b* can output the gate voltage of the transistor 43, that is, a signal corresponding to the potential of the node FD to the circuit 24 by controlling the transistor 44. When the transistor 43 is a source follower, outputs of the pixel circuits 23*a* and 23*b* can be the potential of the node FD.

In the circuit 24, after charge at the capacitor C1 is reset, that is, the potential of the node FD is initialized by the transistor 45, an output of the pixel circuit 23*a* or an output of the circuit 24 in the previous stage is obtained. With this operation, the potential of the node N1 can be set to a potential (analog potential) of the output of the pixel circuit 23a or the output of the circuit 24 in the previous stage.

The circuit 24 can output the gate voltage of the transistor 46, that is, a signal corresponding to the potential of the node N1 to the node N2 by controlling the transistor 47. When the transistor 46 is a source follower, the potential of the signal can be the potential of the node N1.

In the circuit 24, after charge at the capacitor C2 is reset, that is, the potential of the node N2 is initialized by the transistor 48, a signal corresponding to the potential of the node N1 is obtained, whereby the potential of the node N2 can be set to a potential (analog potential) corresponding to the signal. That is, the potential of the node N1 can be set to the potential of the node N2.

The circuit 24 can output the gate voltage of the transistor 49, that is, a signal corresponding to the potential of the node N2 to the wiring 91 (OUT1) by controlling the transistor 50. When the transistor 49 is a source follower, the potential of the signal can be the potential of the node N2.

In the circuit 25, after the potential of the wiring 92 (OUT2) is reset by the transistor 51, an output of the circuit 24 in the previous stage is obtained, whereby the potential of the wiring 92 (OUT2) can be set to the potential of the node N2 in the circuit 24 in the previous stage.

In the above explanation, the outputs of the pixel circuits 23a and 23b have a potential obtained by subtracting the threshold voltage of the transistor 43 from the potential of the node FD. Similarly, the signal output to the node N2 in the circuit 24 has a potential obtained by subtracting the threshold voltage of the transistor 46 from the potential of the node N1. The signal output to the wiring 91 (OUT1) has a potential obtained by subtracting the threshold voltage of the transistor 49 from the potential of the node N2.

Figure 18:
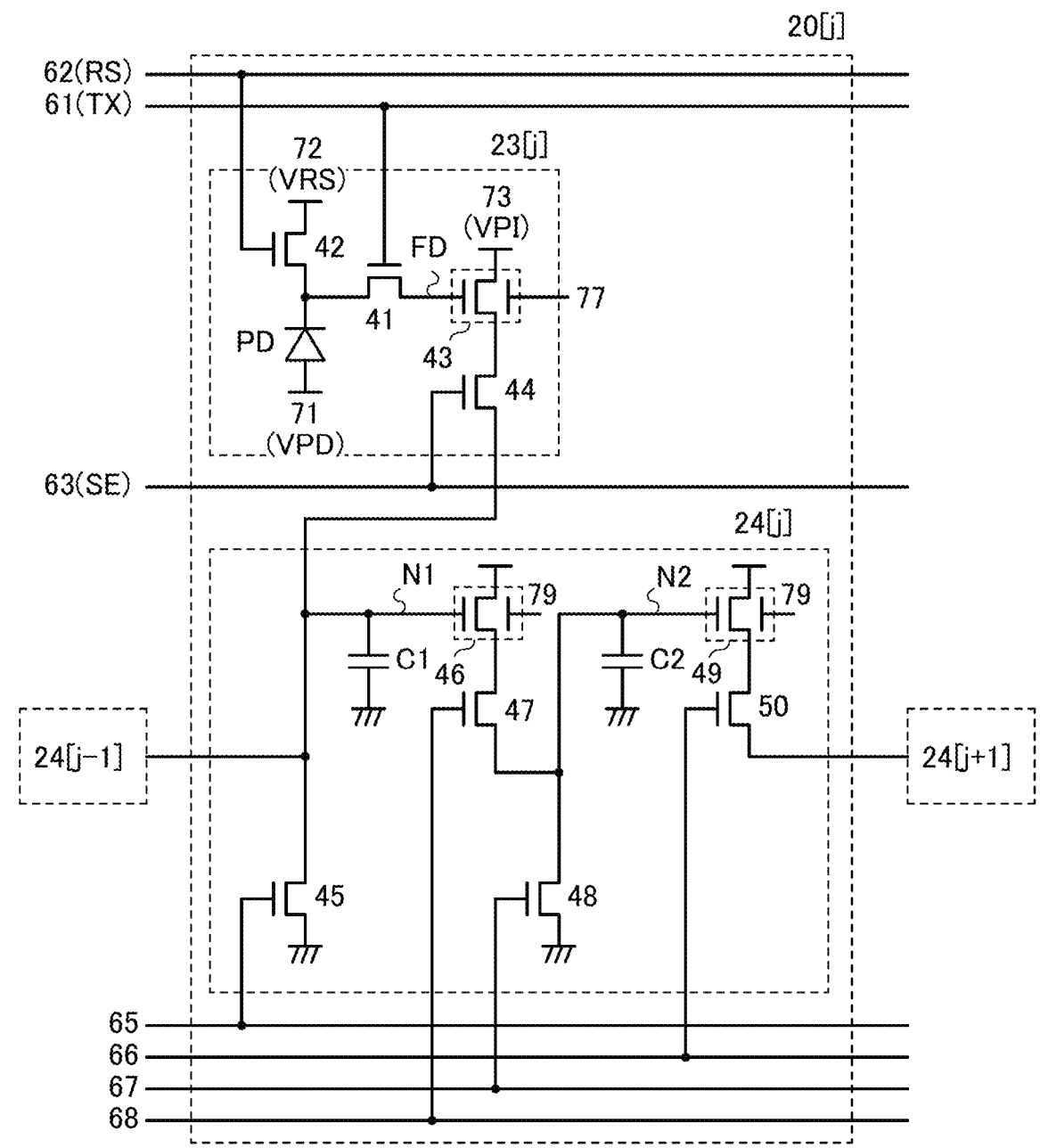
FIG. 18 is a circuit diagram illustrating a pixel.

In other words, as a signal is transferred through stages of the shift register composed of the circuits 24, the potentials of the outputs from the register in each stage change gradually. For that reason, at least the transistors 43, 46, and 49 are preferably provided with a backgate as illustrated in FIG. 18. The potentials of the backgates of the transistors 43, 46, and 49 are controlled by the wiring 77 or the wiring 79 so that the threshold voltages of the transistors 43, 46, and 49 are 0 V or close to 0 V; thus, the change in potential of the output from the register in each stage can be suppressed.

Note that control of the threshold voltage with the backgate described above is performed in the range where output data of the shift register is obtained with sufficient accuracy or the range where accuracy capable of being corrected by an external circuit is obtained. Note that the external circuit is configured to add the total reduction amount of threshold voltage in the register of each stage to the potential of the wiring 92 (OUT2), for example.

Figure 5:
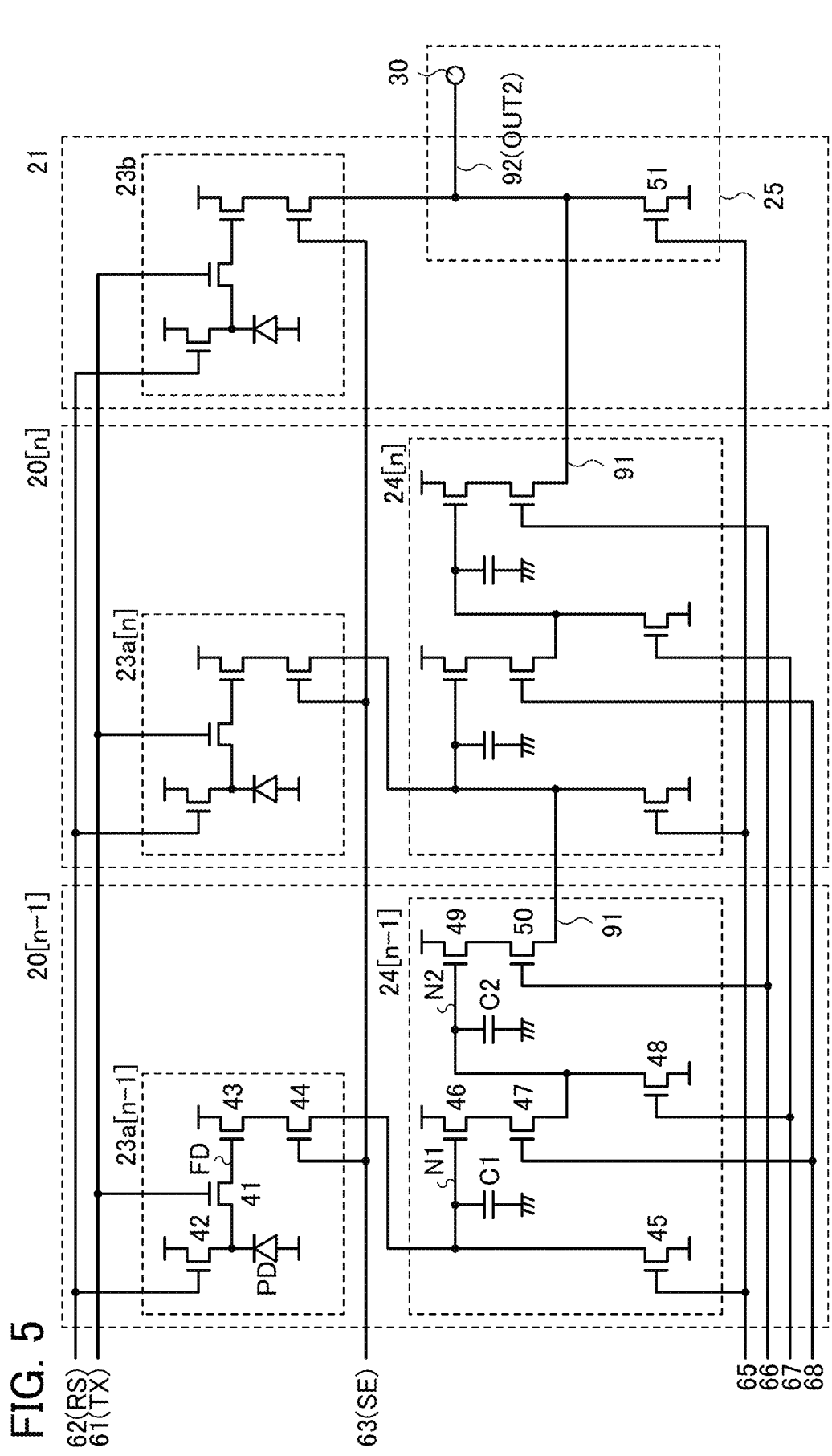
FIG. 5 is a circuit diagram illustrating pixels.

Next, a method for operating the pixel 20[n−1], the pixel 20[n], and the pixel 21 that are connected in this order through the wiring 91 (OUT1) as illustrated in FIG. 5 will be described in detail with reference to a timing chart in FIG. 6. Note that a similar method can be employed to operate a larger number of pixels 20.

Figure 6:
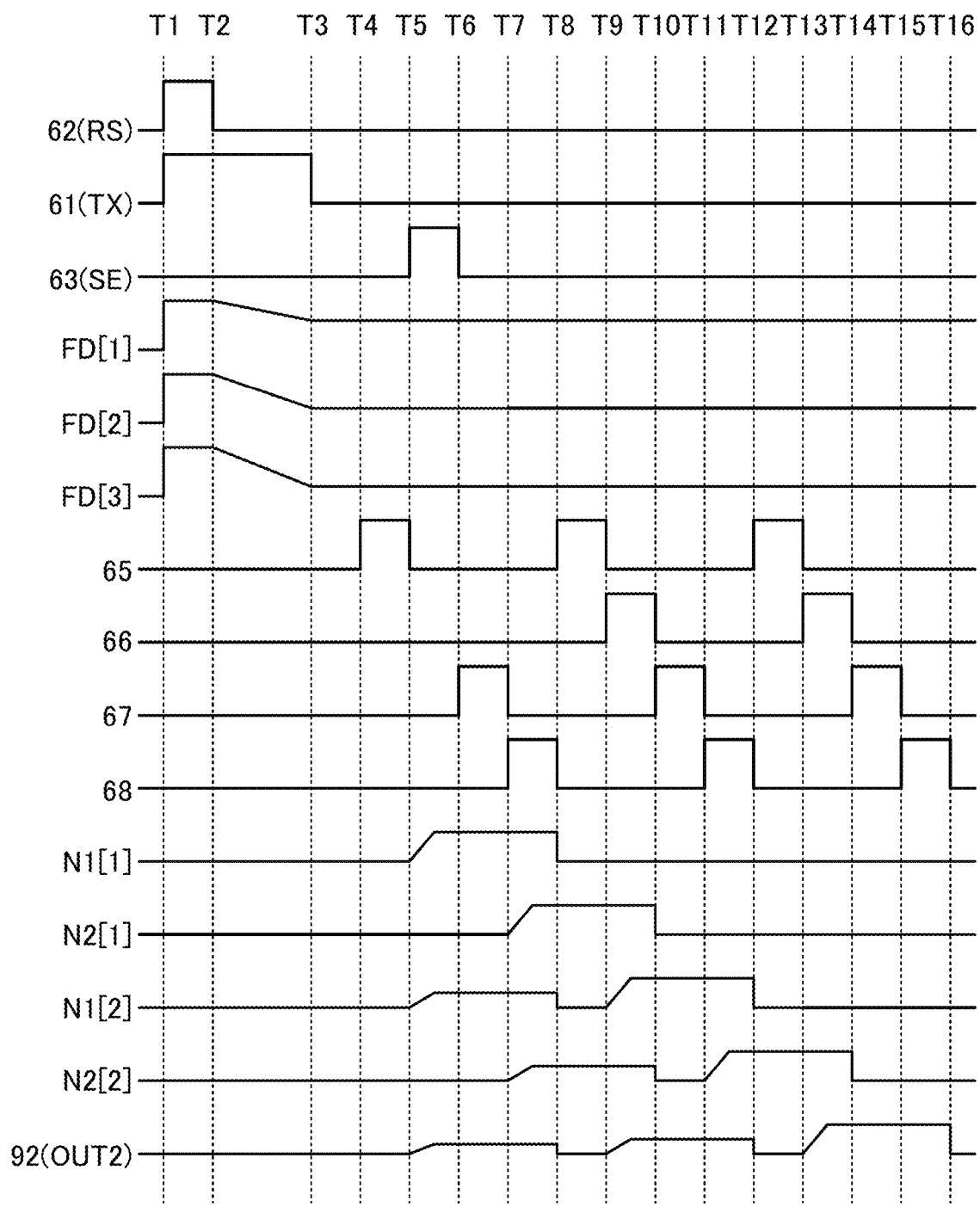
FIG. 6 is a timing chart illustrating operation of pixels.

In FIG. 6, a period from times T1 to T3 is an imaging period, and a period from times T4 to T16 is a data output period. Note that the node FD in the pixel 20[n−1] is shown as FD[1], the node FD in the pixel 20[n] as FD[2], and the node FD in the pixel 21 as FD[3]. Moreover, the node N1 and the node N2 in the pixel 20[n−1] are shown as N1[1] and N2[1], and those in the pixel 20[n] are shown as N1[2] and N2[2]. In the following description, "H" and "L" mean a high potential and a low potential, respectively.

From the time T1 to the time T2, the potential of the wiring 62 (RS) is set to "H" and the potential of the wiring 61 (TX) is set to "H," whereby the potential of the node FD is reset to "H" in the pixel circuits 23a[n−1], 23a[n], and 23b.

From the time T2 to the time T3, the potential of the wiring 62 (RS) is set to "L" and the potential of the wiring 61 (TX) is set to "H," so that charge corresponding to the intensity of light incident on the photoelectric conversion element PD is accumulated at each of the nodes FD. This corresponds to obtainment of imaging data in each pixel circuit. In each of the pixel circuits illustrated in FIG. 5, the potential of the node FD becomes lower as the intensity of light becomes higher.

From the time T4 to the time T5, the potential of the wiring 65 is set to "H," whereby the potentials of the node N1[1], the node N1[2], and the wiring 92 (OUT2) are reset to "L."

From the time T5 to the time T6, the potential of the wiring 63 (SE) is set to "H," whereby the potential of the node N1[1] is set to that of the node FD[1] and the potential of the node N1[2] is set to that of the node FD[2]. Moreover, the potential of the wiring 92 (OUT2) is set to that of the node FD[3]. In other words, imaging data obtained in the pixel circuit 23b is output to the terminal 30.

From the time T6 to the time T7, the potential of the wiring 67 is set to "H," so that the potentials of the node N2[1] and the node N2[2] are reset to "L."

From the time T7 to the time T8, the potential of the wiring 68 is set to "H"; hence, the potential of the node N2[1] is set to that of the node N1[1], and the potential of the node N2[2] is set to that of the node N1[2]. That is, the potential of the node N2[1] is set to that of the node FD[1], and the potential of the node N2[2] is set to that of the node FD[2].

From the time T8 to the time T9, by setting the potential of the wiring 65 to "H," the potentials of the node N1[1], the node N1[2], and the wiring 92 (OUT2) are reset to From the time T9 to the time T10, the potential of the wiring 66 is set to "H," whereby the potential of the node N1[2] is set to that of the node N2[1] and the potential of the wiring 92 (OUT2) is set to that of the node N2[2]. That is, the potential of the node N1[2] is set to that of the node FD[1], and the potential of the wiring 92 (OUT2) is set to that of the node FD[2]. In other words, imaging data obtained in the pixel circuit 23a[n] is output to the terminal 30.

From the time T10 to the time T11, by setting the wiring 67 to "H," the potentials of the node N2[1] and the node N2[2] are reset to "L."

From the time T11 to the time T12, the potential of the wiring 68 is set to "H," whereby the potential of the node N2[1] is set to that of the node N1[1] and the potential of the node N2[2] is set to that of the node N1[2]. That is, the potential of the node N2[1] is set to "L" (remains unchanged) and the potential of the node N2[2] is set to that of the node FD[1].

From the time T12 to the time T13, by setting the potential of the wiring 65 to "H," the potentials of the node N1[1], node N1[2], and the wiring 92 (OUT2) are reset to "L."

From the time T13 to the time T14, the potential of the wiring 66 is set to "H," whereby the potential of the node N1[2] is set to that of the node N2[1] and the potential of the wiring 92 (OUT2) is set to that of the node N2[2]. That is, the potential of the node N1[2] is set to "L" (remains unchanged) and the potential of the wiring 92 (OUT2) is set to that of the node FD[1]. In other words, imaging data obtained in the pixel circuit 23a[n−1] is output to the terminal 30.

In the above manner, imaging data obtained in the pixel circuits 23a[n−1], 23a[n], and 23b are sequentially output from the shift register that consists of the circuits 24 and 25. Since analog data is output to the terminal 30, the data can be subjected to processing (e.g., converted into digital data by an A/D converter) in accordance with a structure of a semiconductor device connected outside the imaging element 10.

Note that in the imaging element 10 of one embodiment of the present invention, control signals input to each pixel circuit are not necessary while the pixel circuits obtain imaging data and output the imaging data. In other words, a circuit for selecting a certain row or column is not required.

Figure 7:
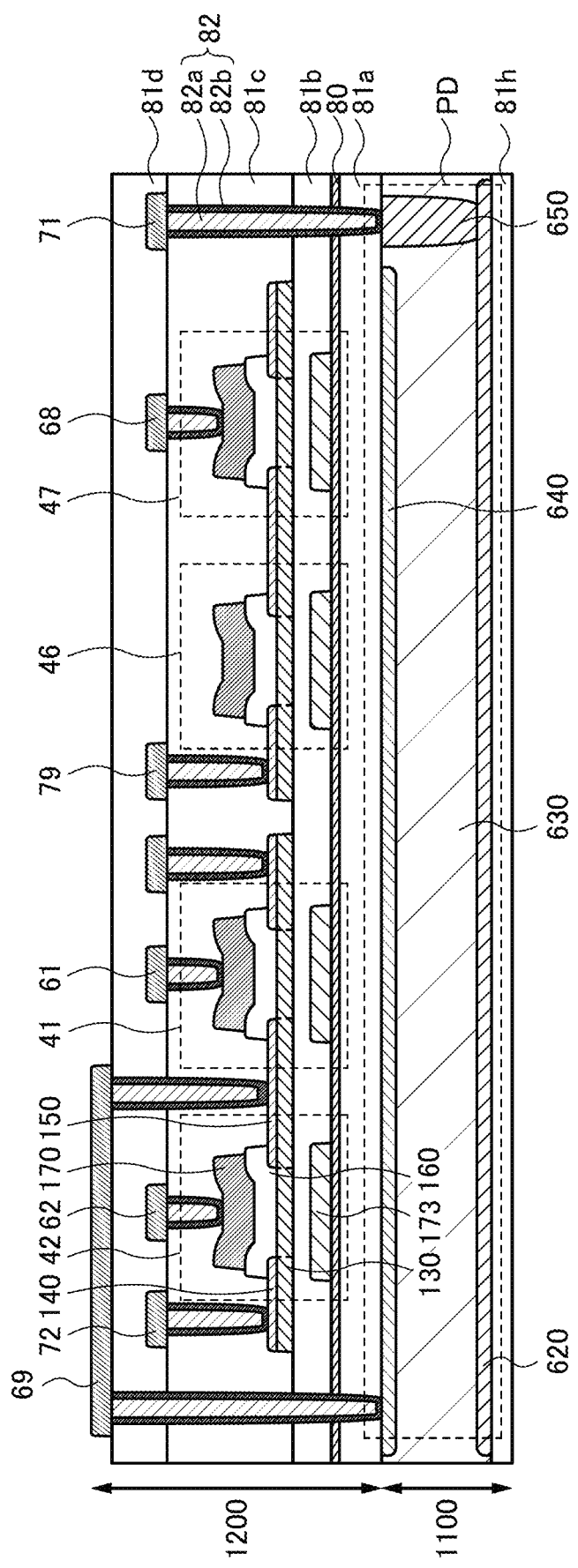
FIG. 7 is a cross-sectional view illustrating a structure of an imaging device.

FIG. 7 illustrates an example of a specific structure of the pixel 20 and is a cross-sectional view in the channel length direction of the transistors 41 and 42 included in the pixel circuit 23a and the transistors 46 and 47 included in the circuit 24.

Although wirings, electrodes, metal layers, and contact plugs (conductors 82) are shown as independent components in cross-sectional views in this embodiment, some of them are provided as one component in some cases when they are electrically connected to each other. In addition, a structure in which components such as wirings, electrodes, and metal layers are connected to each other through the conductors 82 is only an example, and the components may be directly connected to each other not through the conductor 82.

Insulating layers 81a to 81g and the like that function as protective films, interlayer insulating films, or planarization films are provided over a substrate and components such as transistors. For example, an inorganic insulating film such as a silicon oxide film or a silicon oxynitride film can be used as the insulating layers 81a to 81g. Alternatively, an organic insulating film such as an acrylic resin film or a polyimide resin film may be used. Top surfaces of the insulating layers 81a to 81g and the like may be subjected to planarization treatment as necessary by chemical mechanical polishing (CMP) or the like.

In some cases, some of wirings, transistors, and the like illustrated in drawings are not provided, or a wiring, a transistor, or the like that is not illustrated in drawings is included in each layer.

As illustrated in FIG. 7, the pixel 20 can include a layer 1100 and a layer 1200. Similarly, the pixel 21 can include the layer 1100 and the layer 1200.

The layer 1100 can include the photoelectric conversion element PD. A photodiode with two terminals can be used for the photoelectric conversion element PD, for example. The photodiode can be a PN photodiode using a single crystal silicon substrate, a PIN photodiode using an amorphous silicon thin film, a microcrystalline silicon thin film, or a polycrystalline silicon thin film, or a photodiode using selenium, a selenium compound, or an organic compound, for example.

In FIG. 7, the photoelectric conversion element PD included in the layer 1100 is a PN photodiode using a single crystal silicon substrate. The photoelectric conversion element PD can include a $p^+$ region 620, a $p^-$ region 630, an n-type region 640, and a $p^+$ region 650.

The layer 1200 can include OS transistors that constitute the pixel circuit 23a and the circuit 24; FIG. 7 illustrates the transistors 41 and 42 included in the pixel circuit 23a and the transistors 46 and 47 included in the circuit 24. As shown in FIG. 7, the pixel circuit 23a and the circuit 24 can overlap the photoelectric conversion element PD; thus, the area where the photoelectric conversion element PD receives light can be widened.

An insulating layer 80 is provided between a region including OS transistors and a region including Si devices (e.g., Si transistors or Si photodiodes).

An insulating layer provided near a Si device preferably contains hydrogen to terminate dangling bonds of silicon. Meanwhile, hydrogen in an insulating layer provided near an oxide semiconductor layer that is the active layer of the transistors 41, 42, and the like causes generation of carriers in the oxide semiconductor layer. Thus, the hydrogen might reduce the reliability of the transistors 41, 42, and the like. For this reason, the insulating layer 80 that has a function of preventing diffusion of hydrogen is preferably provided between one layer including the Si device and another layer that includes the OS transistors and is stacked over the one layer. Diffusion of hydrogen can be prevented by the insulating layer 80; thus, reliability of both the Si device and the OS transistors can be improved.

The insulating layer 80 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example.

One electrode (the n-type region 640) of the photoelectric conversion element PD can be electrically connected to the transistor 41 and the transistor 42 through two conductors 82 and a wiring 69, for example.

Here, the conductor 82 is provided to penetrate the insulating layer 80; hence, the conductor 82 also preferably has a function of preventing diffusion of hydrogen. For example, the conductor 82 has the following structure illustrated in FIG. 7: a conductor 82b with a barrier property against hydrogen is provided at least on the outer side in contact with a sidewall of the opening, and a conductor 82a with low resistance is provided on the inner side. For instance, tungsten can be used for the conductor 82a, and tantalum nitride or the like can be used for the conductor 82b. Note that the conductor 82 can also be formed only of the conductor 82a. When a layer containing impurities such as hydrogen is not in contact with the conductor 82, the conductor 82 may be formed only of the conductor 82b.

In FIG. 7, top-gate OS transistors are provided in the layer 1200. For example, each of the OS transistors is provided over a stack including insulating layers (the insulating layers 81a, 80, and 81b) formed over the layer 1100, and includes an oxide semiconductor layer 130, conductive layers 140 and 150 serving as a source electrode and a drain electrode, an insulating layer 160 serving as a gate insulating layer, and a conductive layer 170 serving as a gate electrode. Note that the insulating layer 81b can also have a function of a gate insulating layer.

FIG. 7 illustrates an example of a structure where the OS transistor is provided with a conductive layer 173 serving as a backgate electrode. In the structure of FIG. 7, a backgate electrode that doubles as a light-blocking layer is preferably provided because light that passes through the layer 1100 might change the electrical characteristics of the transistor. Moreover, providing the backgate enables control of the threshold voltage and the like of the OS transistor.

Figure 8:
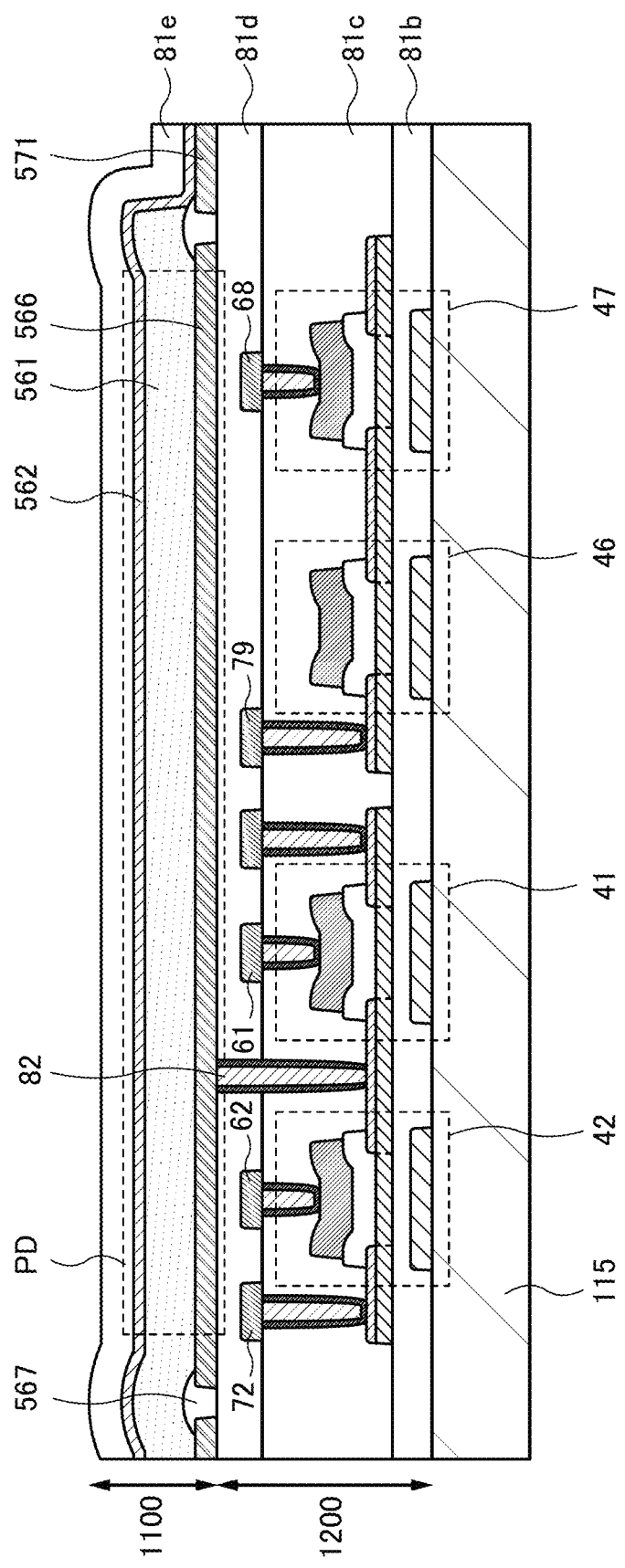
FIG. 8 is a cross-sectional view illustrating a structure of an imaging device.

Alternatively, the pixel 20 can employ a stacked structure illustrated in FIG. 8. In the pixel 20 in FIG. 8, the layer 1200 and the layer 1100 are provided over a substrate 115. The photoelectric conversion element PD is provided over OS transistors, which facilitates electrical connection between the OS transistors and one electrode of the photoelectric conversion element PD.

FIG. 8 illustrates the photoelectric conversion element PD using a selenium-based material for a photoelectric conversion layer 561. The photoelectric conversion element PD containing a selenium-based material has high external quantum efficiency with respect to visible light. Furthermore, a selenium-based material has a high light-absorption coefficient, making the photoelectric conversion layer 561 thin easily. The photoelectric conversion element PD containing a selenium-based material can be a highly sensitive sensor in which the amount of amplification of signals is large because of avalanche multiplication. In other words, the use of a selenium-based material for the photoelectric conversion layer 561 allows a sufficient amount of photocurrent to be obtained even when the pixel area is reduced. Thus, the photoelectric conversion element PD containing a selenium-based material is also suitable for imaging in a low-illuminance environment.

As a selenium-based material, amorphous selenium or crystalline selenium can be used. Crystalline selenium can be obtained, for example, by depositing amorphous selenium and then performing heat treatment. When the crystal grain size of crystalline selenium is smaller than a pixel pitch, variations in characteristics between pixels can be reduced. Moreover, crystalline selenium has higher spectral sensitivity and light-absorption coefficient for visible light than those of amorphous selenium.

Figure 9A:
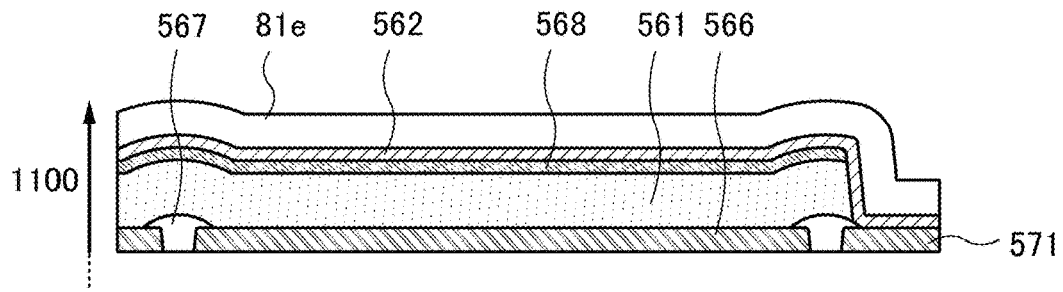
FIGS. 9A to 9E are cross-sectional views illustrating a connection example of a photoelectric conversion element.
Figure 9B:
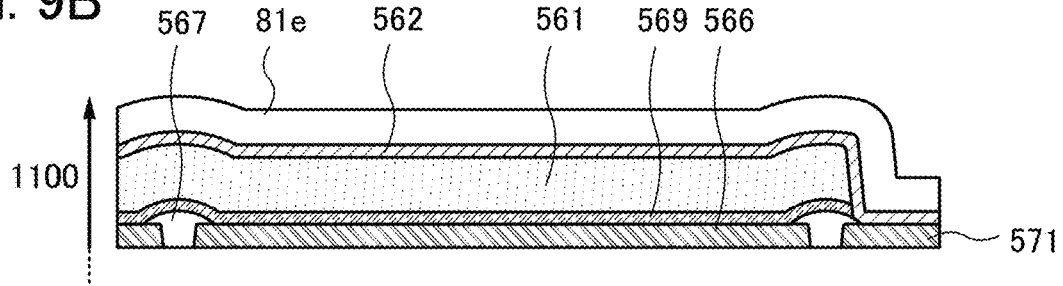
Figure 9C:
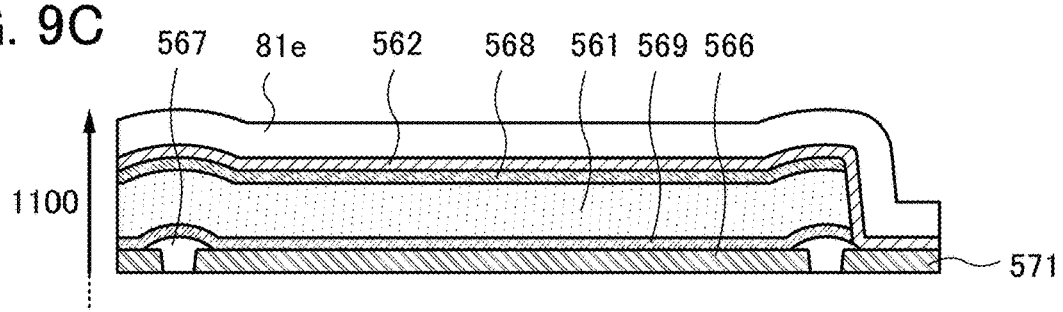

Although the photoelectric conversion layer 561 is a single layer in FIG. 8, a layer of gallium oxide, cerium oxide, In—Ga—Zn oxide, or the like may be provided as a hole-injection blocking layer 568 on a light-receiving surface side as illustrated in FIG. 9A. Alternatively, as illustrated in FIG. 9B, a layer of nickel oxide, antimony sulfide, or the like may be provided as an electron-injection blocking layer 569 on an electrode 566 side. Further alternatively, the hole-injection blocking layer 568 and the electron-injection blocking layer 569 may be provided as illustrated in FIG. 9C.

The photoelectric conversion layer 561 may be a layer containing a compound of copper, indium, and selenium (CIS); or a layer containing a compound of copper, indium, gallium, and selenium (CIGS). The use of CIS or CIGS makes it possible to form a photoelectric conversion element that utilizes avalanche multiplication as in the case of using a single layer of selenium.

In the photoelectric conversion element PD using a selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

Figure 9D:
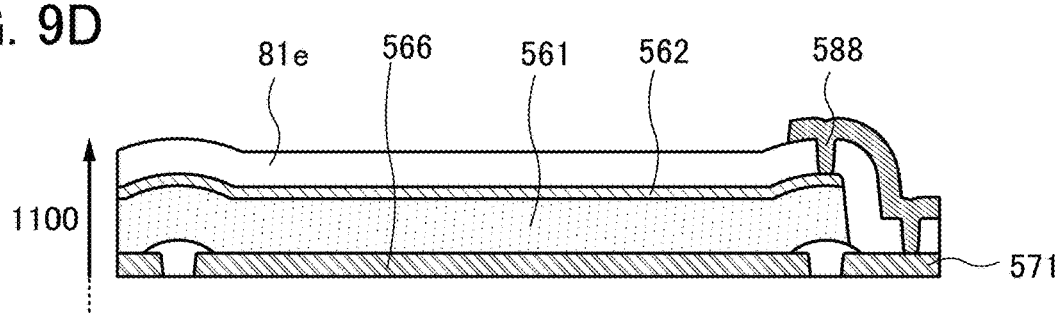
Figure 9E:
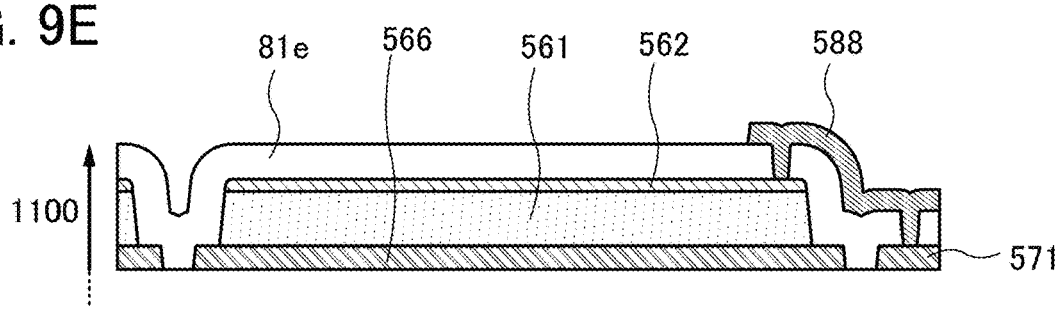
Figure 10A:
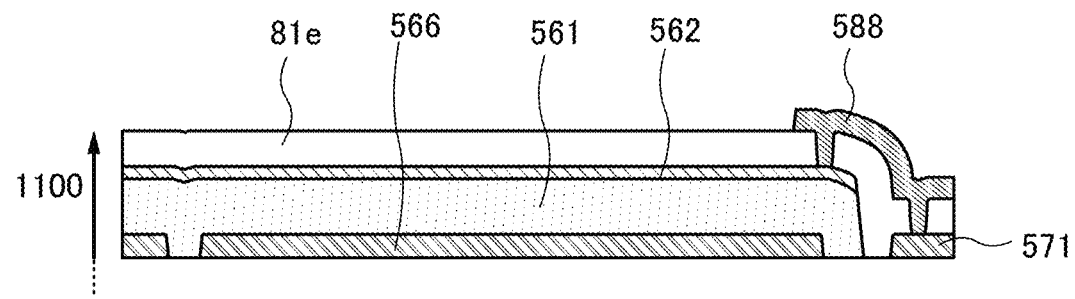
FIGS. 10A to 10D are cross-sectional views illustrating a connection example of a photoelectric conversion element.
Figure 10B:
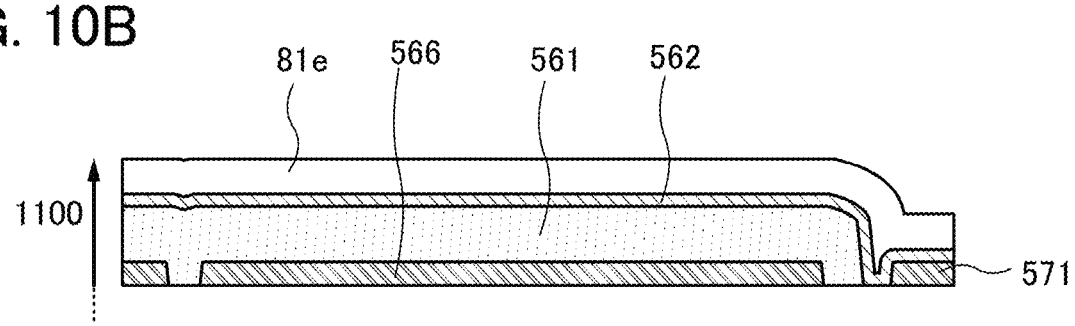

Although the light-transmitting conductive layer 562 is directly in contact with a wiring 571 in FIG. 8, they may be in contact with each other through a wiring 588 as illustrated in FIG. 9D. Although the photoelectric conversion layer 561 and the light-transmitting conductive layer 562 are not divided between pixel circuits in FIG. 8, they may be divided between circuits as illustrated in FIG. 9E. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 10A and 10B.

Figure 10C:
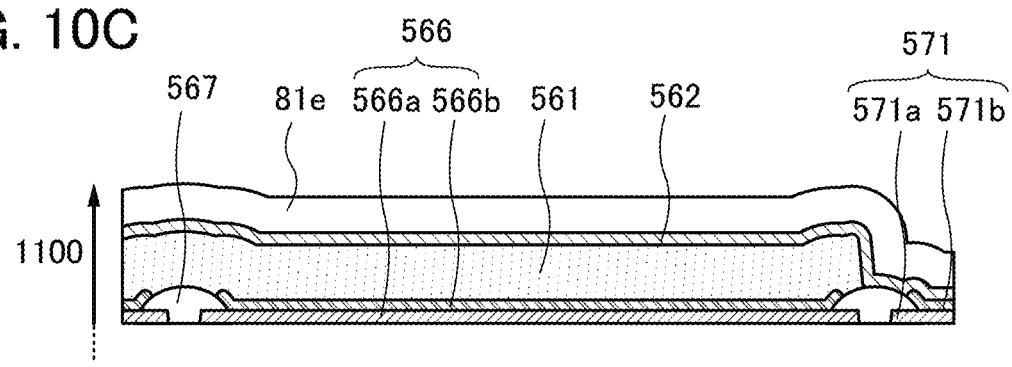

The electrode 566, the wiring 571, and the like may be a multilayer. For example, as illustrated in FIG. 10C, the electrode 566 can include two conductive layers 566a and 566b and the wiring 571 can include two conductive layers 571a and 571b. In the structure in FIG. 10C, it is preferred that, for example, the conductive layers 566a and 571a be made of a low-resistance metal or the like, and the conductive layers 566b and 571b be made of a metal or the like that exhibits an excellent contact property with the photoelectric conversion layer 561. Such a structure improves the electrical properties of the photoelectric conversion element PD. Note that some kinds of metal may cause electrochemical corrosion by being in contact with the light-transmitting conductive layer 562; even when such a metal is used for the conductive layer 571a, electrochemical corrosion can be prevented by the conductive layer 571b.

The conductive layers 566b and 571b can be formed using molybdenum or tungsten, for example. The conductive layers 566a and 571a can be formed using, for example, aluminum, titanium, or a stack of titanium, aluminum, and titanium that are stacked in this order.

Figure 10D:
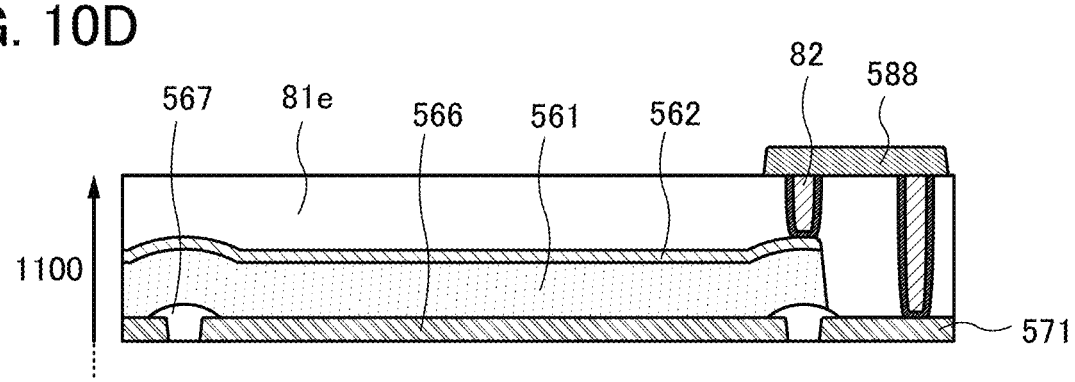

As illustrated in FIG. 10D, the light-transmitting conductive layer 562 may be connected to the wiring 571 through the conductor 82 and the wiring 588.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Figure 11:
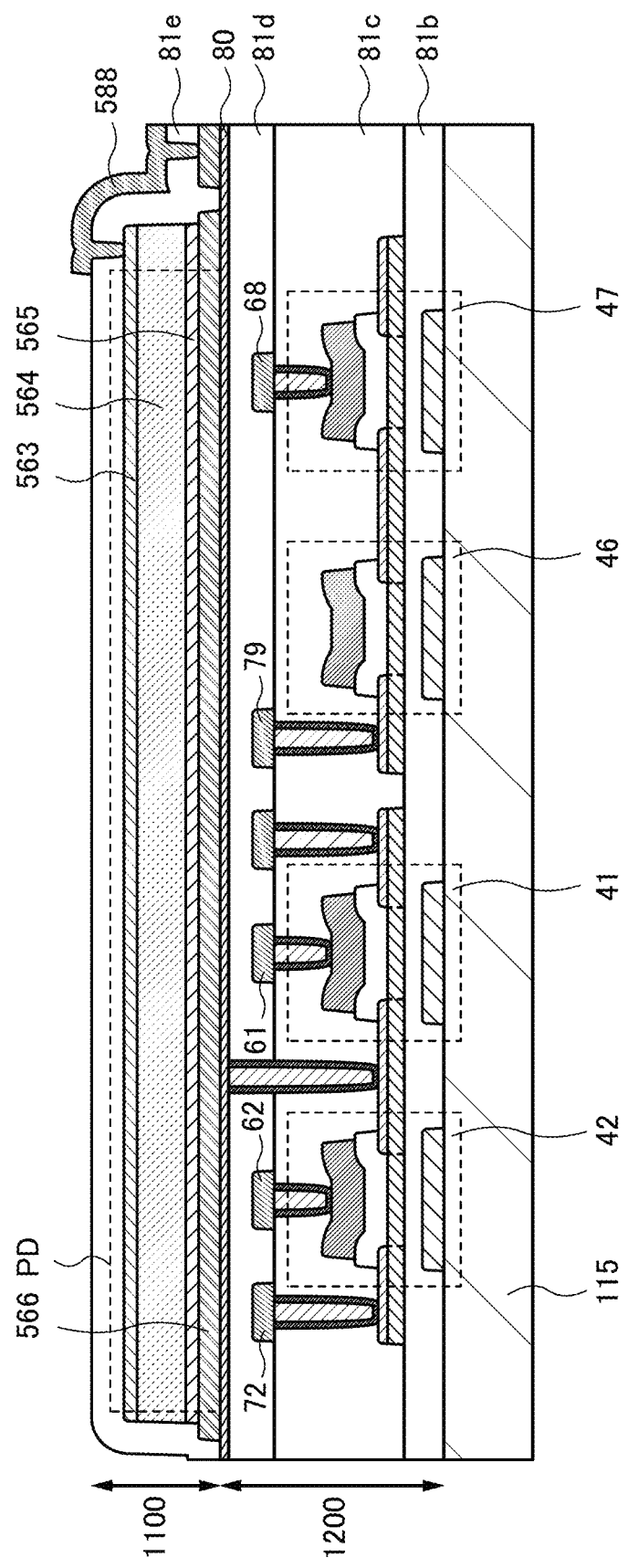
FIG. 11 is a cross-sectional view illustrating a structure of an imaging device.

Alternatively, the pixel 20 can employ a stacked structure illustrated in FIG. 11. The pixel 20 in FIG. 11 is different from the pixel 20 in FIG. 8 only in the structure of the layer 1100; the other structures are the same.

In FIG. 11, the photoelectric conversion element PD included in the layer 1100 is a PIN photodiode using an amorphous silicon film, a microcrystalline silicon film, or the like as a photoelectric conversion layer. The photoelectric conversion element PD can include an n-type semiconductor layer 565, an i-type semiconductor layer 564, a p-type semiconductor layer 563, the electrode 566, the wiring 571, and the wiring 588.

The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

Figure 12A:
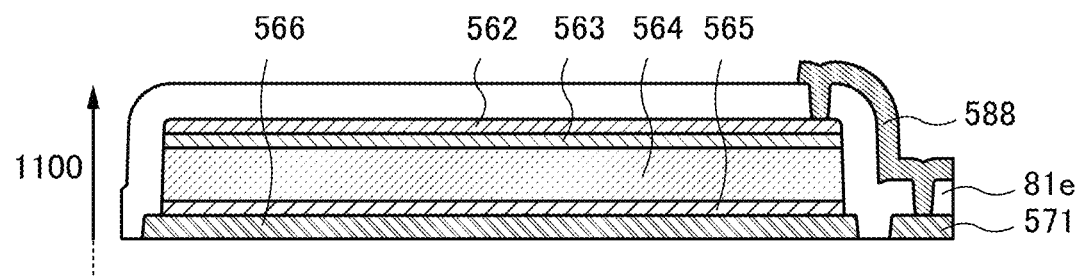
FIGS. 12A to 12C are cross-sectional views illustrating a connection example of a photoelectric conversion element.
Figure 12B:
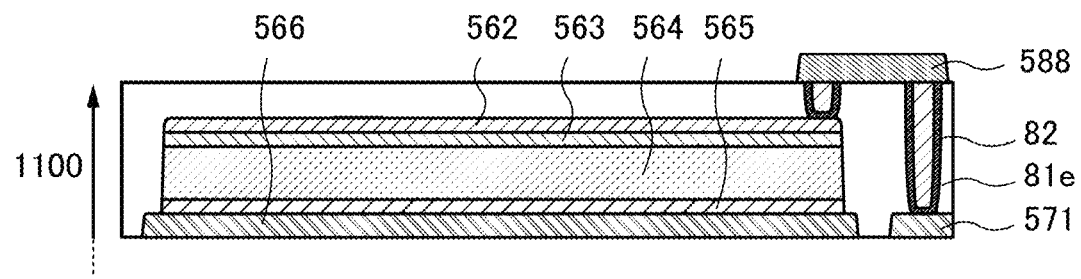
Figure 12C:
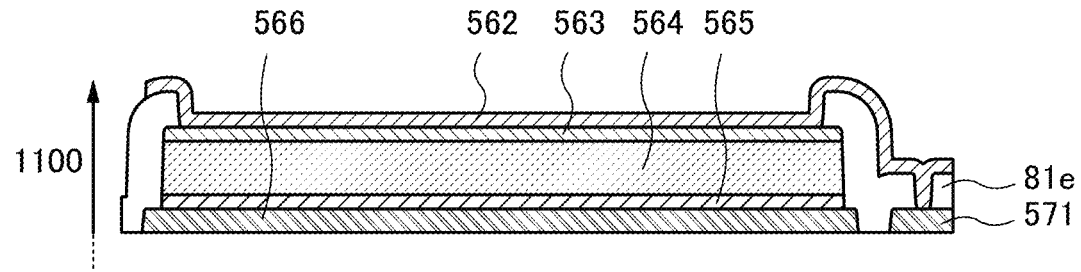

FIGS. 12A to 12C show other examples of the structure of the photoelectric conversion element PD having a structure of a PIN thin film photodiode and the connection between the photoelectric conversion element PD and the wirings. Note that the structure of the photoelectric conversion element PD and the connection between the photoelectric conversion element PD and the wirings are not limited thereto, and other structures may be employed.

In FIG. 12A, the photoelectric conversion element PD includes the light-transmitting conductive layer 562 in contact with the p-type semiconductor layer 563. The light-transmitting conductive layer 562 serves as an electrode and can increase the output current of the photoelectric conversion element PD.

The light-transmitting conductive layer 562 can be formed using, for example, indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, or graphene oxide. The light-transmitting conductive layer 562 is not limited to a single layer and may be a stack of different films.

In FIG. 12B, the light-transmitting conductive layer 562 and the wiring 571 are connected to each other through the conductor 82 and the wiring 588. Note that the p-type semiconductor layer 563 of the photoelectric conversion element PD and the wiring 571 can be connected to each other through the conductor 82 and the wiring 588. In the structure of FIG. 12B, the light-transmitting conductive layer 562 is not necessarily provided.

In FIG. 12C, an opening that exposes the p-type semiconductor layer 563 is provided in the insulating layer 81*e* covering the photoelectric conversion element PD, and the light-transmitting conductive layer 562 covering the opening is electrically connected to the wiring 571.

The photoelectric conversion element PD containing the selenium-based material, amorphous silicon, or the like can be manufactured through general semiconductor manufacturing processes such as a deposition process, a lithography process, and an etching process. Since the resistance of the selenium-based material is high, the photoelectric conversion layer 561 does not need to be divided between circuits as illustrated in FIG. 8. Thus, the photoelectric conversion element PD can be manufactured with a high yield at low cost.

Figure 13:
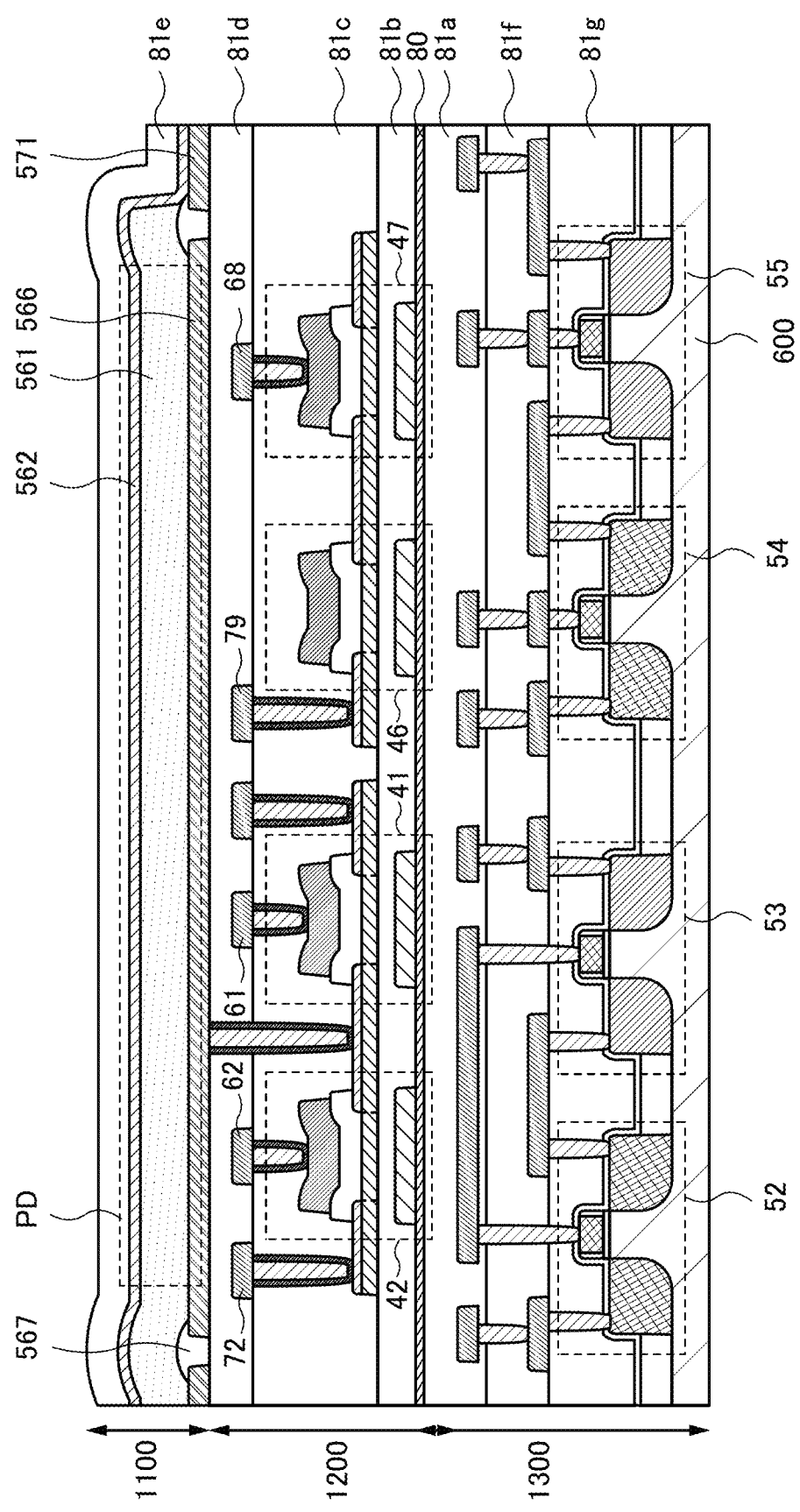
FIG. 13 is a cross-sectional view illustrating a structure of an imaging device.

Alternatively, the pixel 20 can employ a stacked structure illustrated in FIG. 13. In the pixel 20 in FIG. 13, the layer 1200 and the layer 1100 are provided over a layer 1300. In the layer 1300, a data converter circuit such as an A/D converter, a buffer circuit, and a control circuit for the entire imaging device can be provided, for example.

Figure 14A:
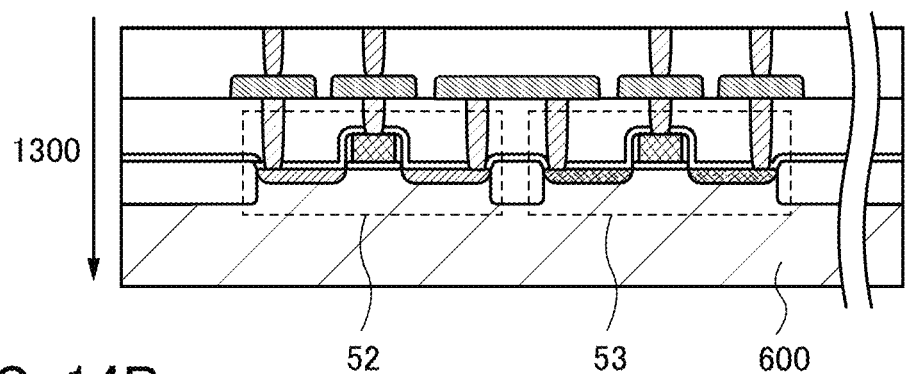
FIGS. 14A and 14B are cross-sectional views each illustrating a structure of an imaging device.
Figure 14B:
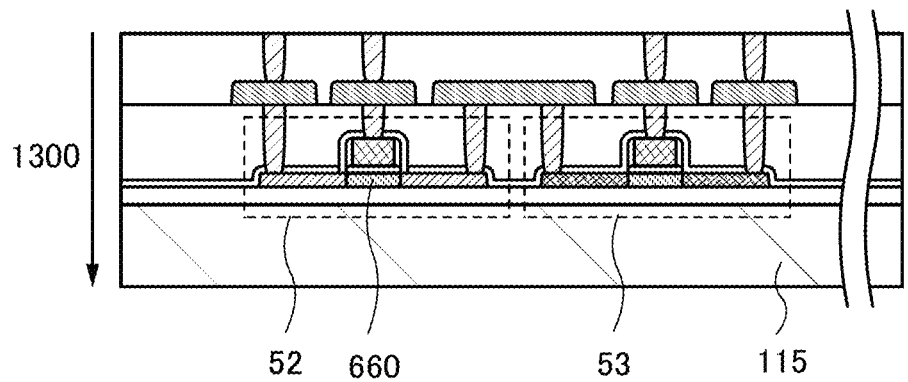

The layer 1300 can include Si transistors (e.g., transistors 52 to 55). Although FIG. 13 illustrates an example of FIN-type transistors 52 to 55 provided on a silicon substrate 600, the transistors 52 to 55 may be planar transistors as illustrated in FIG. 14A. Alternatively, transistors each including an active layer 660 of a silicon thin film may be used as illustrated in FIG. 14B. The active layer 660 can be polycrystalline silicon or single crystal silicon of a silicon-on-insulator (SOI) structure.

FIG. 13 illustrates the structure obtained by adding the layer 1300 to the structure shown in FIG. 8; it is also possible to add the layer 1300 to the structure shown in FIG. 11.

Figure 15:
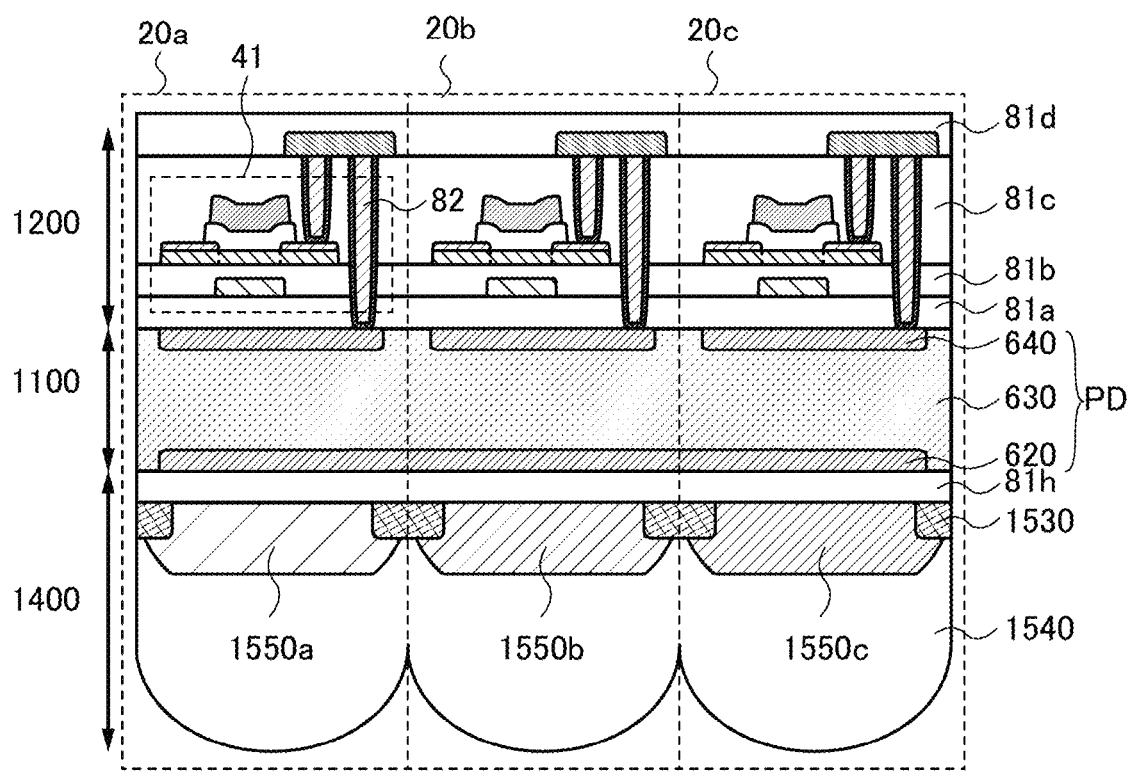
FIG. 15 is a cross-sectional view illustrating a structure of an imaging device.

FIG. 15 is a cross-sectional view of a structure obtained by adding a layer 1400 to the structure shown in FIG. 7, and illustrates three pixels (pixels 20*a*, 20*b*, and 20*c*).

In the layer 1400, a light-blocking layer 1530, optical conversion layers 1550*a*, 1550*b*, and 1550*c*, a microlens array 1540, and the like can be provided.

An insulating layer 81*h* is formed in a region in contact with the layer 1100. As the insulating layer 81*h*, a silicon oxide film with a high visible-light transmitting property can be used, for example. In addition, a silicon nitride film may be stacked as a passivation film. A dielectric film of hafnium oxide or the like may be stacked as an anti-reflection film.

The light-blocking layer 1530 can be provided on the insulating layer 81*h*. The light-blocking layer 1530 is provided at a boundary between adjacent pixels and has a function of blocking stray light that enters from oblique directions. The light-blocking layer 1530 can be formed of a metal layer of aluminum, tungsten, or the like, or a stack including the metal layer and a dielectric film functioning as an anti-reflection film.

The optical conversion layers 1550*a* to 1550*c* can be provided on the insulating layer 81*h* and the light-blocking layer 1530. Color images are obtained, for example, when color filters of red (R), green (G), blue (B), yellow (Y), cyan (C), magenta (M), and/or the like are assigned to the optical conversion layers 1550*a* to 1550*c*.

Note that when a filter that blocks light with a wavelength shorter than or equal to that of visible light is used as the optical conversion layer, an infrared imaging device is obtained. When a filter that blocks light with a wavelength shorter than or equal to that of near infrared light is used as the optical conversion layer, a far-infrared imaging device is obtained. When a filter that blocks light with a wavelength longer than or equal to that of visible light is used as the optical conversion layer, an ultraviolet imaging device is obtained.

When a scintillator is used as the optical conversion layer, it is possible to obtain an imaging device that takes an image visualizing the intensity of radiation and is used for an X-ray imaging device or the like. Radiations such as X-rays that pass through an object to enter a scintillator are converted into light (fluorescence) such as visible light or ultraviolet light owing to photoluminescence. Then, the photoelectric conversion element PD detects the light to obtain image data. Moreover, the imaging device having the above structure may be used in a radiation detector or the like.

A scintillator contains a substance that, when irradiated with radiation such as X-rays or gamma rays, absorbs energy of the radiation to emit visible light or ultraviolet light. For example, it is possible to use a resin or ceramics in which any of $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$ is dispersed.

The microlens array 1540 can be provided on the optical conversion layers 1550*a* to 1550*c*. Light that passes through lenses of the microlens array 1540 passes the optical conversion layers 1550*a* to 1550*c* that are placed directly on the microlens array 1540, and is applied to the photoelectric conversion element PD.

Figure 17A:
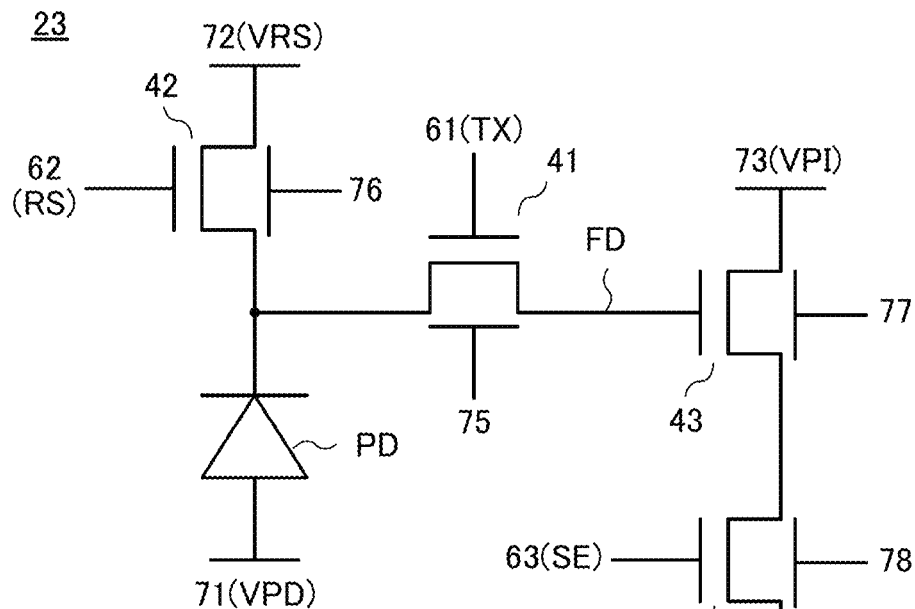
FIGS. 17A to 17C are circuit diagrams each illustrating a pixel.

The transistors 41 to 44 used in the pixel circuits 23*a* and 23*b* may have a backgate as illustrated in FIG. 17A. FIG. 17A illustrates a structure where a constant potential is applied to the backgate, which enables control of the threshold voltage.

Figure 17B:
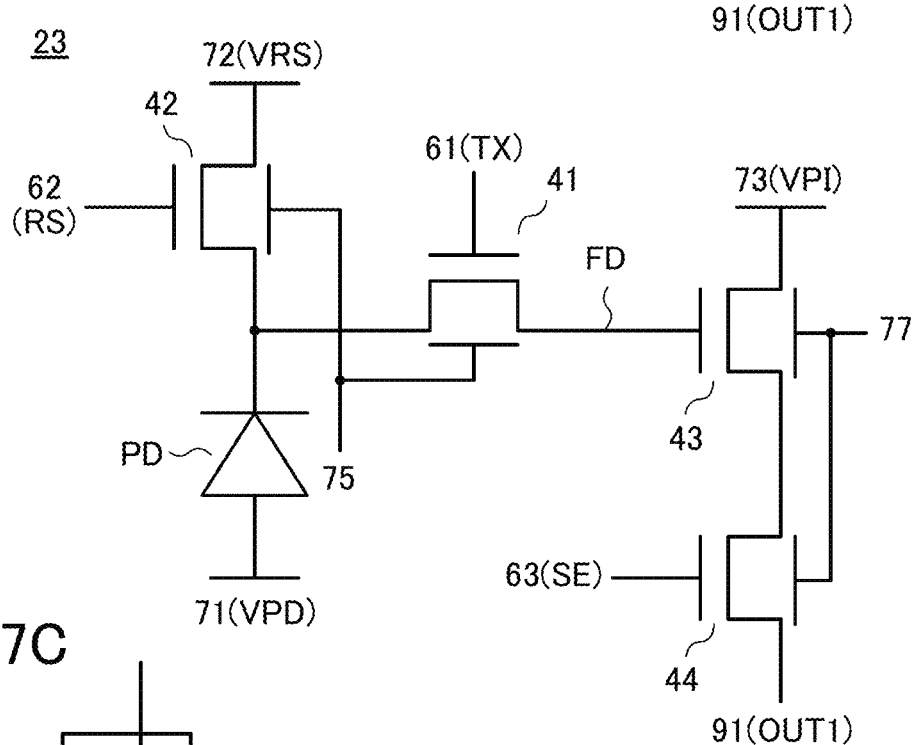

Wirings 75 to 78 connected to the respective backgates can be supplied with a different potential separately. Alternatively, as illustrated in FIG. 17B, the wirings connected to the backgates of the transistors 41 and 42 may be electrically connected to each other, and the wirings connected to the backgates of the transistors 43 and 44 may be electrically connected to each other.

In an n-channel transistor, the threshold voltage is shifted in the positive direction when a potential lower than a source potential is applied to the backgate. In contrast, the threshold voltage is shifted in the negative direction when a potential higher than a source potential is applied to the backgate. Accordingly, in the case where the on/off state of each transistor is controlled with a predetermined gate voltage, the off-state current can be reduced when a potential lower than a source potential is supplied to a backgate, and the on-state current can be reduced when a potential higher than a source potential is supplied to the backgate.

It is preferred that the node FD in the pixel circuits 23*a* and 23*b* be highly capable of retaining a potential; thus, OS transistors with a low off-state current are preferably used as the transistors 41 and 42 as described above. When a potential lower than a source potential is supplied to the backgates of the transistors 41 and 42, the off-state current can be further reduced; thus, the potential retention capability of the node FD can be enhanced.

As described above, transistors with a high on-state current are preferably used as the transistors 43 and 44. The on-state current can be further increased when a potential higher than a source potential is supplied to the backgates of the transistors 43 and 44. Thus, a reading potential output to the wiring 91 (OUT1) can be determined quickly, that is, the imaging device can operate at high frequency.

Figure 17C:

Note that the same potential may be supplied to a front gate and the backgate of the transistor 44 as illustrated in FIG. 17C.

To improve data retention capability, the transistors included in the circuit 24 and the circuit 25 may be provided with a backgate.

In addition to power supply potentials, a plurality of potentials such as a signal potential and a potential applied to the backgate are used inside an imaging device. Supply of a plurality of potentials from the outside of an imaging device increases the number of terminals; thus, an imaging device preferably has a power supply circuit generating a plurality of potentials inside the imaging device.

Figure 19A:
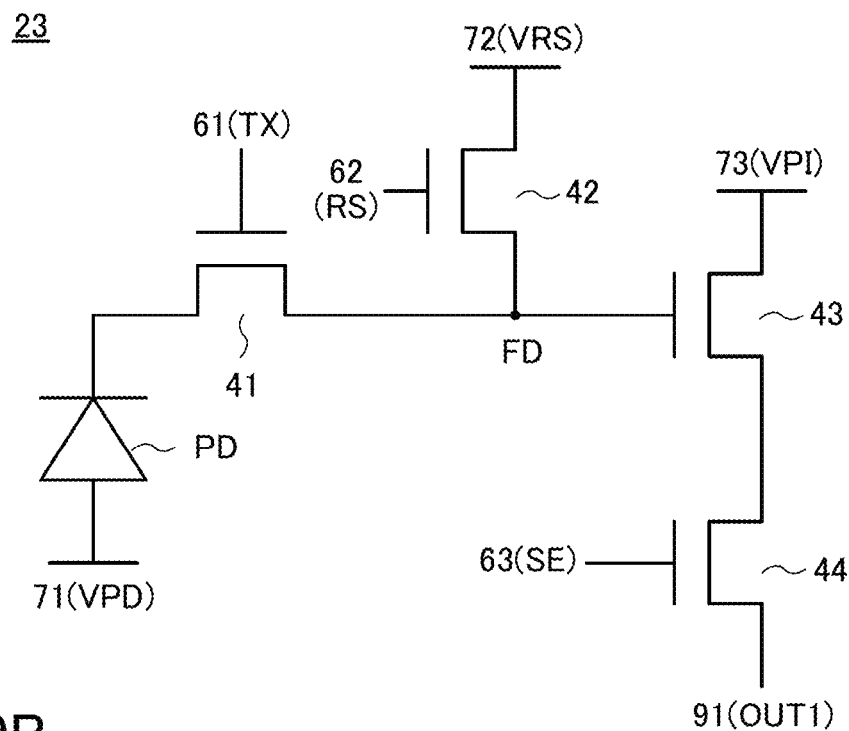
FIGS. 19A and 19B are circuit diagrams each illustrating a pixel.

The transistors used in the pixel circuits 23a and 23b may be arranged such that one of the source and the drain of the transistor 42 is electrically connected to the gate of the transistor 43 as illustrated in FIG. 19A.

Figure 19B:
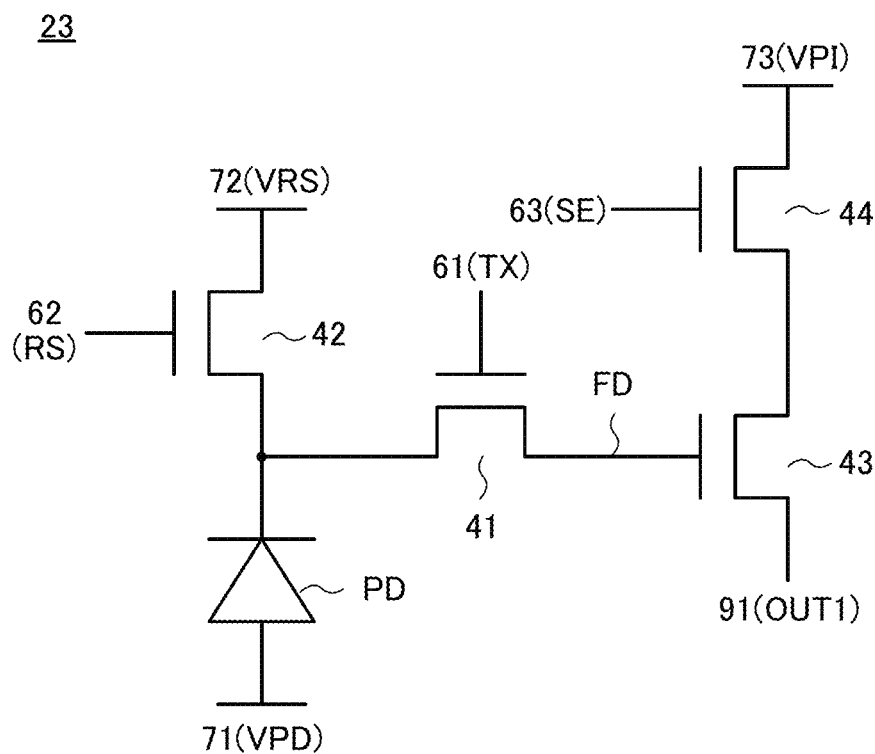

Alternatively, the transistors used in the pixel circuits 23a and 23b may be arranged such that the transistor 44 is electrically connected between the other of the source and the drain of the transistor 43 and the wiring 73 (VPI) as illustrated in FIG. 19B.

Figure 20A:
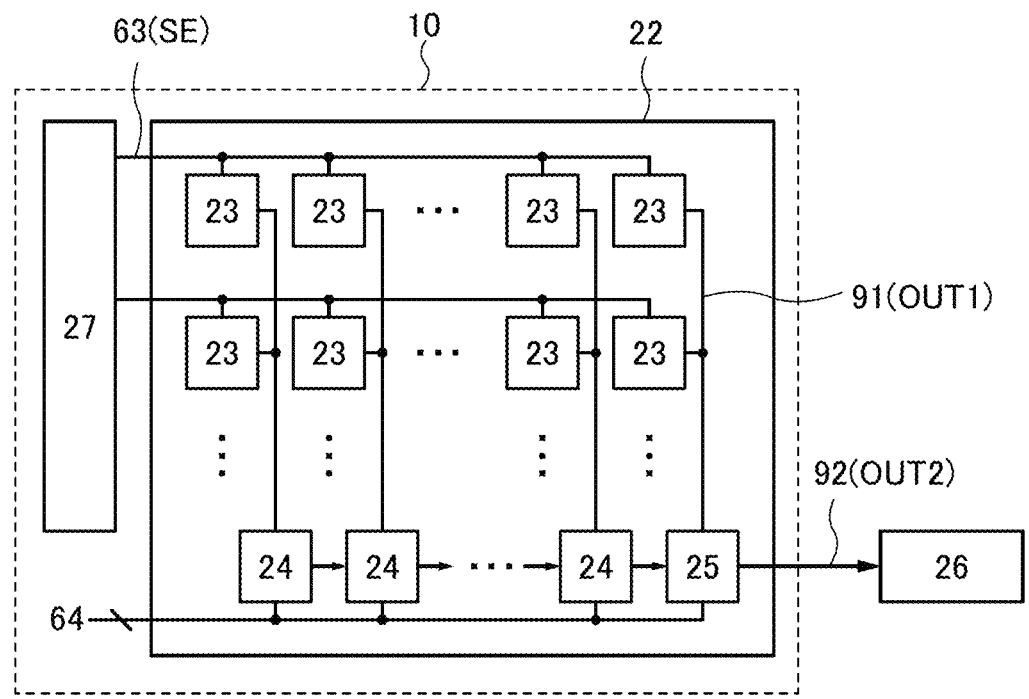
FIGS. 20A and 20B are block diagrams each illustrating an imaging element.

In the imaging element 10 of one embodiment of the present invention, the pixel circuits 23 may be arranged in a matrix and the circuits 24 and the circuit 25 that are connected to the pixel circuits 23 may be provided at a first end portion of the imaging element 10, as in a block diagram of FIG. 20A. In this structure, a circuit 27 with a function of selecting a row of pixels is provided, and a signal of the pixel circuit 23 selected by the circuit 27 is output to the circuit 24 or the circuit 25. The signal output to the circuit 24 or the circuit 25 is then output to an external circuit such as the A/D converter 26 through the above operation.

Figure 20B:
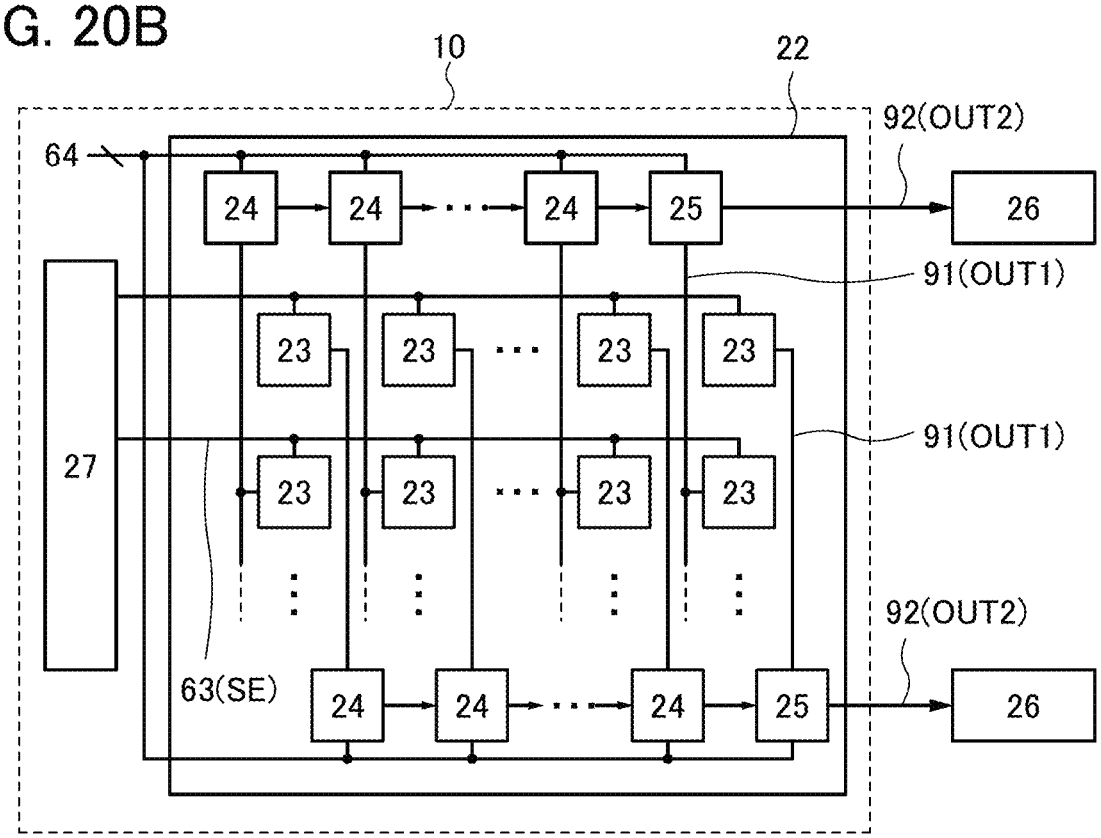

Alternatively, as illustrated in FIG. 20B, the circuits 24 and 25 may be provided at the first end portion and a second end portion opposite to the first end portion of the imaging element 10. In this structure, the circuits 24 and the circuit 25 provided at the first end portion can read signals of the pixel circuits 23 in odd-numbered stages, and the circuits 24 and the circuit 25 provided at the second end portion can read signals of the pixel circuits 23 in even-numbered stages, for example. Such a structure enables signals to be output to the outside through two paths, and thus achieves faster signal reading than the structure in FIG. 19A.

The imaging element 10 of one embodiment of the present invention may have a structure illustrated in any of FIGS. 21A to 21D.

Figure 21A:
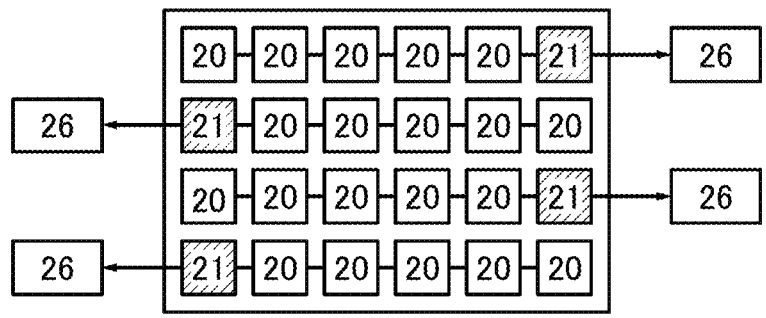
FIGS. 21A to 21D are block diagrams each illustrating an imaging element.

Although FIG. 1A illustrates the example where the direction of transferring signals in each row is the same, the direction of transferring signals may vary between rows as illustrated in FIG. 21A. In such a structure, the A/D converters 26 or terminals connected to the A/D converters 26 can be arranged evenly.

Figure 21B:
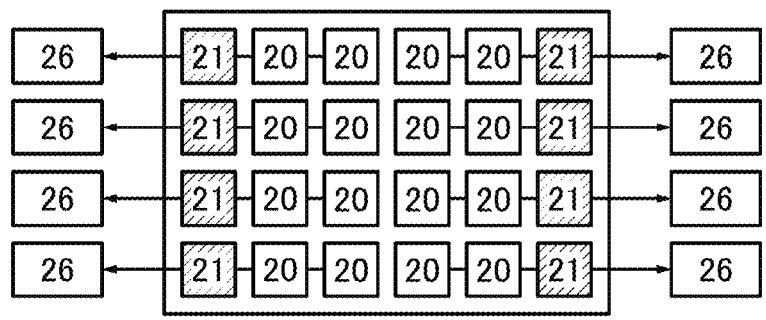

Alternatively, as illustrated in FIG. 21B, a row may be divided into two parts so that signals are transferred from the center toward end portions. This structure can increase the number of the A/D converters 26, resulting in faster signal reading.

Figure 21C:
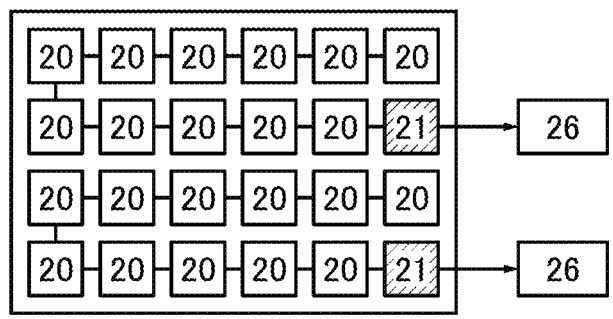

Although FIG. 2A shows the example where a pixel provided in the last stage of the last row is the pixel 21 and the A/D converter 26 is connected to the pixel 21, the pixel 21 may be provided every several rows as illustrated in FIG. 21C. The pixel 21 may be provided every two, four, or eight rows, for example, which are the number of rows obtained by dividing the total number of rows equally. Such a structure can increase the number of the A/D converters 26, resulting in faster signal reading.

Figure 21D:
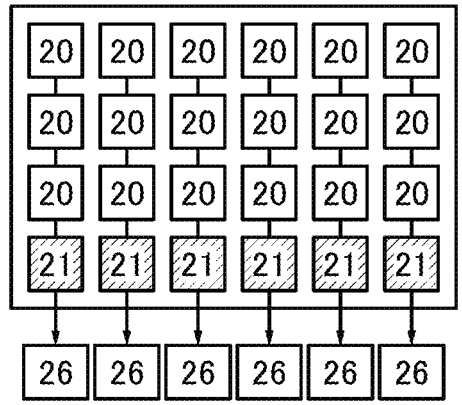

In any of the aforementioned structure, signals are read in the row direction; alternatively, signals may be read in the column direction as illustrated in FIG. 21D. Without limitation to the structure in FIG. 21D, signals can be read in the column direction in any of the aforementioned structures.

Figure 22A:
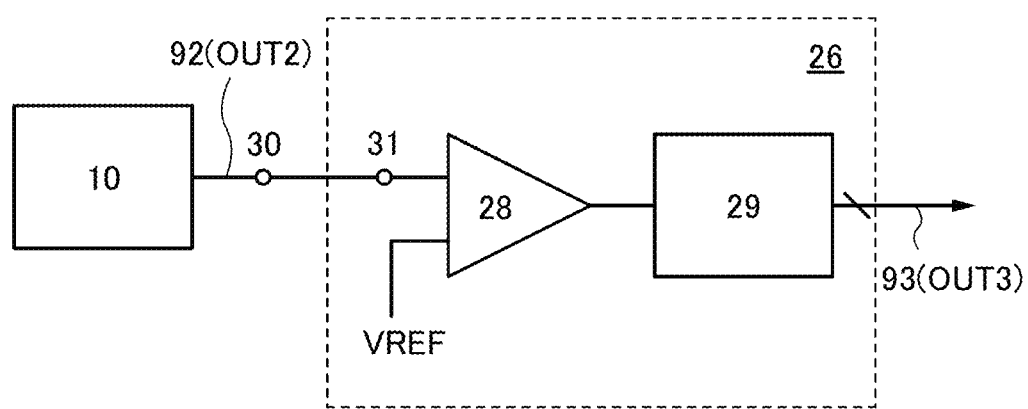
FIGS. 22A and 22B are a block diagram of an A/D converter and a diagram illustrating an example of connection between an imaging element and the A/D converter.

FIG. 22A is a block diagram illustrating an example of the A/D converter 26. The A/D converter 26 can include a comparator 28, a counter circuit 29, and the like and output digital data of two bits or more to a wiring 93 (OUT3).

The comparator 28 compares a signal potential that is input from the terminal 30 to a terminal 31 and a reference potential (VREF) that is swept up or down. Then, the counter circuit 29 operates in accordance with the output of the comparator 28 and outputs a digital signal to the wiring 93 (OUT3).

To achieve high-speed operation and power saving, the A/D converter 26 is preferably constituted by Si transistors capable of forming a CMOS circuit.

Figure 22B:
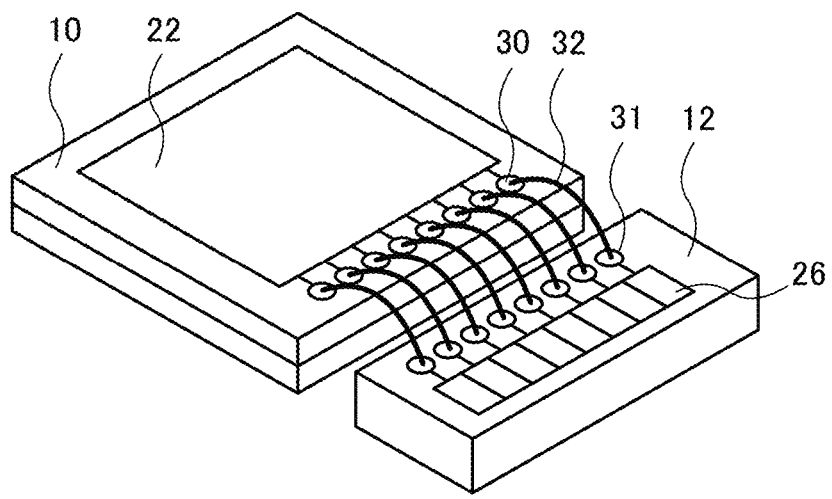

The imaging element 10 and the A/D converter 26 can be connected in such a manner, for example, that the terminals 30 and the terminals 31 are connected through wires 32 by a wire bonding method or the like as illustrated in FIG. 22B.

In Embodiment 1, one embodiment of the present invention has been described. Other embodiments of the present invention are described in Embodiments 2 to 7. Note that one embodiment of the present invention is not limited to these embodiments. In other words, various embodiments of the invention are described in this embodiment and Embodiments 2 to 7, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, and the like of a transistor contain an oxide semiconductor is described as one embodiment of the present invention, one embodiment of the present invention is not limited thereto. Depending on circumstances or conditions, various transistors or a channel formation region, a source region, a drain region, and the like of a transistor in one embodiment of the present invention may contain a variety of semiconductors. Depending on circumstances or conditions, various transistors or a channel formation region, a source region, a drain region, and the like of a transistor in one embodiment of the present invention may contain at least one of silicon, germanium, silicon germanium, silicon carbide, gallium arsenide, aluminum gallium arsenide, indium phosphide, gallium nitride, and an organic semiconductor, for example, or alternatively do not necessarily contain an oxide semiconductor. Although an example in which a global shutter system is employed is described as one embodiment of the present invention, one embodiment of the present invention is not limited thereto. Depending on circumstances or conditions, another system such as a rolling shutter system may be employed in one embodiment of the present invention, or alternatively a global shutter system is not necessarily employed.

This embodiment can be implemented in appropriate combination with any of the structures described in the other embodiments.

Embodiment 2

In this embodiment, an OS transistor that can be used in one embodiment of the present invention will be described with reference to drawings. In the drawings in this embodiment, some components are enlarged, reduced in size, or omitted for easy understanding.

Figure 23A:
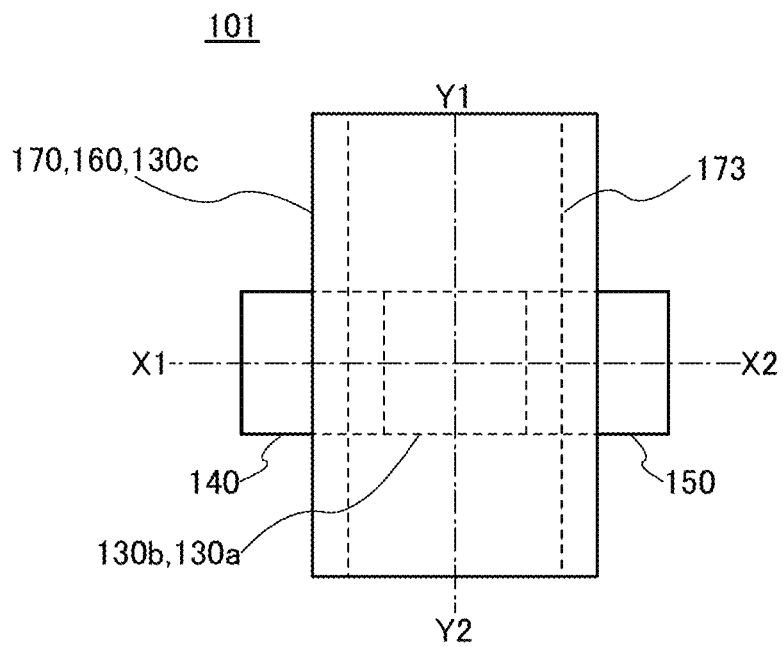
FIGS. 23A to 23C are a top view and cross-sectional views illustrating a transistor.
Figure 23B:
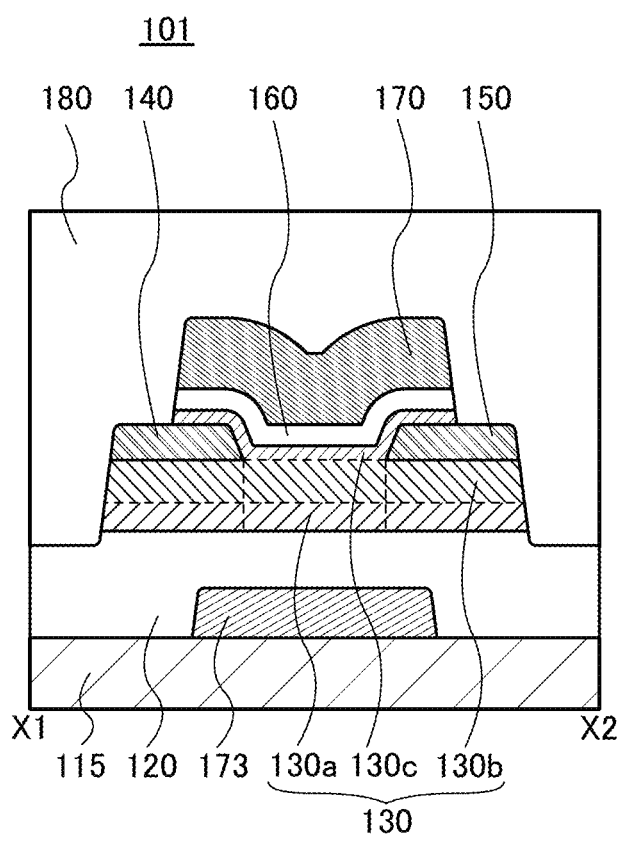
Figure 23C:
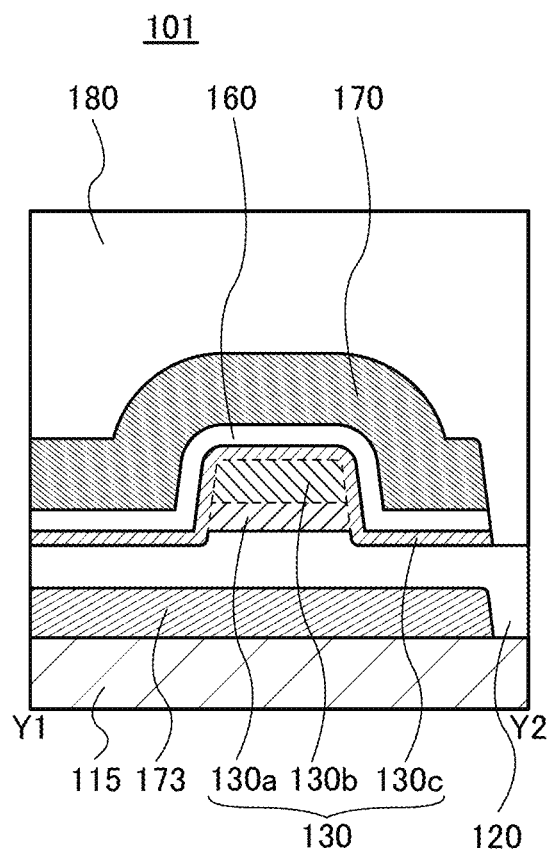

FIGS. 23A to 23C are a top view and cross-sectional views of a transistor 101 of one embodiment of the present invention. FIG. 23A is the top view. FIG. 23B shows a cross section along the dashed-dotted line X1-X2 in FIG. 23A. FIG. 23C shows a cross section along the dashed-dotted line Y1-Y2 in FIG. 23A.

In the drawings explained in this embodiment, the direction of the dashed-dotted line X1-X2 is referred to as channel length direction, and the direction of the dashed-dotted line Y1-Y2 is referred to as channel width direction.

The transistor 101 includes an insulating layer 120 in contact with the substrate 115, the conductive layer 173 in contact with the insulating layer 120, the oxide semiconductor layer 130 in contact with the insulating layer 120, the conductive layers 140 and 150 in contact with the oxide semiconductor layer 130, the insulating layer 160 in contact with the oxide semiconductor layer 130 and the conductive layers 140 and 150, and the conductive layer 170 in contact with the insulating layer 160.

Over the transistor 101, an insulating layer 180 in contact with the oxide semiconductor layer 130, the conductive layers 140 and 150, the insulating layer 160, and the conductive layer 170 may be provided as necessary.

The oxide semiconductor layer 130 can have a three-layer structure of oxide semiconductor layers 130a, 130b, and 130c, for example.

The conductive layers 140 and 150 can function as a source electrode layer and a drain electrode layer. The insulating layer 160 and the conductive layer 170 can function as a gate insulating film and a gate electrode layer, respectively.

Using the conductive layer 173 as a second gate electrode layer (backgate) enables the increase in on-state current and control of the threshold voltage. Note that the conductive layer 173 can also serve as a light-blocking layer.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is supplied to the conductive layer 173.

In the oxide semiconductor layer 130, a region in contact with the conductive layer 140 and a region in contact with the conductive layer 150 can function as a source region and a drain region.

Since the oxide semiconductor layer 130 is in contact with the conductive layers 140 and 150, an oxygen vacancy is generated in the oxide semiconductor layer 130, and the regions become n-type low-resistance regions owing to interaction between the oxygen vacancy and hydrogen that remains in the oxide semiconductor layer 130 or diffuses into the oxide semiconductor layer 130 from the outside.

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification. In addition, the term "electrode layer" can be replaced with the term "wiring."

The conductive layers 140 and 150 are in contact with a top surface of the oxide semiconductor layer 130 and are not in contact with side surfaces of the oxide semiconductor layer 130. This structure facilitates compensation for oxygen vacancies in the oxide semiconductor layer 130 with oxygen included in the insulating layer 120.

Figure 24A:
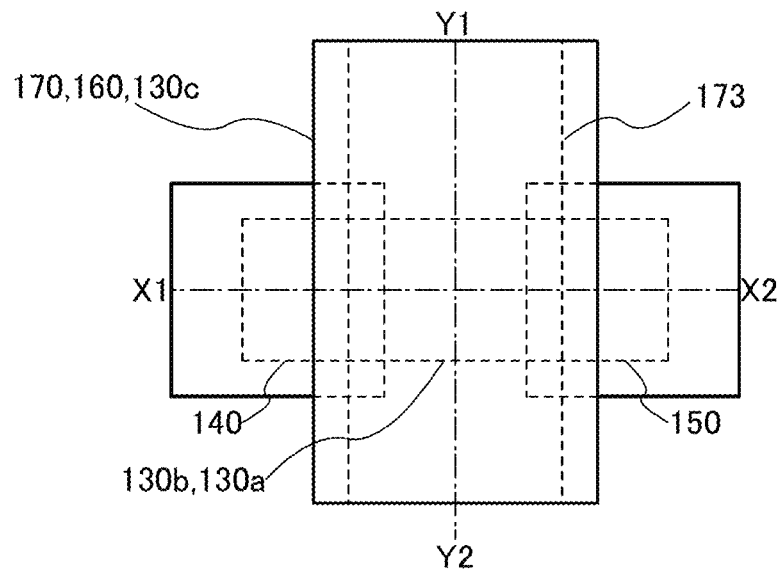
FIGS. 24A to 24C are a top view and cross-sectional views illustrating a transistor.
Figure 24B:
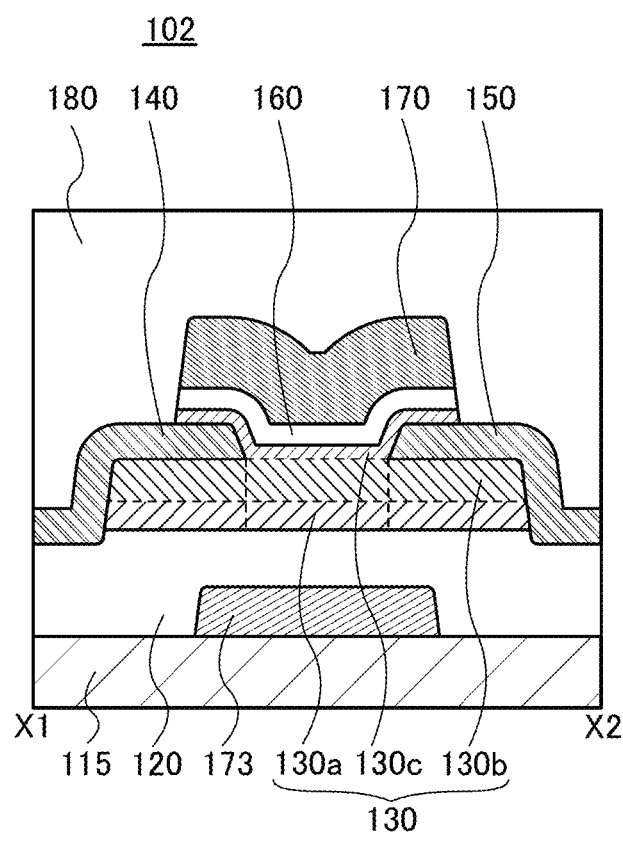
Figure 24C:
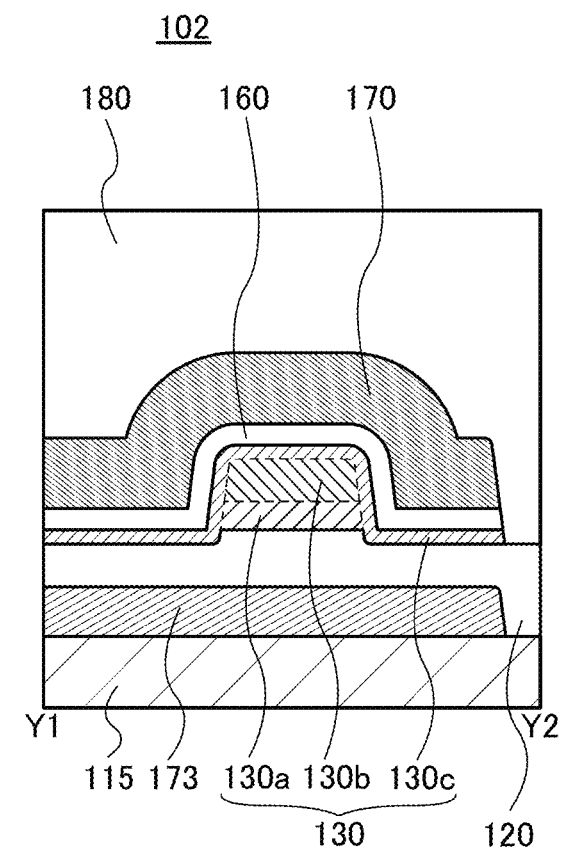

The transistor in one embodiment of the present invention may have a structure illustrated in FIGS. 24A to 24C. FIG. 24A is a top view of a transistor 102. FIG. 24B shows a cross section along the dashed-dotted line X1-X2 in FIG. 24A. FIG. 24C shows a cross section along the dashed-dotted line Y1-Y2 in FIG. 24A.

The transistor 102 has the same structure as the transistor 101 except that the conductive layers 140 and 150 are in contact with the insulating layer 120, and that the conductive layers 140 and 150 are in contact with side surfaces of the oxide semiconductor layer 130.

Figure 25A:
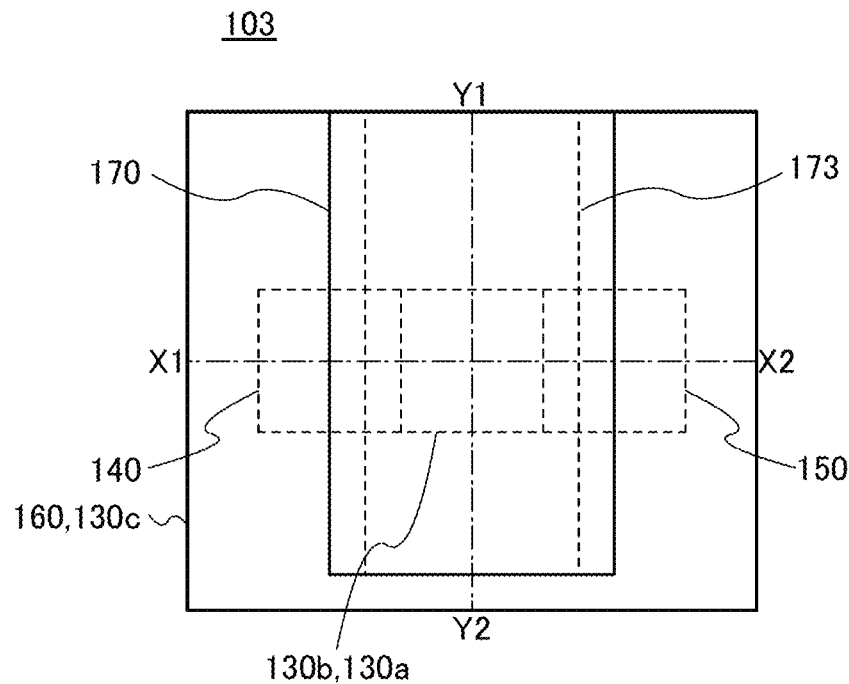
FIGS. 25A to 25C are a top view and cross-sectional views illustrating a transistor.
Figure 25B:
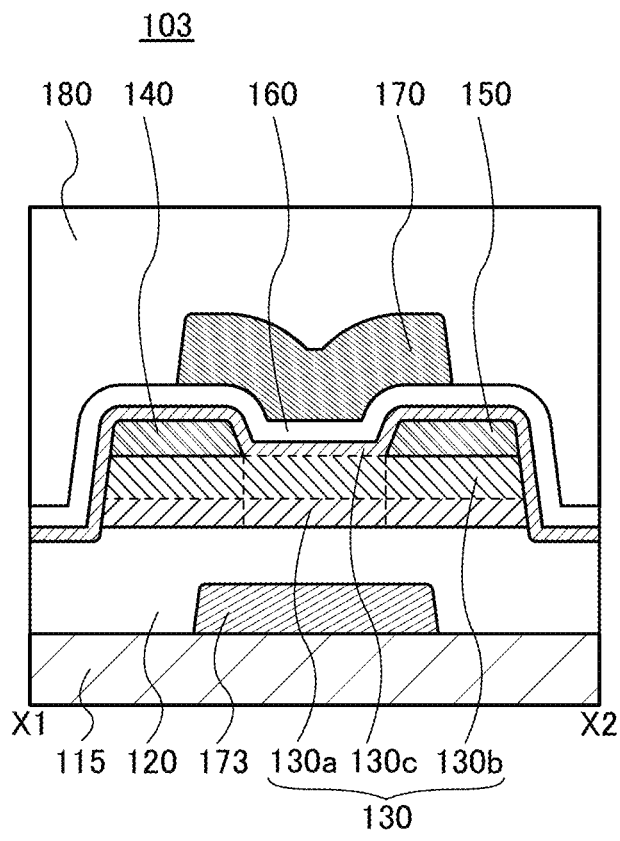
Figure 25C:
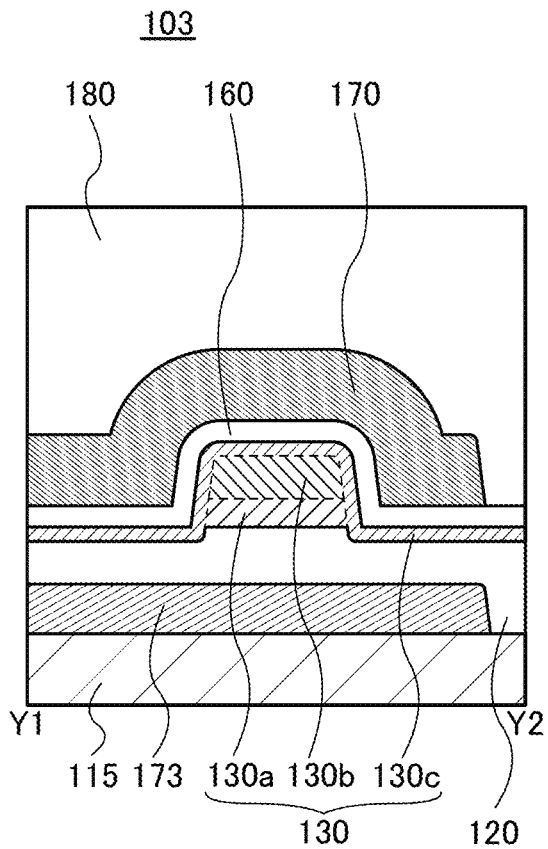

The transistor in one embodiment of the present invention may have a structure illustrated in FIGS. 25A to 25C. FIG. 25A is a top view of a transistor 103. FIG. 25B shows a cross section along the dashed-dotted line X1-X2 in FIG. 25A. FIG. 25C shows a cross section along the dashed-dotted line Y1-Y2 in FIG. 25A.

The transistor 103 has the same structure as the transistor 101 except that the oxide semiconductor layers 130a and 130b and the conductive layers 140 and 150 are covered with the oxide semiconductor layer 130c and the insulating layer 160.

When the oxide semiconductor layer 130c covers the oxide semiconductor layers 130a and 130b, the effect of compensating for oxygen to the oxide semiconductor layers 130a and 130b and the insulating layer 120 can be enhanced. Moreover, oxidation of the conductive layers 140 and 150 by the insulating layer 180 can be suppressed with the oxide semiconductor layer 130c placed therebetween.

Figure 26A:
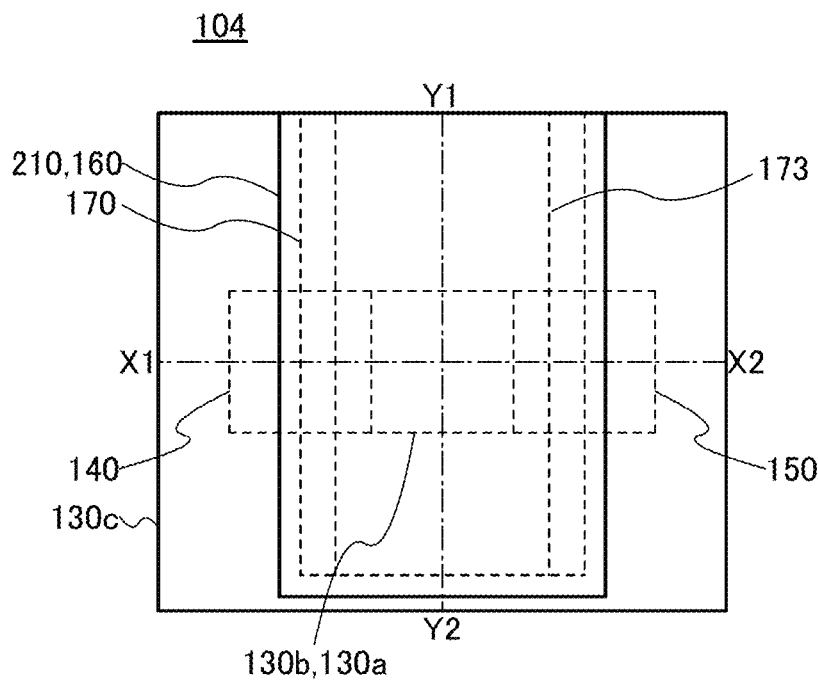
FIGS. 26A to 26C are a top view and cross-sectional views illustrating a transistor.
Figure 26B:
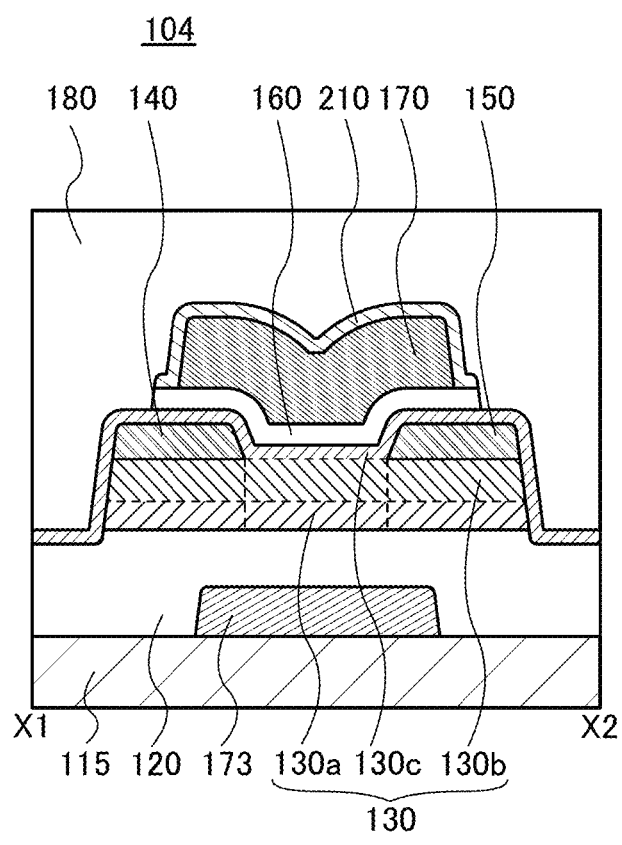
Figure 26C:
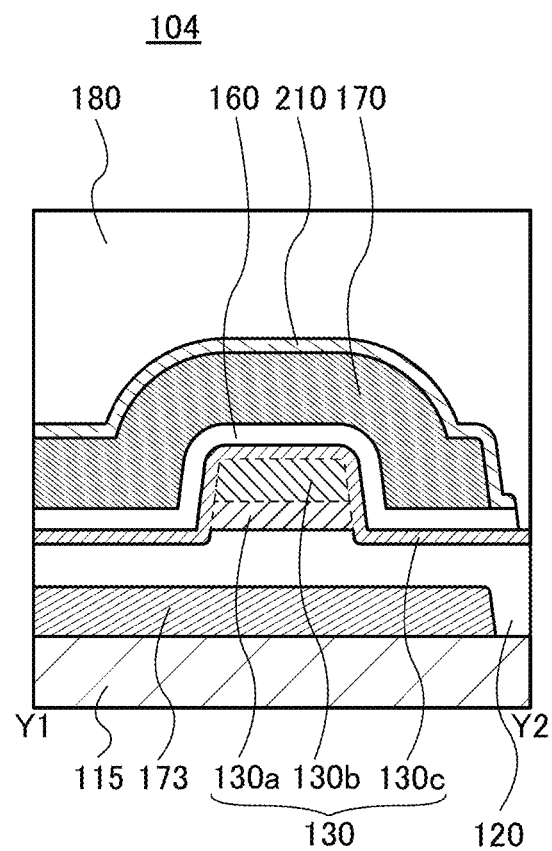

The transistor in one embodiment of the present invention may have a structure illustrated in FIGS. 26A to 26C. FIG. 26A is a top view of a transistor 104. FIG. 26B shows a cross section along the dashed-dotted line X1-X2 in FIG. 26A. FIG. 26C shows a cross section along the dashed-dotted line Y1-Y2 in FIG. 26A.

The transistor 104 has the same structure as the transistor 101 except that the oxide semiconductor layers 130a and 130b and the conductive layers 140 and 150 are covered with the oxide semiconductor layer 130c, and that the insulating layer 170 is covered with an insulating layer 210.

The insulating layer 210 can be formed using a material with a blocking property against oxygen, for example, metal oxide such as aluminum oxide. Oxidation of the conductive layer 170 by the insulating layer 180 can be suppressed with the insulating layer 210 placed therebetween.

The transistors 101 to 104 have a top-gate structure including a region where the conductive layer 170 overlaps the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 27A:
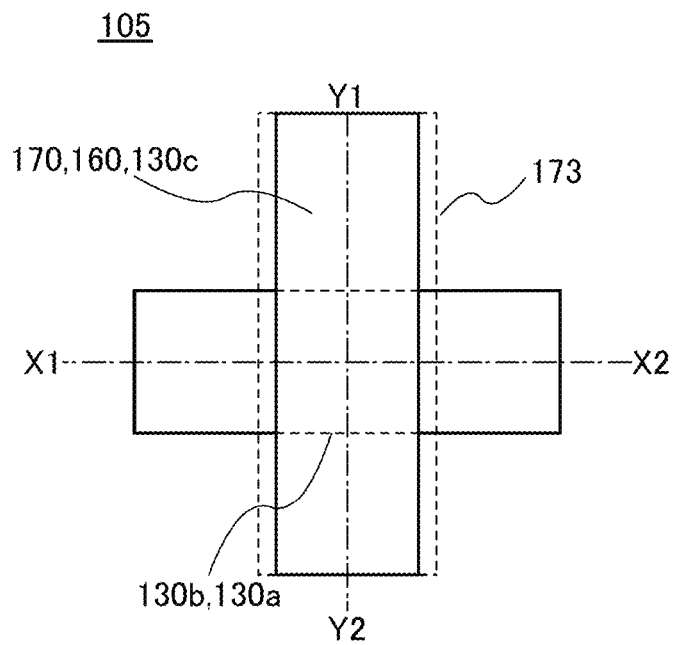
FIGS. 27A to 27C are a top view and cross-sectional views illustrating a transistor.
Figure 27B:
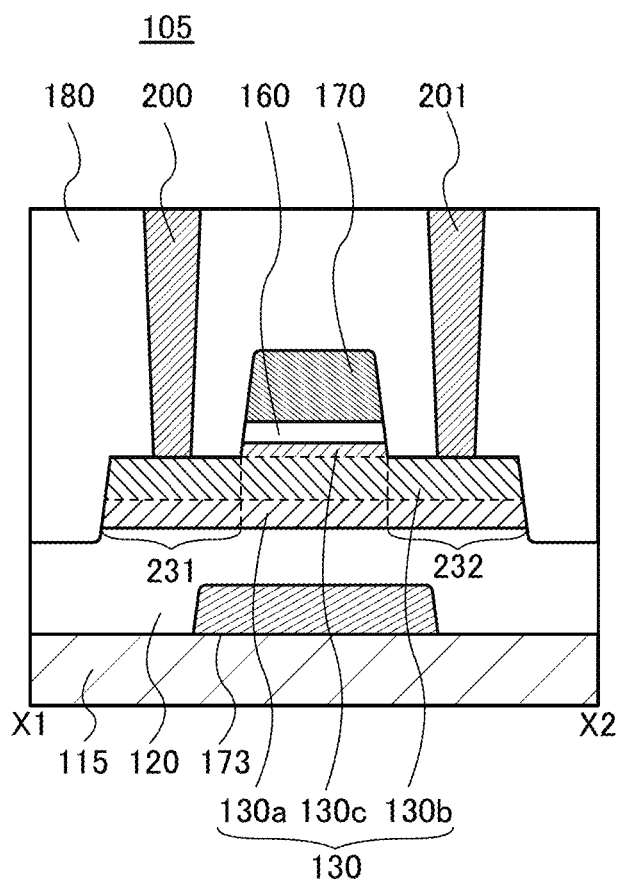
Figure 27C:
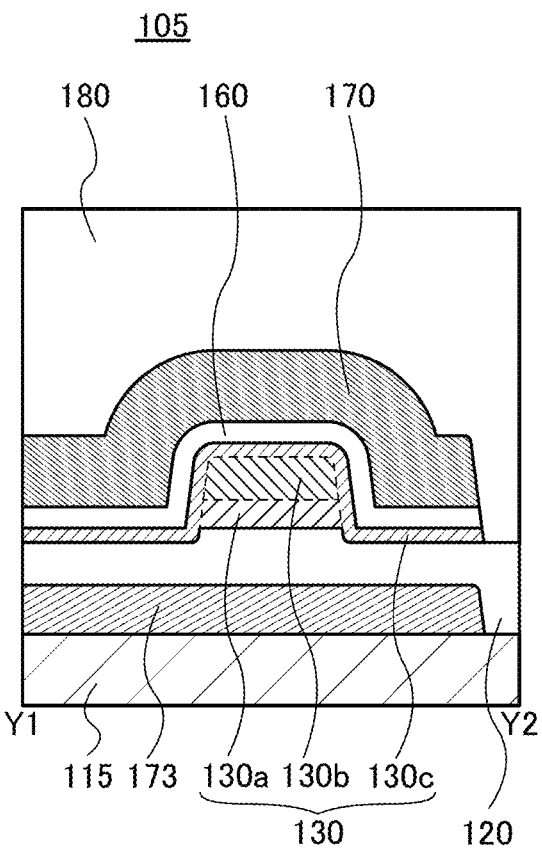

The transistor in one embodiment of the present invention may have a structure illustrated in FIGS. 27A to 27C. FIG. 27A is a top view of a transistor 105. FIG. 27B shows a cross section along the dashed-dotted line X1-X2 in FIG. 27A. FIG. 27C shows a cross section along the dashed-dotted line Y1-Y2 in FIG. 27A.

The transistor 105 includes the insulating layer 120 in contact with the substrate 115, the conductive layer 173 in contact with the insulating layer 120, the oxide semiconductor layer 130 in contact with the insulating layer 120, the insulating layer 160 in contact with the oxide semiconductor layer 130, and the conductive layer 170 in contact with the insulating layer 160.

In the insulating layer 180 serving as an interlayer insulating film, a conductor 200 in contact with a region 231 of the oxide semiconductor layer 130 and a conductor 201 in contact with a region 232 of the oxide semiconductor layer 130 are provided. The conductors 200 and 201 can function as part of the source electrode layer and part of the drain electrode layer.

An impurity for forming an oxygen vacancy to increase conductivity is preferably added to the regions 231 and 232 in the transistor 105. As an impurity for forming an oxygen vacancy in an oxide semiconductor layer, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor.

The transistor 105 has a self-aligned structure that does not include a region where the conductive layer 170 overlaps the conductive layers 140 and 150. A transistor with a self-aligned structure, which has extremely low parasitic capacitance between a gate electrode layer and source and drain electrode layers, is suitable for applications that require high-speed operation.

Figure 28A:
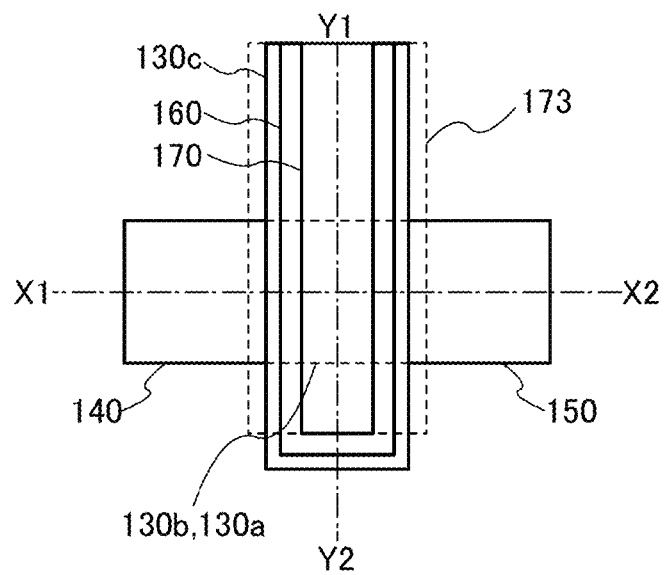
FIGS. 28A to 28C are a top view and cross-sectional views illustrating a transistor.
Figure 28B:
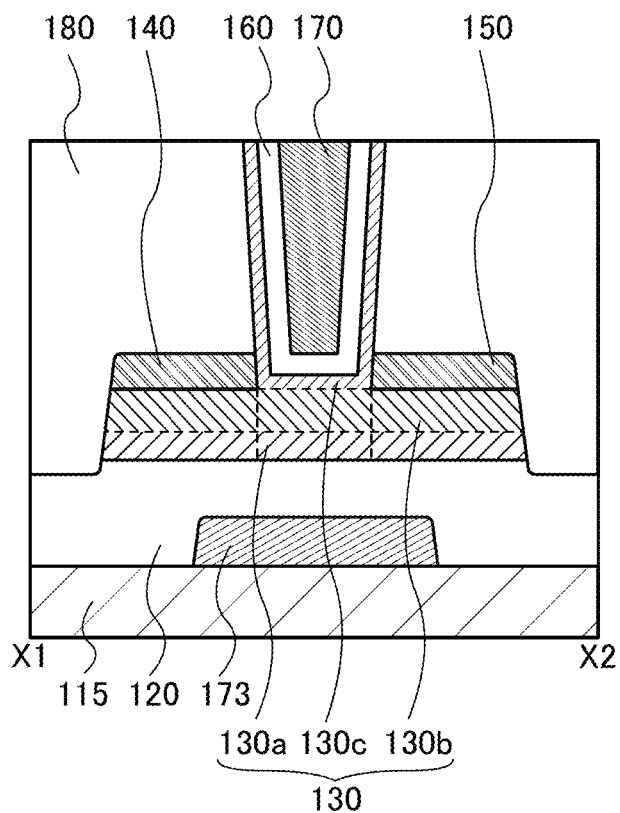
Figure 28C:
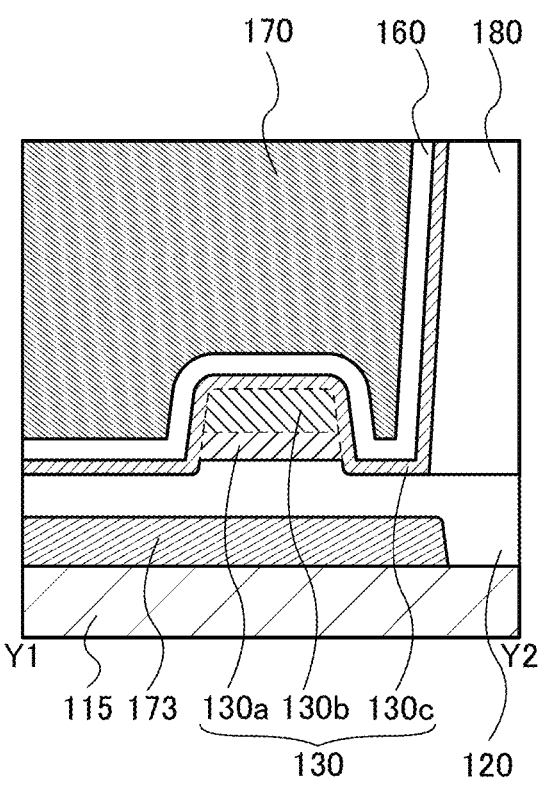

The transistor in one embodiment of the present invention may have a structure illustrated in FIGS. 28A to 28C. FIG. 28A is a top view of a transistor 106. FIG. 28B shows a cross section along the dashed-dotted line X1-X2 in FIG. 28A. FIG. 28C shows a cross section along the dashed-dotted line Y1-Y2 in FIG. 28A.

The transistor 106 includes the substrate 115, the insulating layer 120 over the substrate 115, the conductive layer 173 in contact with the insulating layer 120, the oxide semiconductor layer 130 (the oxide semiconductor layers 130a, 130b, and the 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160.

Note that the oxide semiconductor layer 130c, the insulating layer 160, and the conductive layer 170 are provided in an opening that is provided in the insulating layer 180 over the transistor 106 and reaches the oxide semiconductor layers 130a and 130b and the insulating layer 120.

The transistor in one embodiment of the present invention may have a structure illustrated in FIGS. 29A to 29C. FIG. 29A is a top view of a transistor 107. FIG. 29B shows a cross section along the dashed-dotted line X1-X2 in FIG. 29A. FIG. 29C shows a cross section along the dashed-dotted line Y1-Y2 in FIG. 29A.

The transistor 107 has the same structure as the transistor 106 except that the oxide semiconductor layers 130a and 130b and the conductive layers 140 and 150 are covered with the oxide semiconductor layer 130c and an oxide semiconductor layer 130d. The oxide semiconductor layer 130d can be formed using the same material as the oxide semiconductor layer 130c.

When the oxide semiconductor layers 130c and 130d cover the oxide semiconductor layers 130a and 130b, the effect of compensating for oxygen to the oxide semiconductor layers 130a and 130b and the insulating layer 120 can be enhanced. Moreover, oxidation of the conductive layers 140 and 150 by the insulating layer 180 can be suppressed with the oxide semiconductor layer 130d placed therebetween.

The transistors 106 and 107 have a smaller region in which the conductor serving as a gate electrode overlaps the conductor serving as a source or a drain than the other transistors described above; thus, parasitic capacitance in the transistors 106 and 107 can be reduced. Consequently, the transistors 106 and 107 are suitable for components of a circuit that requires high-speed operation.

Figure 30A:
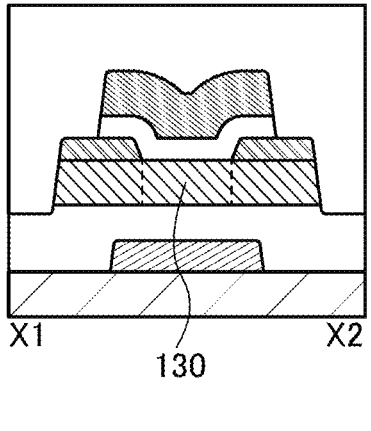
FIGS. 30A to 30H are cross-sectional views and top views each illustrating a transistor.
Figure 30B:
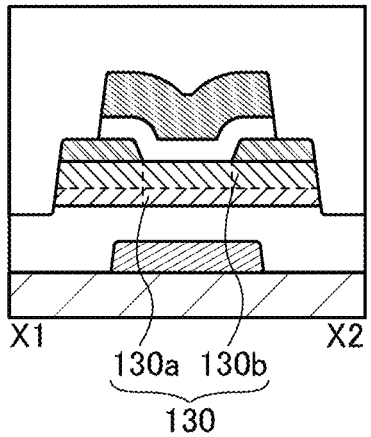

In the transistor of one embodiment of the present invention, the oxide semiconductor layer 130 may be a single layer as illustrated in FIG. 30A, or may be formed of two layers as illustrated in FIG. 30B.

Figure 30C:
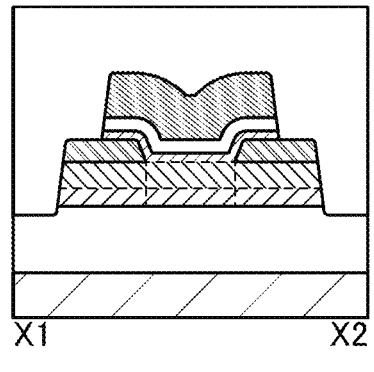

The transistor of one embodiment of the present invention may be configured not to include the conductive layer 173 as illustrated in FIG. 30C.

Figure 30D:
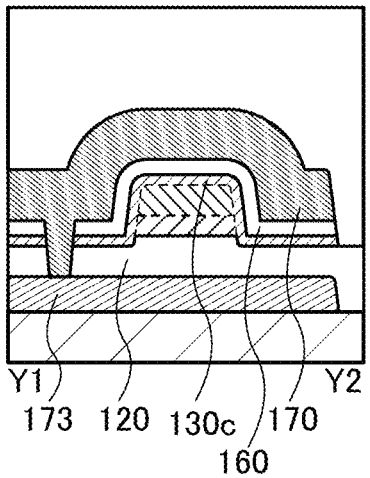

To electrically connect the conductive layer 170 to the conductive layer 173 in the transistor of one embodiment of the present invention, for example, an opening is formed in the insulating layer 120, the oxide semiconductor layer 130c, and the insulating layer 160 to reach the conductive layer 173, and the conductive layer 170 is formed to cover the opening as illustrated in FIG. 30D.

Figure 30E:
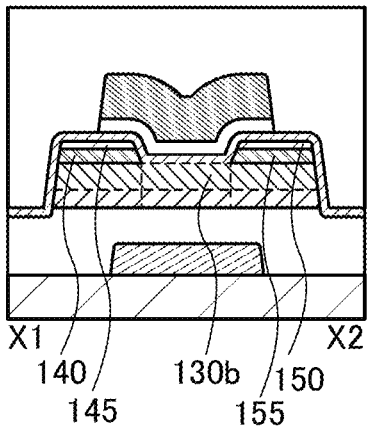

The transistor of one embodiment of the present invention may be provided with an insulating layer 145 and an insulating layer 155 that are in contact with the conductive layer 140 and the conductive layer 150, respectively, as illustrated in FIG. 30E. The insulating layers 145 and 155 can prevent oxidation of the conductive layers 140 and 150.

The insulating layers 145 and 155 can be formed using a material with a blocking property against oxygen, for example, metal oxide such as aluminum oxide.

Figure 30F:
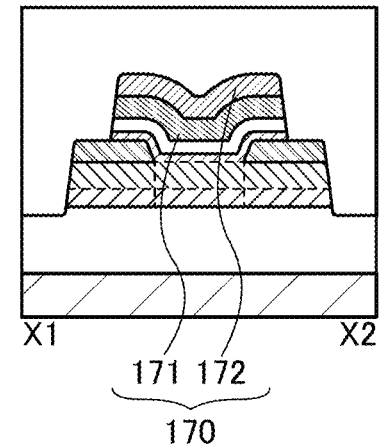

In the transistor of one embodiment of the present invention, the conductive layer 170 may be a stack including a conductive layer 171 and a conductive layer 172, as illustrated in FIG. 30F.

Figure 30G:
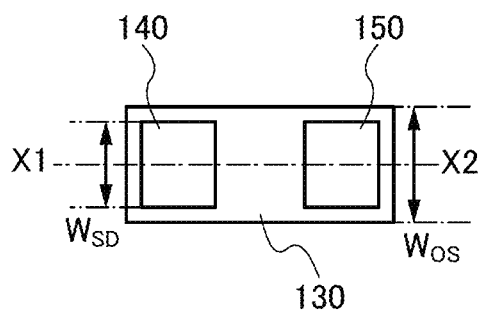
Figure 30H:
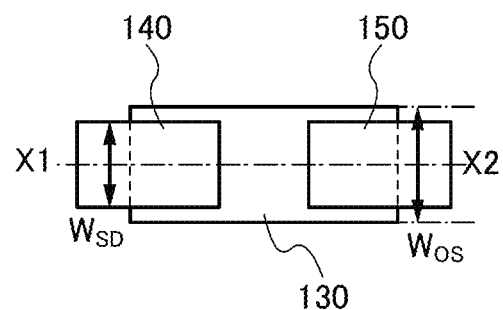

In the transistor of one embodiment of the present invention, in which the conductive layers 140 and 150 are provided over the oxide semiconductor layer 130, the width ($W_{SD}$) of the conductive layers 140 and 150 may be smaller than the width ($W_{OS}$) of the oxide semiconductor layer 130 as shown in top views of FIGS. 30G and 30H (that only show the oxide semiconductor layer 130 and the conductive layers 140 and 150). When $W_{OS} \geq W_{SD}$ is satisfied ($W_{SD}$ is smaller than or equal to $W_{OS}$), a gate electric field is easily applied to the entire channel formation region, so that electrical characteristics of the transistor can be improved.

FIGS. 30A to 30F illustrate variation examples of the transistor 101; these examples can also be applied to the other transistors described in this embodiment.

In the transistor with any of the above structures in one embodiment of the present invention, the conductive layer 170 (and the conductive layer 173) serving as a gate electrode layer electrically surrounds the oxide semiconductor layer 130 in the channel width direction with the insulating layer therebetween. Such a structure can increase the on-state current and is referred to as a surrounded channel (s-channel) structure.

In the transistor including the oxide semiconductor layers 130a and 130b and the transistor including the oxide semiconductor layers 130a, 130b, and 130c, selecting appropriate materials for the two or three layers forming the oxide semiconductor layer 130 allows current to flow in the oxide semiconductor layer 130b. Since current flows through the oxide semiconductor layer 130b, the current is hardly influenced by interface scattering, leading to high on-state current.

A semiconductor device including the transistor with any of the above structures can have favorable electrical characteristics.

The structure described in this embodiment can be used in appropriate combination with the structure described in any of the other embodiments.

Embodiment 3

In this embodiment, components of the transistors shown in Embodiment 2 will be described in detail.

As the substrate 115, a glass substrate, a quartz substrate, a semiconductor substrate, a ceramic substrate, a metal substrate with an insulated surface, or the like can be used. Other examples are a silicon substrate provided with a transistor and/or a photodiode; and a silicon substrate over which an insulating layer, a wiring, a conductor functioning as a contact plug, and the like are provided together with a transistor and/or a photodiode. When a p-channel transistor is formed on a silicon substrate, a silicon substrate with n⁻-type conductivity is preferably used. Alternatively, an SOI substrate including an n⁻-type or i-type silicon layer may be used. Moreover, when a p-channel transistor is formed on a silicon substrate, a surface of the silicon substrate where the transistor is formed preferably has a (110) plane orientation, in which case the mobility can be increased.

The insulating layer 120 can have a function of supplying oxygen to the oxide semiconductor layer 130 as well as a function of preventing diffusion of impurities from a component of the substrate 115. For this reason, the insulating layer 120 preferably contains oxygen and more preferably has an oxygen content higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, heat treatment is performed such that the film surface temperature ranges from 100° C. to 700° C., preferably from 100° C. to 500° C.

When the substrate 115 is provided with another device, the insulating layer 120 also functions as an interlayer insulating film. In that case, the insulating layer 120 is preferably subjected to planarization treatment such as CMP treatment so as to have a flat surface.

As the conductive layer 173 functioning as a backgate electrode layer, a conductive film formed using Al, Ti, Cr, Co, Ni, Cu, Y, Zr, Mo, Ru, Ag, Mn, Nd, Sc, Ta, or W can be used, for example. It is also possible to use an alloy or a conductive nitride of any of the above materials, or a stack including a plurality of materials selected from these materials, alloys of these materials, and conductive nitrides of these materials.

For example, the insulating layer 120 can be formed using an oxide insulating film containing aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film containing silicon nitride, silicon nitride oxide, aluminum nitride, aluminum nitride oxide, or the like; or a mixed material of any of these. The insulating layer 120 may be a stack of any of the above materials.

The oxide semiconductor layer 130 can have a three-layer structure in which the oxide semiconductor layers 130a, 130b, and 130c are stacked in this order from the insulating layer 120 side.

Note that when the oxide semiconductor layer 130 is a single layer, a layer corresponding to the oxide semiconductor layer 130b described in this embodiment is used.

In the case of employing a two-layer structure, the oxide semiconductor layer 130 can be a stack in which a layer corresponding to the oxide semiconductor layer 130a and a layer corresponding to the oxide semiconductor layer 130b are stacked in this order from the insulating layer 120 side. In this structure, the positions of the oxide semiconductor layers 130a and 130b can be interchanged.

For the oxide semiconductor layer 130b, an oxide semiconductor whose electron affinity (energy difference between the vacuum level and the conduction band minimum) is higher than those of the oxide semiconductor layers 130a and 130c is used, for example.

In such a structure, when a voltage is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a, 130b, and 130c preferably contains at least one of In and Zn, or both In and Zn. In order to reduce variations in electrical characteristics of the transistor including the oxide semiconductor, the oxide semiconductor preferably contains a stabilizer such as Al, Ga, Y, or Sn in addition to In and/or Zn.

For the oxide semiconductor layers 130a and 130c, In—Ga—Zn oxide with an atomic ratio of In to Ga and Zn (In:Ga:Zn) of 1:3:2, 1:3:3, 1:3:4, 1:3:6, 1:4:5, 1:6:4, or 1:9:6 or close to these ratios can be used, for example. For the oxide semiconductor layer 130b, In—Ga—Zn oxide with an atomic ratio In:Ga:Zn of 1:1:1, 2:1:3, 5:5:6, 3:1:2, 3:1:4, 5:1:6, or 4:2:3 or close to these ratios can be used, for example.

The oxide semiconductor layers 130a, 130b, and 130c may include crystal parts. For example, when crystals with c-axis alignment are used, the transistor can have stable electrical characteristics. Moreover, crystals with c-axis alignment are resistant to bending; thus, using such crystals can improve the reliability of a semiconductor device using a flexible substrate.

The conductive layer 140 functioning as a source electrode and the conductive layer 150 functioning as a drain electrode can be formed with a single layer or a stacked layer using a material selected from Al, Cr, Cu, Ta, Ti, Mo, W, Ni, Mn, Nd, and Sc and alloys or conductive nitrides of any of these metal materials, for example. Using tantalum nitride, which is a conductive nitride, can prevent oxidation of the conductive layers 140 and 150. It is also possible to use a stack of any of the above materials and Cu or an alloy such as Cu—Mn, which has low resistance.

The above materials are capable of extracting oxygen from an oxide semiconductor layer. Thus, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is likely to be changed to an n-type region. Accordingly, the n-type region can serve as a source or a drain of the transistor.

The insulating layer 160 functioning as a gate insulating film can be an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials.

As the insulating layers 120 and 160 in contact with the oxide semiconductor layer 130, a film that releases less nitrogen oxide is preferably used. When the oxide semiconductor is in contact with an insulating layer that releases a large amount of nitrogen oxide, the density of states caused by nitrogen oxide becomes high in some cases.

By using the above oxide insulating film as the insulating layers 120 and 160, a shift in the threshold voltage of the transistor can be reduced, which leads to reduced fluctuations in the electrical characteristics of the transistor.

As the conductive layer 170 functioning as a gate electrode layer, a conductive film of Al, Ti, Cr, Co, Ni, Cu, Y, Zr, Mo, Ru, Ag, Mn, Nd, Sc, Ta, or W can be used, for example. An alloy or a conductive nitride of any of these materials can also be used. A stack containing a plurality of materials selected from the above materials, alloys of these materials, and conductive nitrides of these materials can also be used. As a typical example, tungsten, a stack of tungsten and titanium nitride, or a stack of tungsten and tantalum nitride can be used. Alternatively, Cu or an alloy such as Cu—Mn, which has low resistance, or a stack of any of the above materials and Cu or an alloy such as Cu—Mn may be used. For example, titanium nitride can be used for the conductive layer 171 and tungsten can be used for the conductive layer 172 to form the conductive layer 170.

As the conductive layer 170, an oxide conductive layer of In—Ga—Zn oxide, zinc oxide, indium oxide, tin oxide, indium tin oxide, or the like may be used. When the oxide conductive layer is provided in contact with the insulating layer 160, oxygen can be supplied from the oxide conductive layer to the oxide semiconductor layer 130.

The insulating layer 180 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

A film having an effect of blocking impurities is preferably provided over the transistor or the insulating layer 180. The blocking film can be a silicon nitride film, an aluminum nitride film, an aluminum oxide film, or the like.

A nitride insulating film has a function of blocking moisture and the like and can improve the reliability of the transistor. An aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

High integration of a semiconductor device requires transistor miniaturization. However, miniaturization of a transistor tends to cause deterioration of electrical characteristics of the transistor. For example, a decrease in channel width causes a reduction in on-state current.

In the transistor of one embodiment of the present invention, the oxide semiconductor layer 130c can cover the oxide semiconductor layer 130b in which the channel is formed. In this structure, the channel formation layer is not in contact with the gate insulating film; thus, scattering of carriers formed at the interface between the channel formation layer and the gate insulating film can be reduced, and the on-state current of the transistor can be increased.

In the transistor of one embodiment of the present invention, as described above, the gate electrode layer (the conductive layer 170) is formed to electrically surround the oxide semiconductor layer 130 in the channel width direction. Accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films described in this embodiment can be formed typically by a sputtering method or a plasma-enhanced CVD method, such films may be formed by another method such as a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and then, the second source gas introduced is adsorbed on the first layer and reacted. As a result, a second layer is stacked over the first layer, so that a thin film is formed. The sequence of the gas introduction is controlled and repeated more than once until a desired thickness is obtained, whereby a thin film with excellent step coverage can be formed. The thickness of the thin film can be adjusted by the number of repetitions of the sequence of gas introduction; therefore, ALD makes it possible to accurately adjust a film thickness and thus is suitable for manufacturing a minute FET.

A facing-target-type sputtering apparatus can be used to form an oxide semiconductor layer. Deposition using a facing-target-type sputtering apparatus can be referred to as vapor deposition sputtering (VDSP).

When an oxide semiconductor layer is deposited using a facing-target-type sputtering apparatus, plasma damage to the oxide semiconductor layer at the time of deposition can be reduced. Thus, oxygen vacancies in the layer can be reduced. In addition, the use of the facing-target-type sputtering apparatus enables low-pressure deposition. Accordingly, the concentration of impurities (e.g., hydrogen, a rare gas such as argon, and water) in a deposited oxide semiconductor layer can be lowered.

The structure described in this embodiment can be used in appropriate combination with the structure described in any of the other embodiments.

Embodiment 4

In this embodiment, the material of an oxide semiconductor that can be used for one embodiment of the present invention will be described.

An oxide semiconductor preferably contains at least indium or zinc. In particular, indium and zinc are preferably contained. In addition, aluminum, gallium, yttrium, tin, or the like is preferably contained as an element M. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained as an element M.

Here, the case where an oxide semiconductor contains indium, an element M, and zinc is considered.

First, preferred ranges of the atomic ratio of indium, the element M, and zinc contained in an oxide semiconductor according to the present invention are described with reference to FIGS. 31A to 31C. Note that the proportion of oxygen atoms is not shown in FIGS. 31A to 31C. The terms of the atomic ratio of indium, the element M, and zinc contained in the oxide semiconductor are denoted by [In], [M], and [Zn], respectively.

Figure 31A:
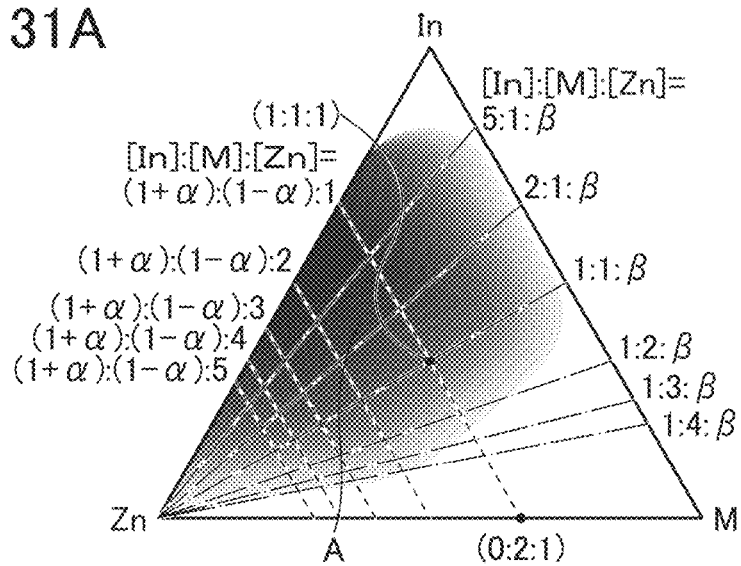
FIGS. 31A to 31C each show the range of an atomic ratio of an oxide semiconductor.
Figure 31B:
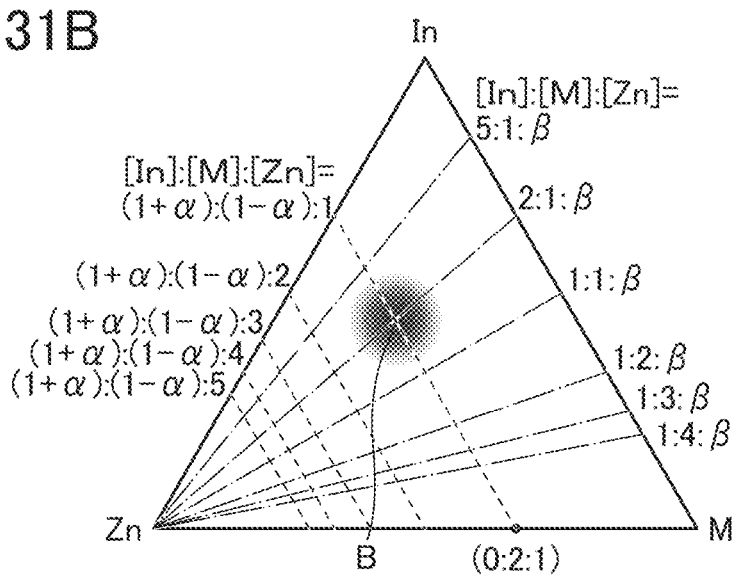
Figure 31C:
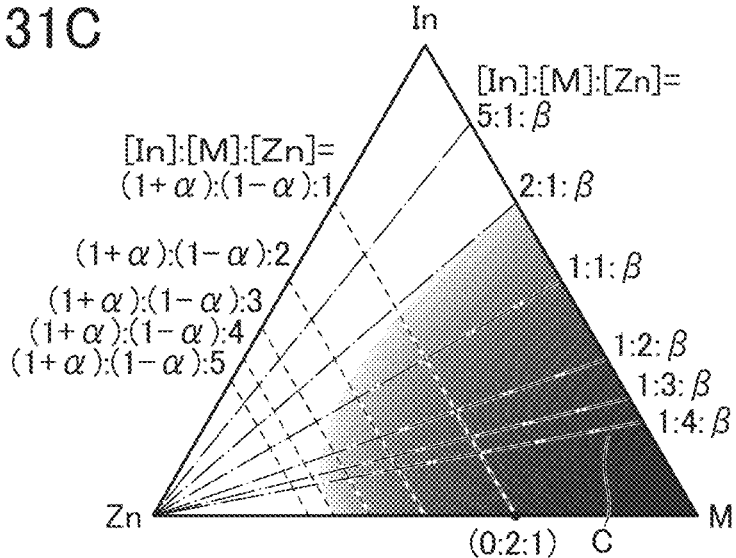

In FIGS. 31A to 31C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \ge 0$), a line where the atomic ratio [In]:[M]:[Zn] is $1:2:\beta$, a line where the atomic ratio [In]:[M]:[Zn] is 1:313, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxide semiconductor with the atomic ratio [In]:[M]:[Zn] of 0:2:1 or around 0:2:1 in FIGS. 31A to 31C tends to have a spinel crystal structure.

FIGS. 31A and 31B illustrate examples of the preferred ranges of the atomic ratio of indium, the element M, and zinc contained in an oxide semiconductor of one embodiment of the present invention.

Figure 32:
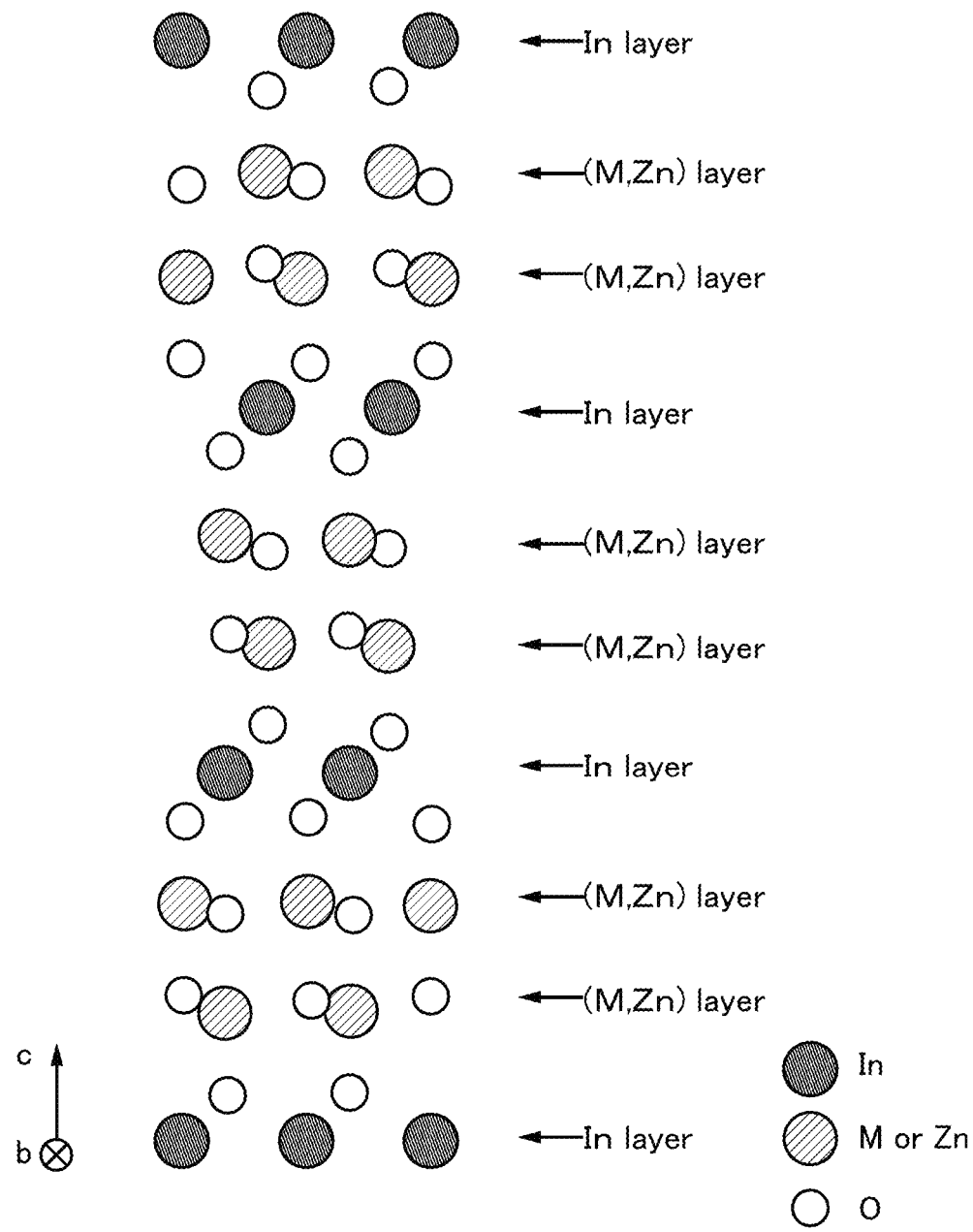
FIG. 32 shows an $InMZnO_4$ crystal structure.

FIG. 32 illustrates an example of the crystal structure of $InMZnO_4$ with an atomic ratio [In]:[M]:[Zn] of 1:1:1. The crystal structure illustrated in FIG. 32 is $InMZnO_4$ observed from a direction parallel to the b-axis. Note that a metal element in a layer that contains the element M, Zn, and oxygen (hereinafter this layer is referred to as "(M,Zn) layer") in FIG. 32 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 32.

Indium and the element M can be replaced with each other. Accordingly, when the element M in the (M,Zn) layer is replaced by indium, the layer can also be referred to as (In,M,Zn) layer. In that case, a layered structure that includes two (In,M,Zn) layers with respect to one In layer is obtained.

An oxide semiconductor with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor may have a mix of a layered structure including one In layer for every two (M,Zn) layers and a layered structure including one In layer for every three (M,Zn) layers.

For example, when the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] close to 0:2:1, two phases of a spinel crystal structure and a layered crystal structure are likely to exist. Moreover, with an atomic ratio [In]:[M]:[Zn] close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor with a higher content of indium can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio [In]:[M]:[Zn] of 0:1:0 or around 0:1:0 (e.g., a region C in FIG. 31C), insulation performance becomes better.

Accordingly, an oxide semiconductor in one embodiment of the present invention preferably has an atomic ratio represented by a region A in FIG. 31A. With this atomic ratio, a layered structure with high carrier mobility and a few grain boundaries is easily obtained.

A region B in FIG. 31B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

When the oxide semiconductor is used for a transistor, carrier scattering or the like at a grain boundary can be reduced; thus, the transistor can have high field-effect mobility. Moreover, the transistor can have high reliability.

An oxide semiconductor with a low carrier density is preferably used for a transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor with a high density of trap states has unstable electrical characteristics in some cases.

In view of the above, to obtain stable electrical characteristics of a transistor, it is effective to reduce the concentration of impurities in the oxide semiconductor. To reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon, which is a Group 14 element, is contained in the oxide semiconductor, defect states are formed in the oxide semiconductor. For that reason, a region where the concentration of silicon or carbon (measured by secondary ion mass spectrometry (SIMS)) is lower than or equal to $2\times10^{18}$ atoms/cm$^3$, preferably lower than or equal to $2\times10^{17}$ atoms/cm$^3$ is formed in the oxide semiconductor or around an interface between the oxide semiconductor and a layer in contact with the oxide semiconductor.

When the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the oxide semiconductor is formed to have a region where the concentration of alkali metal or alkaline earth metal (the concentration measured by SIMS) is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor in which an oxide semiconductor containing nitrogen is used as a semiconductor is likely to have normally-on characteristics. For this reason, nitrogen in the oxide semiconductor is preferably reduced as much as possible. Specifically, the oxide semiconductor is formed to have a region where the nitrogen concentration (measured by SIMS) is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide semiconductor that contains hydrogen is likely to have normally-on characteristics. Accordingly, it is preferred that hydrogen in the oxide semiconductor be reduced as much as possible. Specifically, the oxide semiconductor is formed to have a region where the hydrogen concentration (measured by SIMS) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region in a transistor, the transistor can have stable electrical characteristics. A transistor in which the above highly purified oxide semiconductor is used for a channel formation region exhibits an extremely low off-state current. When a voltage between a source and a drain is set to approximately 0.1 V, 5 V, or 10 V, for example, the off-state current per channel width of the transistor can be as low as several yoctoamperes per micrometer to several zeptoamperes per micrometer.

Figure 33A:
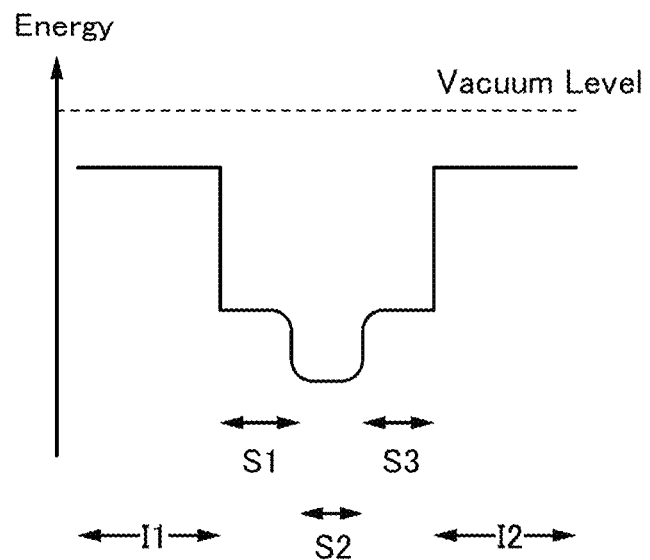
FIGS. 33A and 33B are each a band diagram of a layered structure of oxide semiconductors.
Figure 33B:
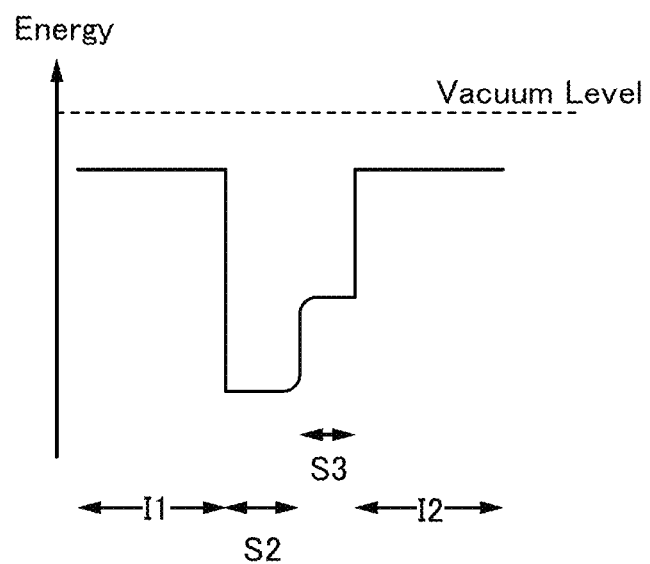

Next, the case where the oxide semiconductor has a two-layer structure or a three-layer structure is described. With reference to FIGS. 33A and 33B, the description is made on a band diagram of a layered structure of an oxide semiconductor S1, an oxide semiconductor S2, and an oxide semiconductor S3 and insulators in contact with the layered structure; and a band diagram of a layered structure of the oxide semiconductor S2 and the oxide semiconductor S3 and insulators in contact with the layered structure. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

FIG. 33A is an example of a band diagram of a layered structure including an insulator I1, the oxide semiconductor S1, the oxide semiconductor S2, the oxide semiconductor S3, and an insulator I2 in the thickness direction. FIG. 33B is an example of a band diagram of a layered structure including the insulator I1, the oxide semiconductor S2, the oxide semiconductor S3, and the insulator I2 in the thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference in the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, it is preferred that the electron affinity of the oxide semiconductor S2 be higher than the electron affinity of each of the oxide semiconductors S1 and S3, and that the difference in the electron affinity between the oxide semiconductor S2 and each of the oxide semiconductors S1 and S3 be greater than or equal to 0.15 eV or greater than or equal to 0.5 eV, and less than or equal to 2 eV or less than or equal to 1 eV.

As illustrated in FIGS. 33A and 33B, the conduction band minimum of each of the oxide semiconductors S1 to S3 is gradually varied. In other words, the conduction band minimum is continuously varied or continuous junction is formed. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, when the oxide semiconductor S2 is In—Ga—Zn oxide, it is preferable to use In—Ga—Zn oxide, Ga—Zn oxide, gallium oxide, or the like as the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. Accordingly, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 31C can be used as the oxide semiconductors S1 and S3.

When an oxide semiconductor with the atomic ratio represented by the region A is used as the oxide semiconductor S2, each of the oxide semiconductors S1 and S3 is preferably an oxide semiconductor with an atomic ratio where [M]/[In] is 1 or greater, preferably 2 or greater. Moreover, the oxide semiconductor S3 is preferably an oxide semiconductor having an atomic ratio where [M]/([Zn]+[In]) is 1 or greater to obtain sufficiently high insulation performance.

The structure described in this embodiment can be used in appropriate combination with the structure described in any of the other embodiments.

Embodiment 5

The structure of an oxide semiconductor that can be used for one embodiment of the present invention will be described below.

In this specification, the term "parallel" indicates that the angle formed between two straight lines ranges from −10° to 10°, and accordingly also includes the case where the angle ranges from −5° to 5°. The term "perpendicular" indicates that the angle formed between two straight lines ranges from 80° to 100°, and accordingly also includes the case where the angle ranges from 85° to 95°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis-aligned crystal parts (also referred to as pellets).

Figure 34A:
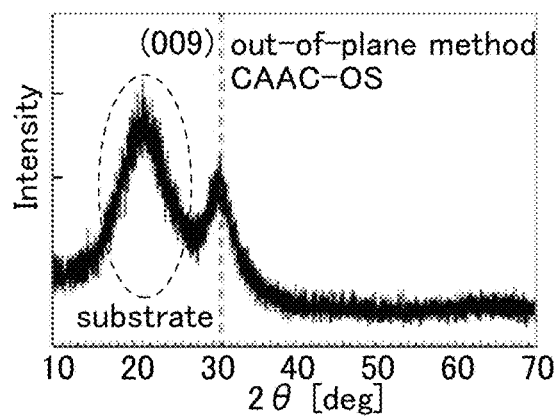
FIGS. 34A to 34E show structural analysis results of a CAAC-OS and a single crystal InGaZnO$_4$ by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 34A. This peak is derived from the (009) plane of the $InGaZnO_4$ crystal, which indicates that crystals in the CAAC-OS have c-axis alignment, and that the c-axes are aligned in a direction substantially perpendicular to a surface where the CAAC-OS film is formed (also referred to as formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 34B:
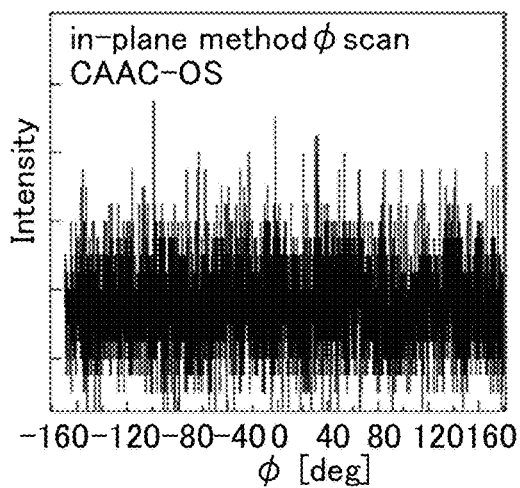
Figure 34C:
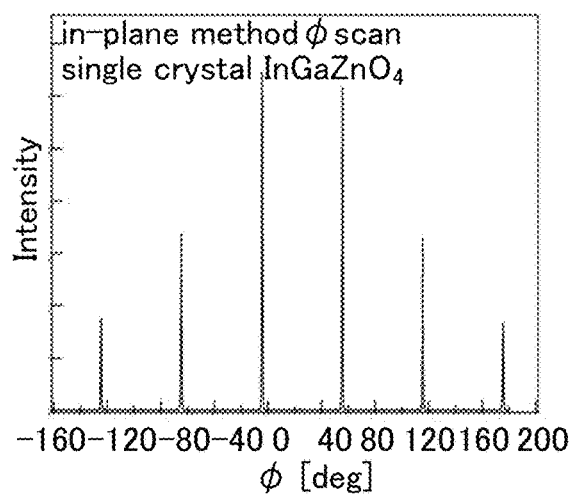

Furthermore, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with a 2θ fixed at around 56° and with the sample rotated using a normal vector of the sample surface as an axis (0 axis), no clear peak appears as shown in FIG. 34B. Meanwhile, when single crystal $InGaZnO_4$ is subjected to φ scan with a 2θ fixed at around 56°, six peaks that are derived from crystal planes equivalent to the (110) plane are observed as shown in FIG. 34C. Accordingly, the structural analysis using XRD shows that the directions of a-axes and b-axes are irregularly oriented in the CAAC-OS.

Figure 34D:
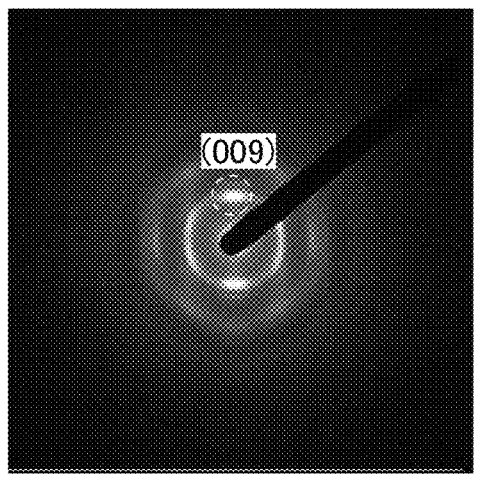
Figure 34E:
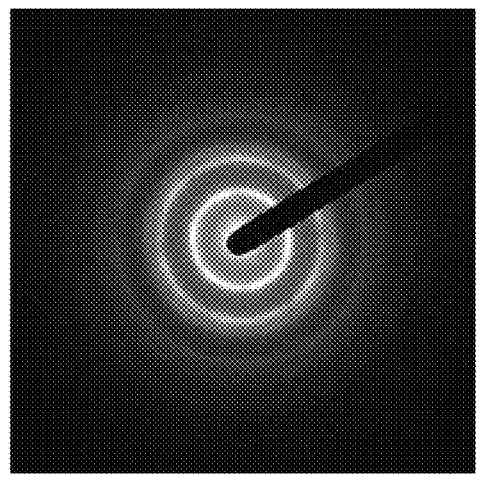

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern including a spot derived from the (009) plane of the $InGaZnO_4$ crystal shown in FIG. 34D appears sometimes. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 34E shows a diffraction pattern obtained when an electron beam with a probe diameter of 300 nm is incident on the same sample in a direction perpendicular to the sample surface. As shown in FIG. 34E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 34E is considered to be derived from the (010) plane, the (100) plane, and the like of the $InGaZnO_4$ crystal. The second ring in FIG. 34E is considered to be derived from the (110) plane and the like.

In a combined analysis image (also referred to as high-resolution transmission electron microscope (TEM) image) of a bright-field image and a diffraction pattern of the CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 35A:
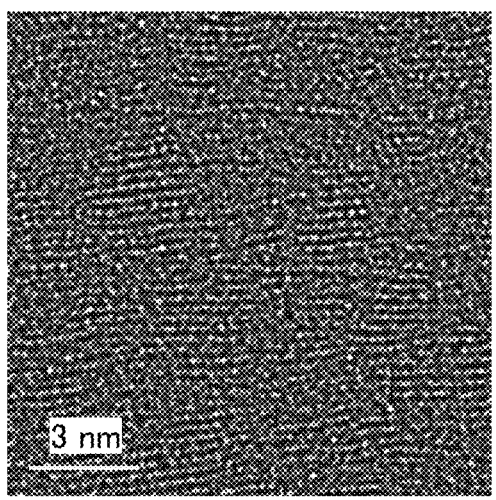
FIGS. 35A to 35E show a cross-sectional TEM image and plan-view TEM images of a CAAC-OS and images obtained through analysis thereof.

FIG. 35A shows a high-resolution cross-sectional TEM image of the CAAC-OS observed from a direction substantially parallel to the sample surface. The high-resolution TEM image is obtained with a spherical aberration corrector function. A high-resolution TEM image obtained with a spherical aberration corrector function is particularly referred to as a Cs-corrected high-resolution TEM image. A Cs-corrected high-resolution TEM image can be obtained with, for example, an atomic resolution analytical electron microscope JEM-ARM200F, manufactured by JEOL Ltd.

FIG. 35A shows pellets in which metal atoms are arranged in a layered manner. FIG. 35A proves that the size of a pellet is greater than or equal to 1 nm or greater than or equal to 3 nm. Therefore, the pellet can be referred to as a nanocrystal (nc). Furthermore, the CAAC-OS can also be referred to as an oxide semiconductor including c-axis-aligned nanocrystals (CANC). A pellet reflects unevenness of a formation surface or a top surface of the CAAC-OS and is parallel to the formation surface or the top surface of the CAAC-OS.

Figure 35B:
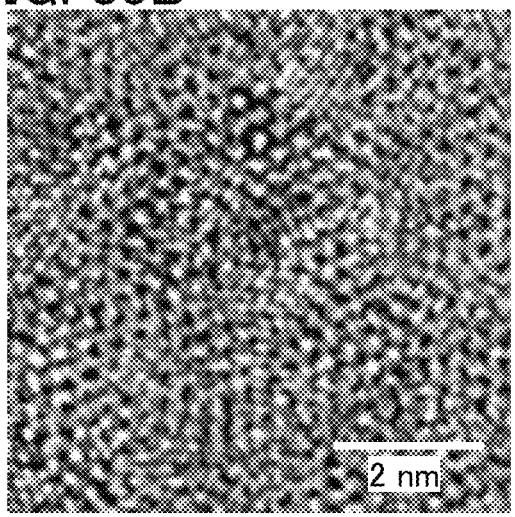
Figure 35C:
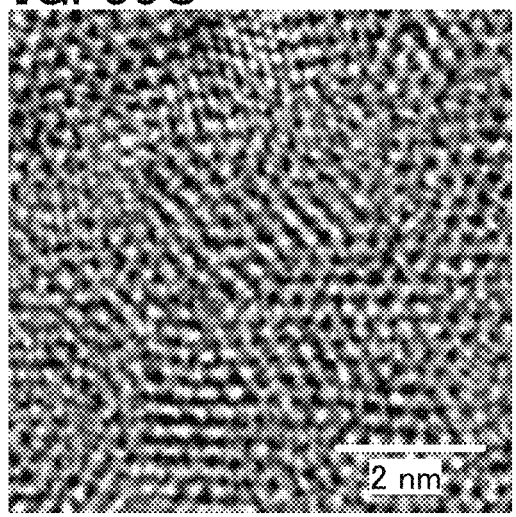
Figure 35D:
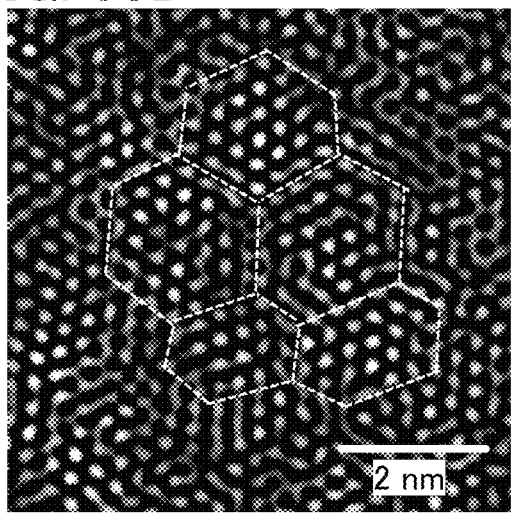
Figure 35E:
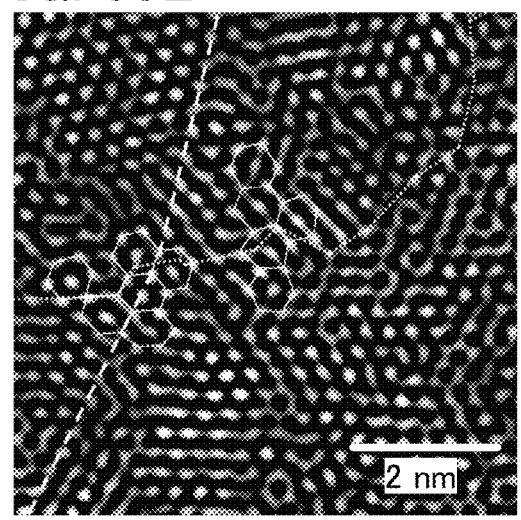

FIGS. 35B and 35C show Cs-corrected high-resolution plan-view TEM images of the CAAC-OS observed from a direction substantially perpendicular to the sample surface. FIGS. 35D and 35E are images obtained through image processing of FIGS. 35B and 35C. The method of image processing is as follows. First, the image in FIG. 35B is subjected to fast Fourier transform (FFT), so that an FFT image is obtained. Then, mask processing is performed such that a range of 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. An FFT filtering image is a Cs-corrected high-resolution TEM image from which a periodic component is extracted, and shows a lattice arrangement.

In FIG. 35D, a portion in which the lattice arrangement is broken is shown by dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 35E, a dotted line denotes a boundary between a region with a regular lattice arrangement and another region with a regular lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, formation of a grain boundary is inhibited by distortion of a lattice arrangement. This is probably because the CAAC-OS can tolerate distortion owing to a low density of arrangement of oxygen atoms in the a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. Accordingly, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that impurities mean an element other than the main components of the oxide semiconductor, such as hydrogen, carbon, silicon, and a transition metal element. For example, an element (specifically, silicon or the like) having higher strength of bonding to oxygen than a metal element contained in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases cry stallinity.

<nc-OS>

Next, an nc-OS will be described.

Analysis of an nc-OS by XRD is described. When the structure of an nc-OS is analyzed by an out-of-plane method, a peak indicating orientation does not appear. That is, a crystal of an nc-OS does not have orientation.

Figure 36A:
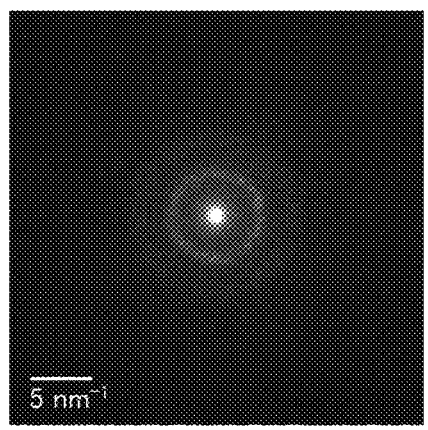
FIGS. 36A to 36D show electron diffraction patterns and a cross-sectional TEM image of an nc-OS.
Figure 36B:
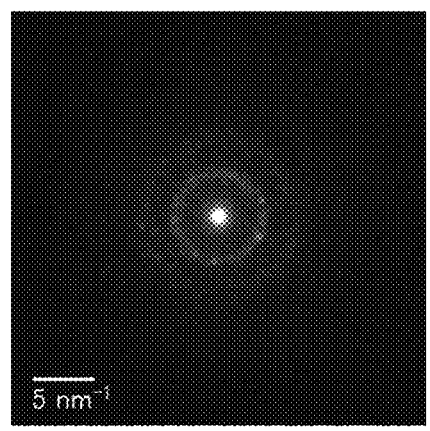

For example, when an electron beam with a probe diameter of 50 nm is incident on a 34-nm-thick region of a thinned nc-OS including an $InGaZnO_4$ crystal in the direction parallel to the formation surface, a ring-shaped diffraction pattern (nanobeam electron diffraction pattern) shown in FIG. 36A is observed. FIG. 36B shows a diffraction pattern (nanobeam electron diffraction pattern) obtained when an electron beam with a probe diameter of 1 nm is incident on the same sample. As shown in FIG. 36B, a plurality of spots are observed in a ring-like region. In other words, ordering in an nc-OS is not observed with an electron beam having a probe diameter of 50 nm but is observed with an electron beam having a probe diameter of 1 nm.

Figure 36C:
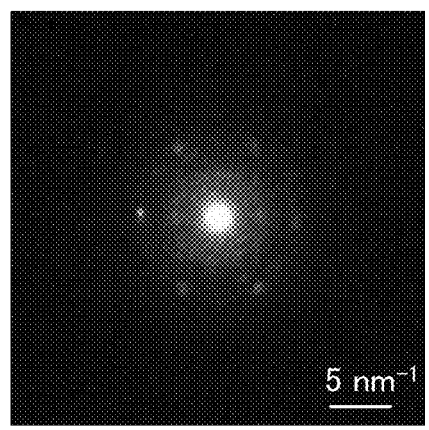

When an electron beam with a probe diameter of 1 nm is incident on a region with a thickness less than 10 nm, an electron diffraction pattern in which spots are arranged in an approximately regular hexagonal shape as shown in FIG. 36C is observed in some cases. This means that an nc-OS has a well-ordered region, i.e., a crystal, in the thickness range of less than 10 nm. Note that an electron diffraction pattern having regularity is not observed in some regions because crystals are aligned in various directions.

Figure 36D:
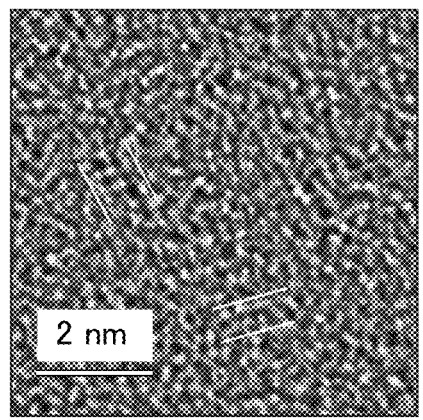

FIG. 36D shows a Cs-corrected high-resolution cross-sectional TEM image of an nc-OS observed from the direction substantially parallel to the formation surface. In the high-resolution TEM image, the nc-OS has a region in which a crystal part is observed, such as the part indicated by additional lines in FIG. 36D, and a region in which a clear crystal part is not observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor by some analysis methods.

Since there is no regularity of crystal orientation between the pellets (nanocrystals) as mentioned above, the nc-OS can also be referred to as an oxide semiconductor including random-aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have a lower density of defect states than an a-like OS and an amorphous oxide semiconductor. Since there is no regularity of crystal orientation between different pellets in the nc-OS, the nc-OS has a higher density of defect states than the CAAC-OS.

<a-Like OS>

An a-like OS has a structure between those of the nc-OS and an amorphous oxide semiconductor.

Figure 37A:
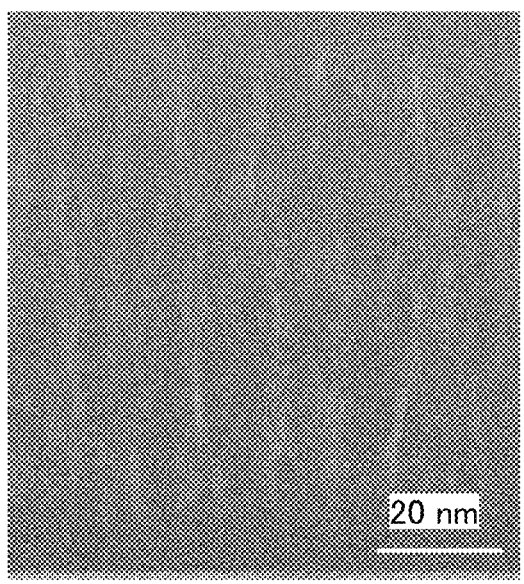
FIGS. 37A and 37B are cross-sectional TEM images of an a-like OS.
Figure 37B:
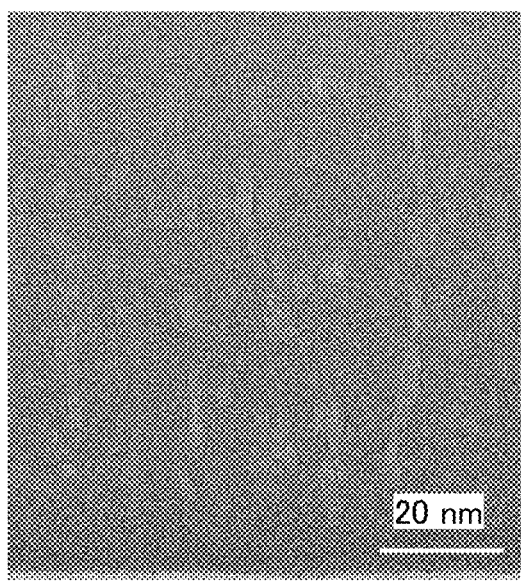

FIGS. 37A and 37B show high-resolution cross-sectional TEM images of the a-like OS. FIG. 37A is the high-resolution cross-sectional TEM image of the a-like OS at the start of electron irradiation. FIG. 37B is the high-resolution cross-sectional TEM image of the a-like OS after the electron (e) irradiation at $4.3 \times 10^8$ e$^-$/nm$^2$. FIGS. 37A and 37B show that stripe-like bright regions that extend vertically are observed in the a-like OS from the start of the electron irradiation. It can also be found that the shape of the bright region changes after the electron irradiation. Note that the bright region is presumably a void or a low-density region.

The a-like OS has an unstable structure because it includes a void. To verify that the a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The spacing between the adjacent layers is equivalent to the lattice spacing on the (009) plane (also referred to as d value), and is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 38:
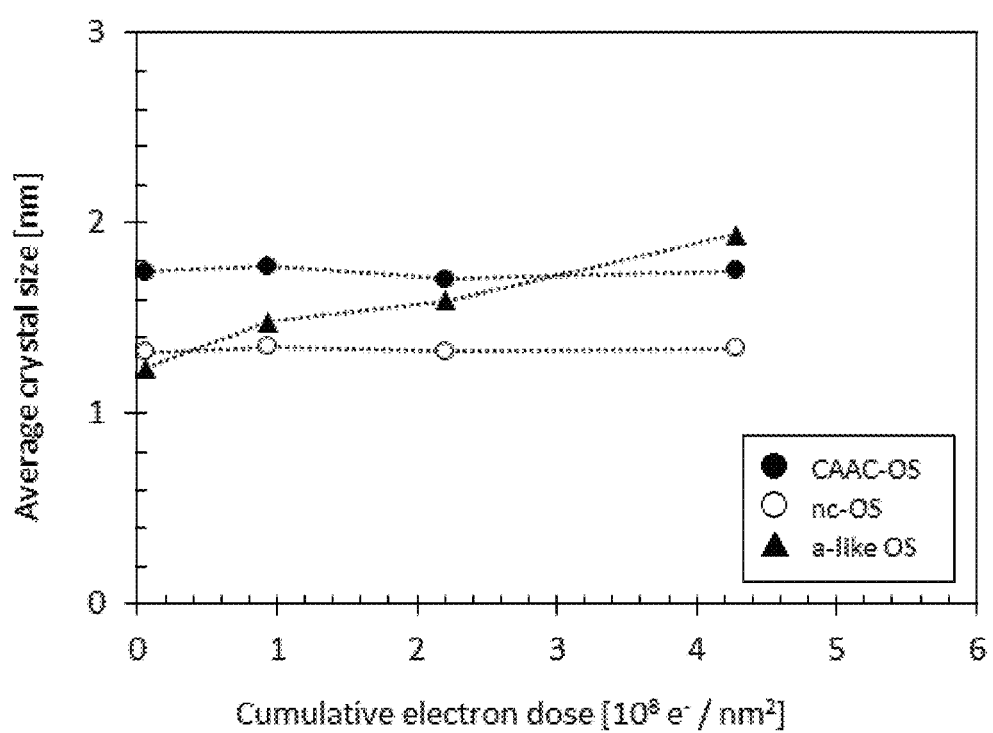
FIG. 38 shows a change of crystal parts of In—Ga—Zn oxide owing to electron irradiation.

FIG. 38 shows a change in the average size of crystal parts (at 22 points to 30 points) in each sample. Note that the crystal part size corresponds to the length of the lattice fringe. FIG. 38 indicates that the crystal part size in the a-like OS increases with an increase in the cumulative electron dose in obtaining TEM images, for example. As shown in FIG. 38, a crystal part of approximately 1.2 nm (also referred to as initial nucleus) at the start of TEM observation grows to a size of approximately 1.9 nm at a cumulative electron (e⁻) dose of $4.2 \times 10^8$ e⁻/nm². In contrast, the crystal part size in the nc-OS and the CAAC-OS shows little change from the start of electron irradiation to a cumulative electron dose of $4.2 \times 10^8$ e⁻/nm². As shown in FIG. 38, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e⁻/(nm²·s); and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. These results demonstrate that the a-like OS has an unstable structure compared to the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in an oxide semiconductor having an atomic ratio of In:Ga:Zn=1:1:1, the density of single crystal InGaZnO₄ with a rhombohedral crystal structure is 6.357 g/cm³. Accordingly, for the oxide semiconductor having an atomic ratio of In:Ga:Zn=1:1:1, for example, the density of the a-like OS is higher than or equal to 5.0 g/cm³ and lower than 5.9 g/cm³, and the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurities in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm⁻³, preferably lower than $1 \times 10^{11}$ cm⁻³, further preferably lower than $1 \times 10^{10}$ cm⁻³ and is higher than or equal to $1 \times 10^{-9}$ cm⁻³.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased, or the bandgap of the oxide semiconductor is narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm⁻³ and lower than $1 \times 10^{18}$ cm⁻³, further preferably higher than or equal to $1 \times 10^7$ cm⁻³ and lower than or equal to $1 \times 10^{17}$ cm⁻³, still further preferably higher than or equal to $1 \times 10^9$ cm⁻³ and lower than or equal to $5 \times 10^{16}$ cm⁻³, yet further preferably higher than or equal to $1 \times 10^{10}$ cm⁻³ and lower than or equal to $1 \times 10^{16}$ cm⁻³, yet still preferably higher than or equal to $1 \times 10^{11}$ cm⁻³ and lower than or equal to $1 \times 10^{15}$ cm⁻³.

The structure described in this embodiment can be used in appropriate combination with the structure described in any of the other embodiments.

Embodiment 6

This embodiment will explain examples of a package and a camera module in each of which an image sensor chip is placed. For the image sensor chip, the structure of an imaging device of one embodiment of the present invention can be used.

Figure 39A:
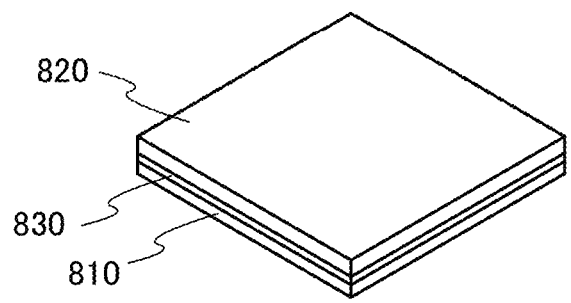
FIGS. 39A to 39D are perspective views and a cross-sectional view of a package in which an imaging device is placed.

FIG. 39A is an external perspective view showing the top surface side of a package in which an image sensor chip is placed. The package includes a package substrate 810 to which an image sensor chip 850 is fixed, a cover glass 820, an adhesive 830 for bonding the package substrate 810 and the cover glass 820, and the like.

Figure 39B:
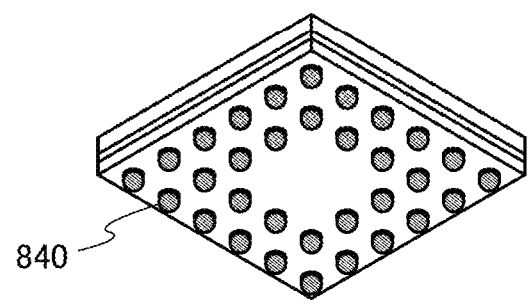

FIG. 39B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 39C:
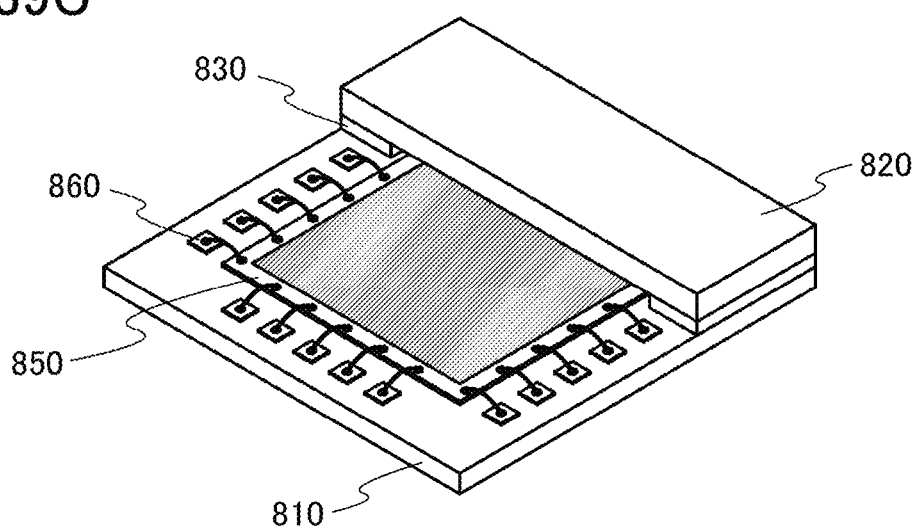
Figure 39D:
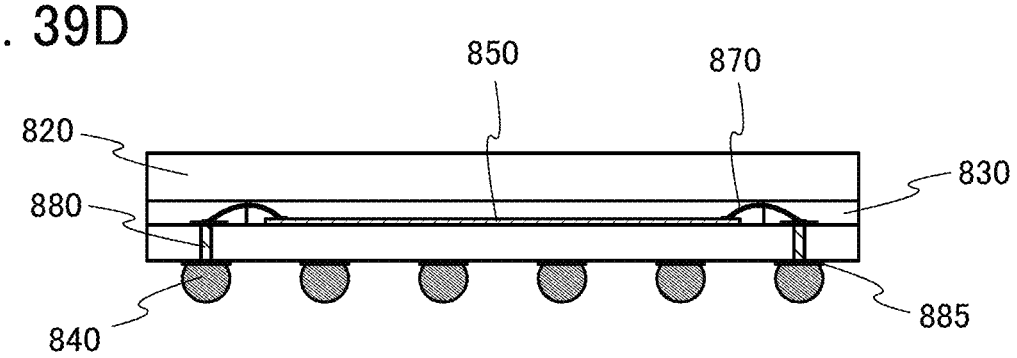

FIG. 39C is a perspective view of the package, in which the cover glass 820 and the adhesive 830 are partly illustrated. FIG. 39D is a cross-sectional view of the package. Electrode pads 860 are formed over the package substrate 810 and electrically connected to the bumps 840 via through-holes 880 and lands 885. The electrode pads 860 are electrically connected to electrodes of the image sensor chip 850 through wires 870.

Figure 40A:
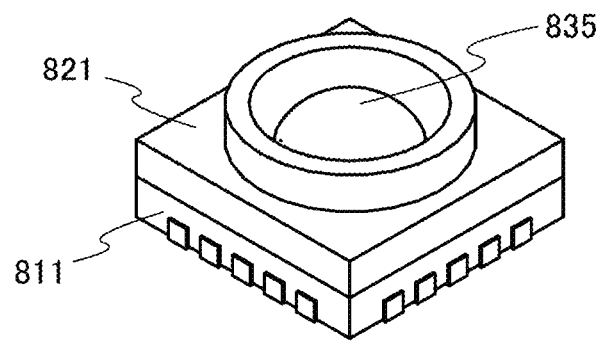
FIGS. 40A to 40D are perspective views and a cross-sectional view of a package in which an imaging device is placed.

FIG. 40A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of the imaging device is provided between the package substrate 811 and the image sensor chip 851. Thus, a system in package (SiP) is formed.

Figure 40B:
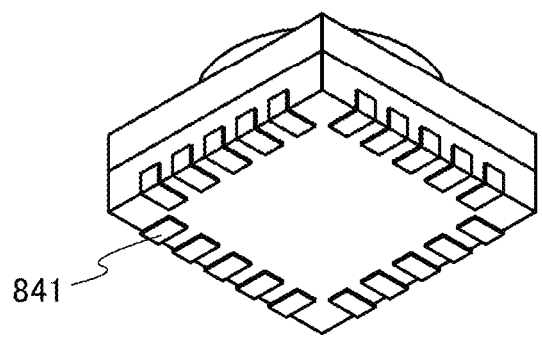

FIG. 40B is an external perspective view showing the bottom surface side of the camera module. On the bottom surface and four side surfaces of the package substrate 811, mounting lands 841 are provided; this structure can be called a quad flat no-lead (QFN) package. Although the QFN package is employed here, a quad flat package (QFP), the above BGA, or the like may be alternatively employed.

Figure 40C:
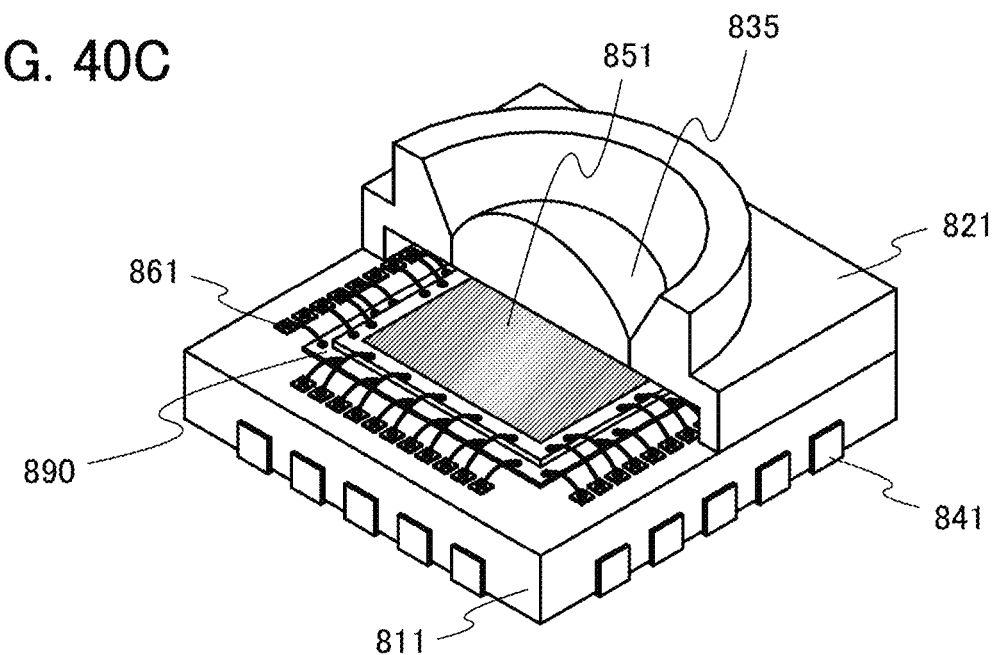
Figure 40D:
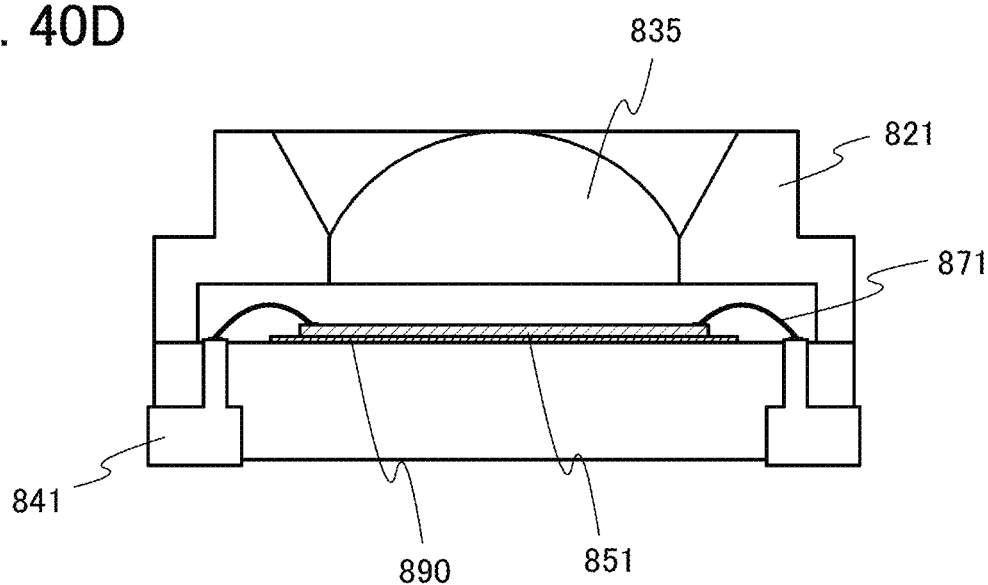

FIG. 40C is a perspective view of the camera module, in which the lens cover 821 and the lens 835 are partly illustrated. FIG. 40D is a cross-sectional view of the camera module. Some of the lands 841 are used as electrode pads 861. The electrode pads 861 are electrically connected to electrodes of the image sensor chip 851 and the IC chip 890 through wires 871.

The image sensor chip placed in the package having the above structure can be easily mounted on and incorporated into a variety of semiconductor devices and electronic devices.

The structure described in this embodiment can be used in appropriate combination with the structure described in any of the other embodiments.

Embodiment 7

Examples of an electronic device that can include the imaging device of one embodiment of the present invention include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 41A to 41F illustrate specific examples of these electronic devices.

Figure 41A:
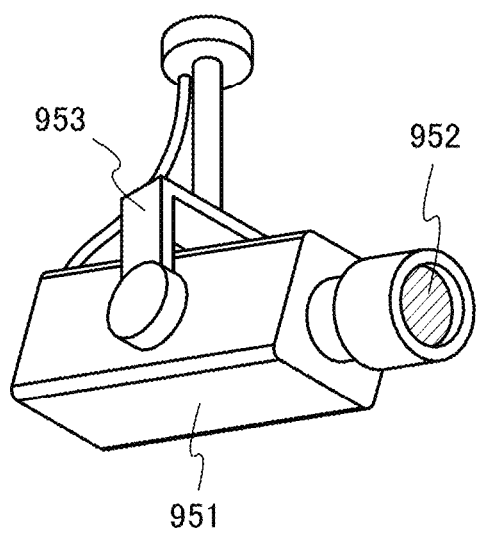
FIGS. 41A to 41F each illustrate an electronic device.

FIG. 41A illustrates a monitoring camera that includes a housing 951, a lens 952, a support 953, and the like. The imaging device of one embodiment of the present invention can be included as a component for obtaining an image in the monitoring camera. Note that a "monitoring" camera is a name in common use and does not limit the uses of the camera. A device that has a function of a monitoring camera can also be called a camera or a video camera, for example.

Figure 41B:
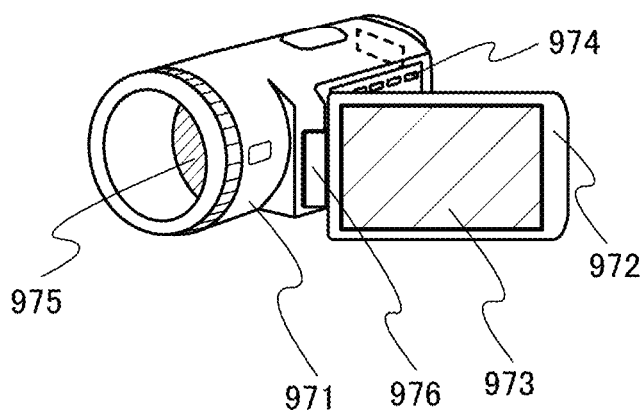

FIG. 41B illustrates a video camera that includes a first housing 971, a second housing 972, a display portion 973, operation keys 974, a lens 975, a joint 976, and the like. The first housing 971 is provided with the operation keys 974 and the lens 975, and the second housing 972 is provided with the display portion 973. The imaging device of one embodiment of the present invention can be included as a component for obtaining an image in the video camera.

Figure 41C:
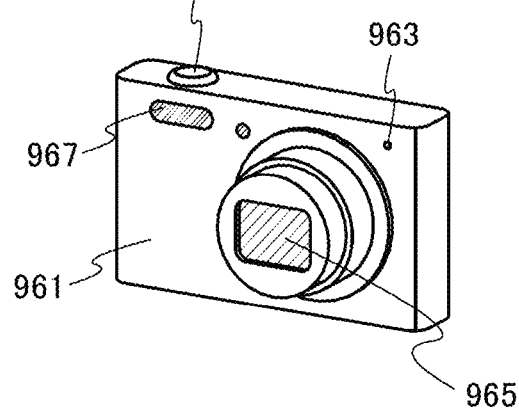

FIG. 41C illustrates a digital camera that includes a housing 961, a shutter button 962, a microphone 963, a light-emitting portion 967, a lens 965, and the like. The imaging device of one embodiment of the present invention can be included as a component for obtaining an image in the digital camera.

Figure 41D:
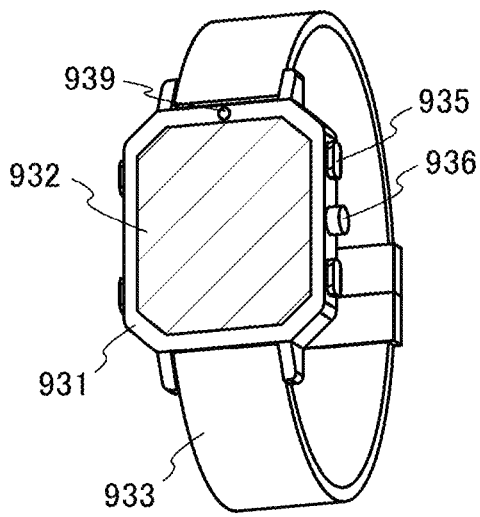

FIG. 41D illustrates a wrist-watch-type information terminal that includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 41E:
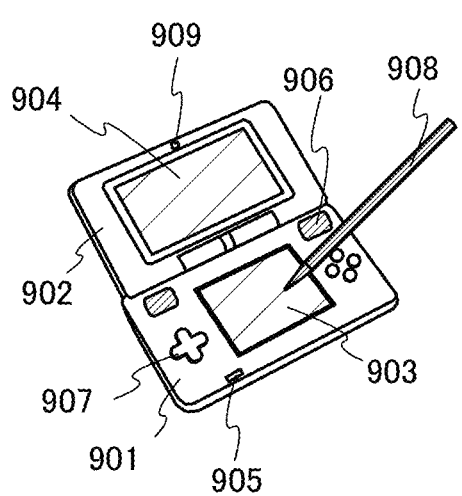

FIG. 41E illustrates a portable game machine that includes housings 901 and 902, display portions 903 and 904, a microphone 905, speakers 906, an operation key 907, a stylus 908, a camera 909, and the like. Although the portable game machine in FIG. 41E has the two display portions 903 and 904, the number of display portions included in a portable game machine is not limited to this. The imaging device of one embodiment of the present invention can be included as one component for obtaining an image in the portable game machine.

Figure 41F:
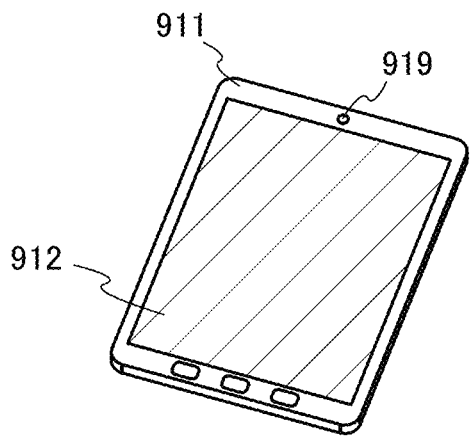

FIG. 41F illustrates a portable data terminal that includes a housing 911, a display portion 912, a camera 919, and the like. A touch panel function of the display portion 912 enables input and output of information. The imaging device of one embodiment of the present invention can be included as one component for obtaining an image in the portable data terminal.

Note that this embodiment can be combined with any of the other embodiments in this specification as appropriate.

This application is based on Japanese Patent Application serial no. 2016-029900 filed with Japan Patent Office on Feb. 19, 2016, the entire contents of which are hereby incorporated by reference.

What is claimed is:

1. An imaging device comprising:
a pixel comprising a pixel circuit and a circuit; and
wherein:
the pixel circuit comprises a photoelectric conversion element, a first transistor, and a second transistor,
the circuit comprises a first capacitor, a second capacitor, a third transistor, and a fourth transistor,
the photoelectric conversion element is electrically connected to one of a source and a drain of the first transistor,
the other of the source and the drain of the first transistor is electrically connected to a gate of the second transistor, one of a source and a drain of the second transistor is electrically connected to a first wiring, the other of the source and the drain of the second transistor is electrically connected to a terminal of the first capacitor and a gate of the third transistor, one of a source and a drain of the third transistor is electrically connected to a second wiring, the other of the source and the drain of the third transistor is electrically connected to a terminal of the second capacitor and a gate of the fourth transistor, and one of a source and a drain of the fourth transistor is electrically connected to the second wiring.

2. An imaging device comprising:

a pixel comprising a pixel circuit and a circuit; and wherein:

the pixel circuit comprises a photoelectric conversion element, a first transistor, and a second transistor, the circuit comprises a first capacitor, a second capacitor, a third transistor, and a fourth transistor, at least one of the first to fourth transistors comprises a channel formation region which comprises an oxide semiconductor, the photoelectric conversion element is electrically connected to one of a source and a drain of the first transistor, the other of the source and the drain of the first transistor is electrically connected to a gate of the second transistor, one of a source and a drain of the second transistor is electrically connected to a first wiring, the other of the source and the drain of the second transistor is electrically connected to a terminal of the first capacitor and a gate of the third transistor, one of a source and a drain of the third transistor is electrically connected to a second wiring, the other of the source and the drain of the third transistor is electrically connected to a terminal of the second capacitor and a gate of the fourth transistor, one of a source and a drain of the fourth transistor is electrically connected to the second wiring, and the other of the source and the drain of the fourth transistor is electrically connected to an output terminal.

\* \* \* \* \*